US009362340B2

(12) United States Patent  
Terai et al.

(10) Patent No.: US 9,362,340 B2  
(45) Date of Patent: Jun. 7, 2016

(54) MEMORY DEVICES HAVING LOW PERMITTIVITY LAYERS AND METHODS OF FABRICATING THE SAME

(71) Applicants: Masayuki Terai, Suwon-si (KR); Jung-Moo Lee, Hwaseong-si (KR)

(72) Inventors: Masayuki Terai, Suwon-si (KR); Jung-Moo Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/734,207

(22) Filed: Jun. 9, 2015

(65) Prior Publication Data

US 2015/0372060 A1   Dec. 24, 2015

(30) Foreign Application Priority Data

Jun. 18, 2014   (KR) .................. 10-2014-0074525

(51) Int. Cl.
*H01L 27/24* (2006.01)
*H01L 23/528* (2006.01)
*H01L 23/532* (2006.01)
*H01L 45/00* (2006.01)

(52) U.S. Cl.
CPC .......... *H01L 27/2463* (2013.01); *H01L 23/528* (2013.01); *H01L 23/53295* (2013.01); *H01L 27/2409* (2013.01); *H01L 45/1233* (2013.01)

(58) Field of Classification Search
CPC ................ H01L 27/24–27/249; H01L 45/00; H01L 45/04–45/1691; H01L 27/2463; H01L 27/409; H01L 23/528; H01L 23/53295; H01L 45/1233; G11C 2213/10–2213/56; G11C 13/00–13/0019
See application file for complete search history.

(56) References Cited

U.S. PATENT DOCUMENTS

| 7,767,499 | B2 | 8/2010 | Herner |
| 8,634,236 | B2 | 1/2014 | Park et al. |
| 2010/0207193 | A1 | 8/2010 | Tanaka et al. |
| 2011/0037046 | A1 | 2/2011 | Sato et al. |
| 2012/0112156 | A1 | 5/2012 | Park et al. |
| 2014/0124726 | A1* | 5/2014 | Oh ..................... H01L 45/144 257/4 |
| 2015/0014759 | A1* | 1/2015 | Lee ..................... H01L 23/5329 257/306 |
| 2015/0372056 | A1* | 12/2015 | Seong ................ H01L 27/2409 257/4 |

* cited by examiner

*Primary Examiner* — Whitney T Moore
(74) *Attorney, Agent, or Firm* — Myers Bigel & Sibley

(57) ABSTRACT

A memory device is provided. The memory device includes bit lines that extend in a first direction on a substrate, word lines configured to vertically cross the bit lines, memory cells formed at intersections of the bit lines and the word lines, a first low permittivity layer configured to fill spaces between the bit lines and partially fill spaces between the memory cells formed on bottom surfaces of the word lines, a first dielectric layer stacked on an upper surface of the first low permittivity layer between the memory cells, a second dielectric layer configured to fill spaces between the memory cells formed on upper surfaces of the bit lines, and a second low permittivity layer stacked on an upper surface of the second dielectric layer and configured to fill spaces between the word lines. The first and second low permittivity layers have lower permittivity than the first and second dielectric layers.

20 Claims, 47 Drawing Sheets

100b

100b

MEMORY DEVICES HAVING LOW PERMITTIVITY LAYERS AND METHODS OF FABRICATING THE SAME

CROSS-REFERENCE TO RELATED APPLICATION

This application claims priority under 35 U.S.C. §119 to Korean Patent Application No. 10-2014-0074525, filed Jun. 18, 2014, the disclosure of which is hereby incorporated herein by reference in its entirety.

FIELD

Embodiments of the inventive concept relate generally to memory devices and, more particularly, to variable resistance memory devices capable of reducing parasitic capacitance between signal wirings.

BACKGROUND

Variable resistance memory devices include a plurality of bit lines and word lines configured to vertically cross the bit lines in cell areas in which data read and write operations are performed. A large parasitic capacitance may be generated between the bit lines and between the word lines due, in part, to dielectric layers configured to fill spaces between the bit lines and between the word lines. The parasitic capacitance between signal wirings of the memory device reduces a read/write operation speed of the memory device. Various techniques for reducing the parasitic capacitance have been discussed.

SUMMARY

Some embodiments of the present inventive concept provide a variable resistance memory device in which parasitic capacitance between bit lines and between word lines is reduces, or possibly minimized.

Further embodiments of the present inventive concept provide memory devices including bit lines and word lines, which vertically cross on a substrate. Memory cells are formed at intersections of the bit lines and the word lines. A first low permittivity layer fills spaces between the bit lines and partially fills spaces between the memory cells formed on bottom surfaces of the word lines is formed. A first dielectric layer is stacked on an upper surface of the first low permittivity layer between the memory cells. A second dielectric layer is formed between the memory cells formed on upper surfaces of the bit lines. A second low permittivity layer stacked on an upper surface of the second dielectric layer and configured to fill spaces between the word lines is formed. The first and second low permittivity layers have lower permittivity than the first and second dielectric layers.

In still further embodiments, the upper surface of the first low permittivity layer may include a first surface located at the same level as the upper surface of the bit line, and a second surface located at a higher level than the first surface and between the memory cells.

In some embodiments, the second surface of the first low permittivity layer may include a horizontal through hole, and the first surface of the first low permittivity layer may include a groove.

In further embodiments, the second dielectric layer may contact the first surface of the first low permittivity layer and fill the groove. A side of the second dielectric layer may contact a side of the first low permittivity layer, and the through hole may be formed as an air gap that is an enclosed space.

In still further embodiments, parallel sides of the memory cells each may contact sides of the first low permittivity layer having the air gap and the first dielectric layer, and the remaining sides of the memory cells may each contact a side of the second dielectric layer. The first dielectric layer may be formed only between the first low permittivity layer and the word lines. The parallel sides of the memory cells may each contact the first low permittivity layer and the first dielectric layer, which are sequentially stacked, and the parallel other sides of the memory cells may each contact the second dielectric layer.

In some embodiments, the memory cells may each include a diode and a variable resistance device, which are connected in series, and the variable resistance device may include a first electrode, a variable resistor, and a second electrode, which are sequentially stacked. The upper surface of the first low permittivity layer is located at a lower level than an upper surface of the first electrode. A bottom surface of the second low permittivity layer is located at a higher level than a bottom surface of the second electrode.

Further embodiments of the present inventive concept provide memory devices including bit lines configured to extend in a direction and word lines configured to vertically cross the bit lines on a substrate. Memory cells may be formed at intersections of the bit lines and the word lines. A first dielectric layer fills spaces between the bit lines and between the memory cells formed on bottom surfaces of the word lines, and includes an air gap therein may be formed. A second dielectric layer fills spaces between the memory cells formed on upper surfaces of the bit lines may be formed. A first low permittivity layer stacked on an upper surface of the first dielectric layer and configured to fill spaces between the word lines may be formed. The first low permittivity layer has lower permittivity than the first dielectric layer and the second dielectric layer.

Still further embodiments provide memory devices may include first bit lines and second bit lines configured to extend in a direction and vertically spaced apart on a substrate. Word lines disposed between the first and second bit lines and configured to vertically cross the first and second bit lines may be formed. First memory cells may be formed at intersections of the first bit lines and the word lines. Second memory cells may be formed at intersections of the word lines and the second bit lines. A first dielectric layer including an air gap may be configured to fill a first separation space between the first bit lines and between parallel sides of the first memory cells. A second dielectric layer, a first low permittivity layer, and a third dielectric layer may be stacked on a second separation space between the other sides of the first memory cells, between the word lines, and between parallel sides of the second memory cells. A fourth dielectric layer and a second low permittivity layer may be stacked on a third separation space between the other sides of the second memory cells and between the second bit lines. The first and second low permittivity layers may have lower permittivity than the first to fourth dielectric layers.

In some embodiments, an air gap may be further included inside the first low permittivity layer.

Further embodiments of the present inventive concept provide, memory devices including bit lines configured to extend in a direction and word lines configured to vertically cross the bit lines on a substrate. Memory cells may be formed at intersections of the bit lines and the word lines. Air gaps uniformly spaced apart in a longitudinal direction of the bit lines may be formed between the bit lines. A low permittivity layer configured to fill spaces between the word lines may be formed. A dielectric layer configured to fill spaces between the memory cells may be formed, and the low permittivity layer may have lower permittivity than the dielectric layer.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings.

DETAILED DESCRIPTION OF SOME EMBODIMENTS

Figure 1A:
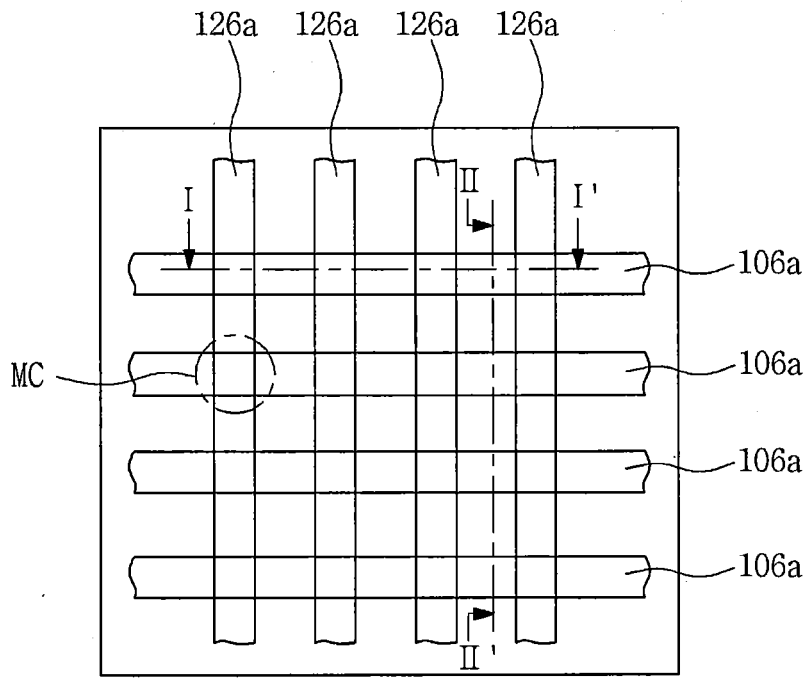
FIG. 1A is a schematic plan view illustrating a portion of a memory device in accordance with some embodiments of the inventive concept.

Various embodiments will now be described more fully with reference to the accompanying drawings in which some embodiments are shown. This inventive concept may, however, be embodied in different forms and should not be construed as limited to embodiments set forth herein. Rather, these embodiments are provided so that this disclosure is thorough and complete and fully conveys the inventive concept to those skilled in the art.

The terminology used herein is for the purpose of describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it may be directly on, connected, or coupled to the other element or layer or intervening elements or layers may be present. In contrast, when an element is referred to as being "directly on," "directly connected to," or "directly coupled to" another element or layer, there are no intervening elements or layers present. In the following explanation, the same reference numerals denote the same components throughout the specification. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein may be interpreted accordingly.

The exemplary embodiments of the invention will be described with reference to cross-sections and/or plan views, which are ideal exemplary views. Thicknesses of layers and areas are exaggerated for effective description of the technical contents in the drawings. Forms of some embodiments may be modified by the manufacturing technology and/or tolerance. Therefore, some embodiments of the invention are not intended to be limited to illustrated specific forms, and include modifications of forms generated according to manufacturing processes. For example, an etching area illustrated at a right angle may be round or have a predetermined curvature. Therefore, areas illustrated in the drawings have overview properties, and shapes of the areas are illustrated special forms of the areas of a device, and are not intended to be limited to the scope of the invention.

Hereinafter, like reference numerals in the drawings denote like elements or functionally similar elements. Therefore, such like reference numerals or similar reference numerals will not be mentioned or described in the drawings but will be understood with reference to the other drawings. Further, when such reference numerals are not illustrated, they will be understood with reference to the other drawings.

Figure 1B:
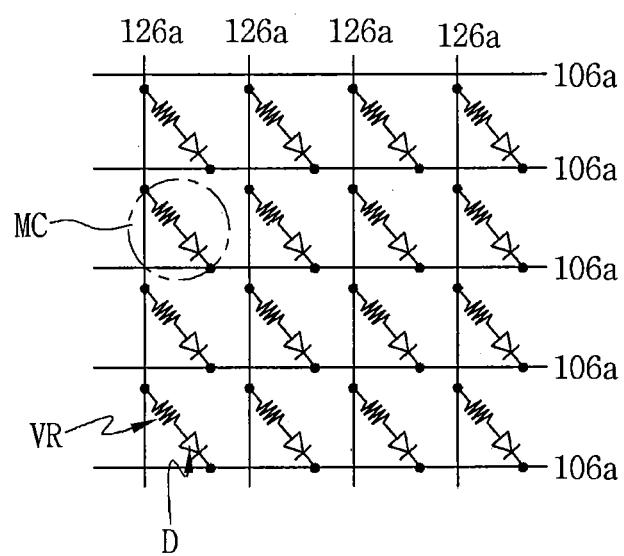
FIG. 1B is an equivalent circuit diagram of the memory device shown in FIG. 1A.

FIG. 1A is a schematic plan view illustrating a portion of a memory device in accordance with some embodiments of the inventive concept, and FIG. 1B is an equivalent circuit diagram of the memory device illustrated in FIG. 1A. Referring now to FIGS. 1A and 1B, a memory device 100 in accordance with some embodiments of the inventive concept may include bit lines 106a configured to extend in a direction and be spaced apart from each other, and word lines 126a configured to vertically cross the bit lines 106a, on a substrate 102. Memory cells MC may be formed at intersections of the word lines 126a and the bit lines 106a.

The memory cells MC each may include a diode D and a variable resistance device VR. The diode D may be electrically connected to the bit line 106a and the variable resistance device VR. The variable resistance device VR may be electrically connected to the diode D and the word line 126a.

A low permittivity layer having permittivity of 4 or less may be formed between the word lines 126a and between the bit lines 106a.

Hereinafter, configurations of the memory devices in accordance with some embodiments of the inventive concept will be discussed with reference to the drawings.

Figure 2A:
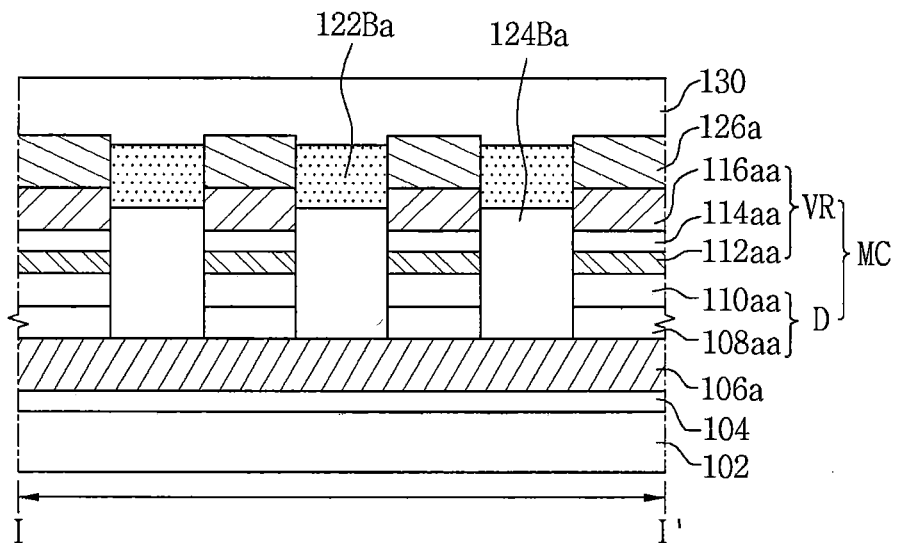
FIGS. 2A and 2B are vertical cross-sections taken along lines I-I' and II-II' of FIG. 1A, respectively.
Figure 2B:
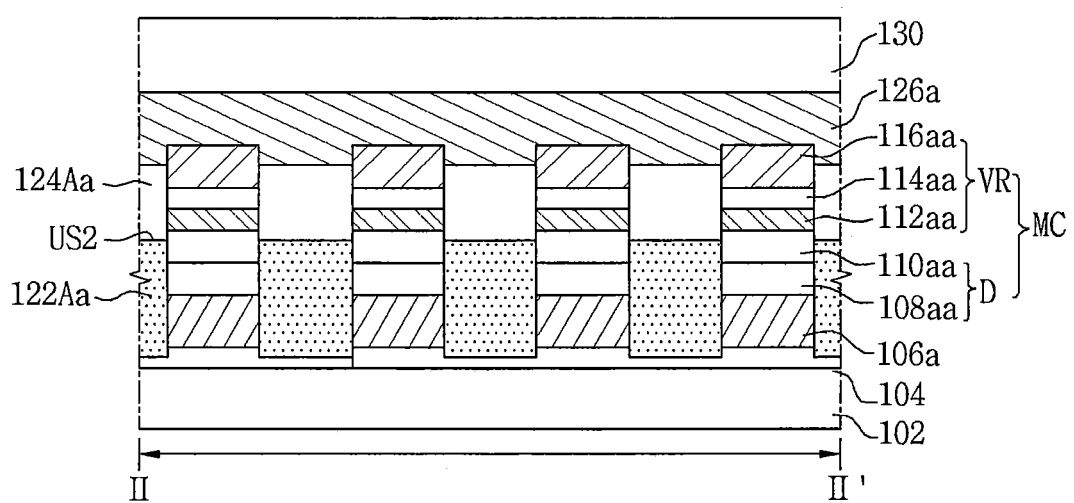
Figure 2C:
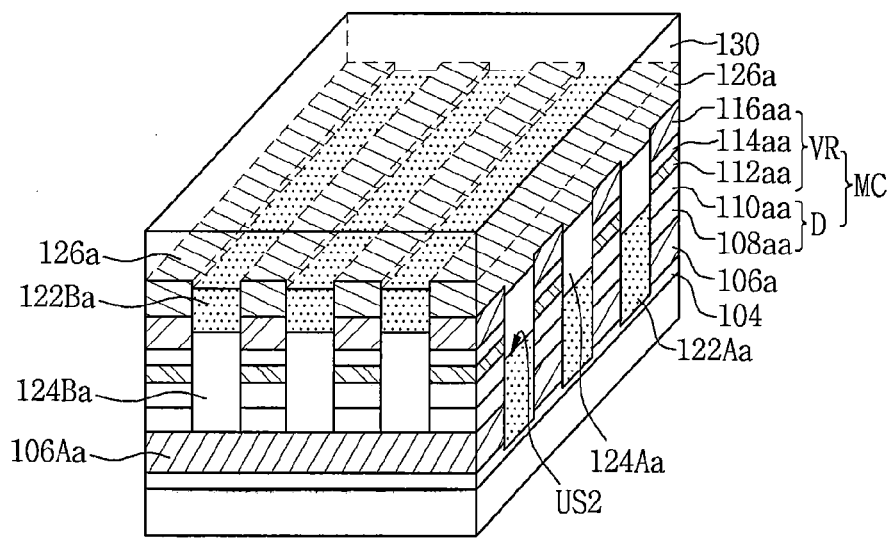
FIG. 2C is a perspective view illustrating a front cross section of bit lines and memory cells and a side cross section of word lines and the memory cells of a memory device in accordance with some embodiments of the inventive concept.
Figure 2D:
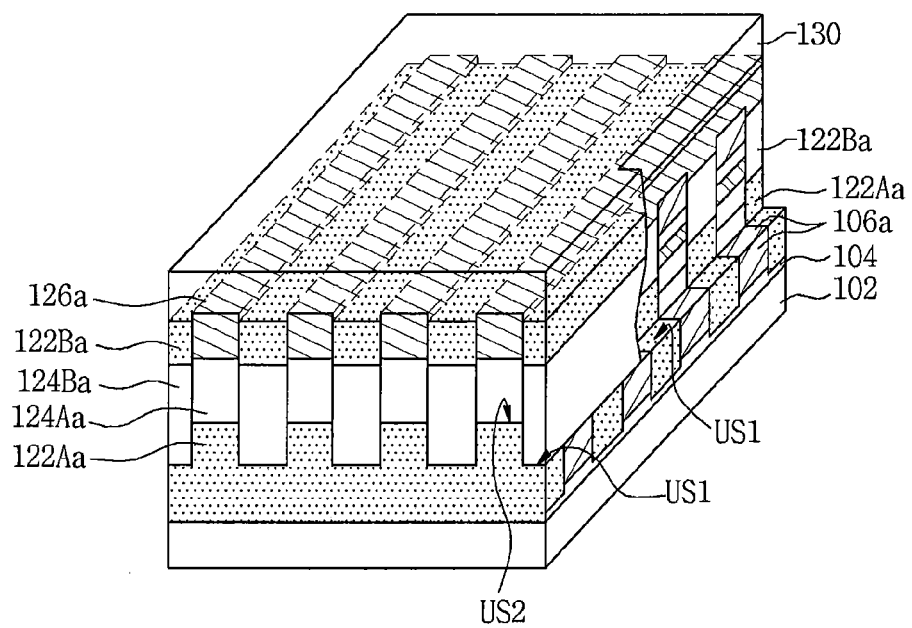
FIG. 2D is a perspective view illustrating a front cross section between the bit lines and a side cross section between the word lines a memory device in accordance with some embodiments of the inventive concept.

FIGS. 2A to 2D are views illustrating a memory device in accordance with some embodiments of the inventive concept. FIGS. 2A and 2B are vertical cross-sections taken along lines I-I' and II-II' of FIG. 1A, respectively. FIG. 2C is a perspective view illustrating a front cross section of bit lines and memory cells and a side cross section of word lines and the memory cells. FIG. 2D is a perspective view illustrating a front cross section between the bit lines and a side cross section between the word lines.

Referring to FIGS. 2A to 2D, a memory device 100a in accordance with some embodiments of the inventive concept may include a substrate 102, a buffer layer 104, bit lines 106a, memory cells MC, word lines 126a, and a protection layer 130.

The substrate 102 may include, for example, a silicon substrate or a silicon germanium substrate. The buffer layer 104 may be formed on an upper surface of the substrate 102, and located between the bit lines 106a and the substrate 102.

The bit lines 106a and the word lines 126a may be formed to cross each other. The memory cells MC may be formed at intersections of the bit lines 106a and the word lines 126a. The bit lines 106a and the word lines 126a may include, for example, tungsten (W), aluminum (Al), titanium nitride (TiN), or tungsten nitride (WN).

The memory cells MC each may include a diode D and a variable resistance device VR, which are connected in series. The diode D may be electrically connected to the bit line 106a and the variable resistance device VR. The variable resistance device VR may be electrically connected to the diode D and the word line 126a.

The diode D may include a first impurity pattern 108aa including N-type impurities, and a second impurity pattern 110aa including P-type impurities. Impurity types included in the first impurity pattern 108aa and the second impurity pattern 110aa may be changed. The diode D may further include an intrinsic semiconductor pattern between the first impurity pattern 108aa and the second impurity pattern 110aa.

The variable resistance device VR may include a first electrode 112aa, a variable resistor 114aa, and a second electrode 116aa. The second electrode 116aa may be thicker than the first electrode 112aa.

The first electrode 112aa and the second electrode 116aa may include, for example, platinum (Pt), ruthenium (Ru), ruthenium oxide ($RuO_x$), iridium (Ir), iridium oxide ($IrO_x$), titanium nitride (TiN), tungsten (W), tantalum (Ta), or tantalum nitride (TaN). The variable resistor 114aa may include, for example, hafnium oxide (Fox), titanium oxide ($TiO_x$), nickel oxide (NiO), zirconium oxide ($ZrO_x$), aluminum oxide ($AlO_x$), silicon oxide ($SiO_x$), niobium oxide ($NbO_x$), tantalum oxide ($TaO_x$), or tungsten oxide ($WO_x$). As another example, the second electrode 116aa may include polysilicon including impurities.

The memory device 100a in accordance with some embodiments of the inventive concept may further include a first low permittivity layer 122Aa, a second low permittivity layer 122Ba, a first dielectric layer 124Aa, and a second dielectric layer 124Ba.

The first low permittivity layer 122Aa may be formed between the bit lines 106a and between the memory cells MC formed on bottom surfaces of the word lines 126a. An upper surface of the first low permittivity layer 122Aa may include a first surface US1 located at the same level as an upper surface of the bit line 106a with which the memory cells MC are not in contact, and a second surface US2 located at a higher level than the first surface US1. The second surface US2 may be located at a lower level than a bottom surface of the variable resistance device VR. The second dielectric layer 124Ba may be stacked on the first surface US1 of the first low permittivity layer 122Aa and the upper surfaces of the bit lines 106a. The second dielectric layer 124Ba may contact a side of the first low permittivity layer 122Aa formed between the memory cells MC.

Referring to FIGS. 2B and 2C, the first dielectric layer 124Aa may be stacked on the second surface US2 of the first low permittivity layer 122Aa, and may contact bottom surfaces of the word lines 126a. The second low permittivity layer 122Ba may be stacked on an upper surface of the second dielectric layer 124Ba, and formed between the word lines 126a. The first low permittivity layer 122Aa and the second low permittivity layer 122Ba may have lower permittivity than the first dielectric layer 124Aa and the second dielectric layer 124Ba.

The first low permittivity layer 122Aa and the second low permittivity layer 122Ba may have permittivity of 4 or less. The first low permittivity layer 122Aa and the second low permittivity layer 122Ba may include, for example, silicon oxide, fluorine-doped silicon dioxide, carbon-doped silicon dioxide, or porous silicon dioxide. The first dielectric layer 124Aa and the second dielectric layer 124Ba may include silicon nitride ($SiN_x$) or aluminum oxide ($Al_2O_3$).

Since the memory device 100a configured as discussed above in accordance with some embodiments of the inventive concept has low permittivity layers between the bit lines 106a and between the word lines 126a, parasitic capacitance between the bit lines 106a and between the word lines 126a may be reduced, or possibly minimized.

Low permittivity layers to be described hereinafter may include the same or similar materials as materials included in the low first and second permittivity layers 122Aa and 122Ba, and dielectric layers discussed herein may include the same or similar materials as the first and second dielectric layers 124Aa and 124Ba.

Figure 3A:
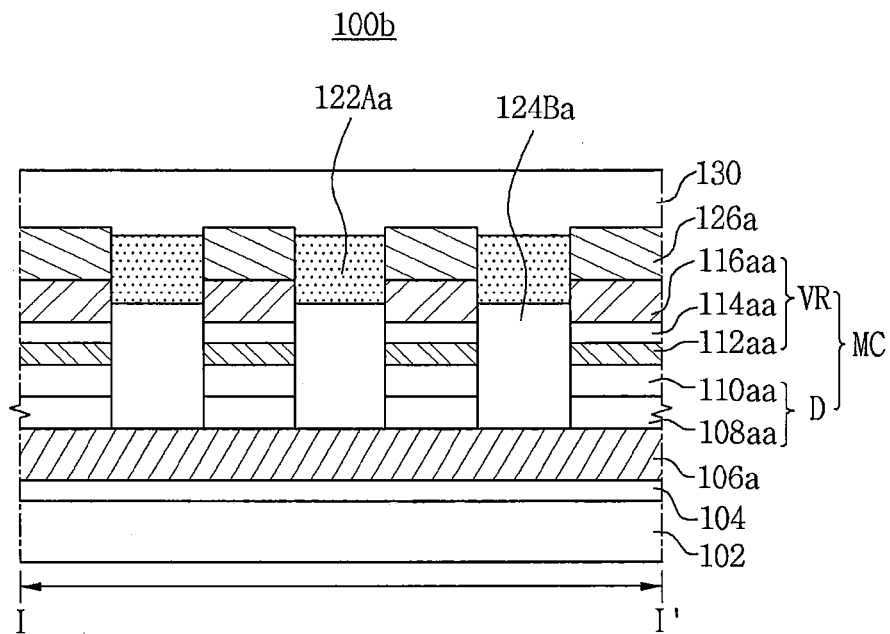
FIGS. 3A and 3B are vertical cross-sections taken along lines I-I' and II-II' of FIG. 1A, respectively.
Figure 3B:
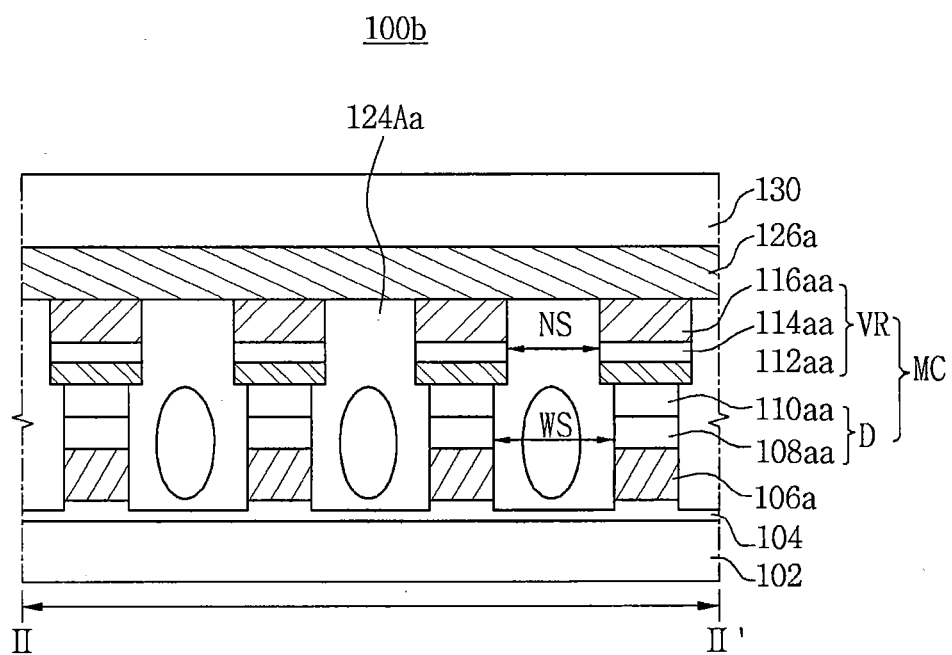
Figure 3C:
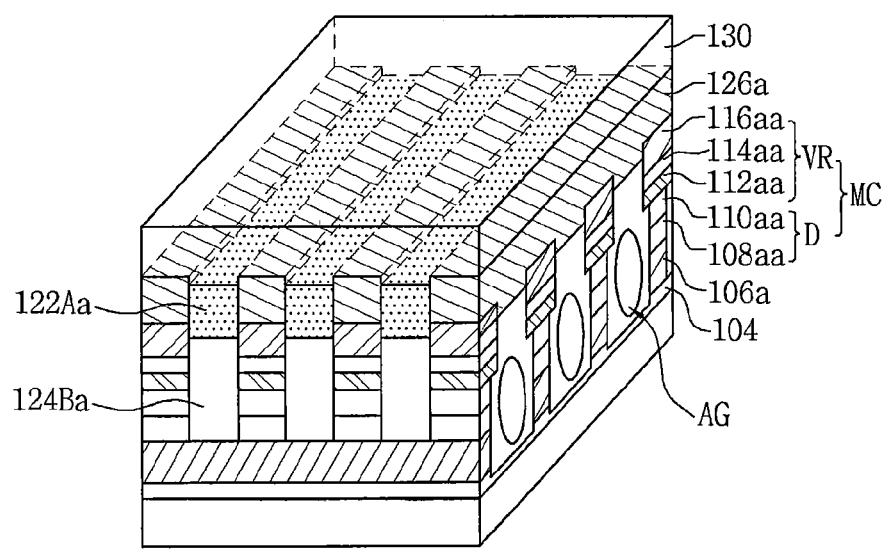
FIG. 3C is a perspective view illustrating a front cross section of bits line and memory cells and a side cross section of word lines and the memory cells of a memory device in accordance with some embodiments of the inventive concept.
Figure 3D:
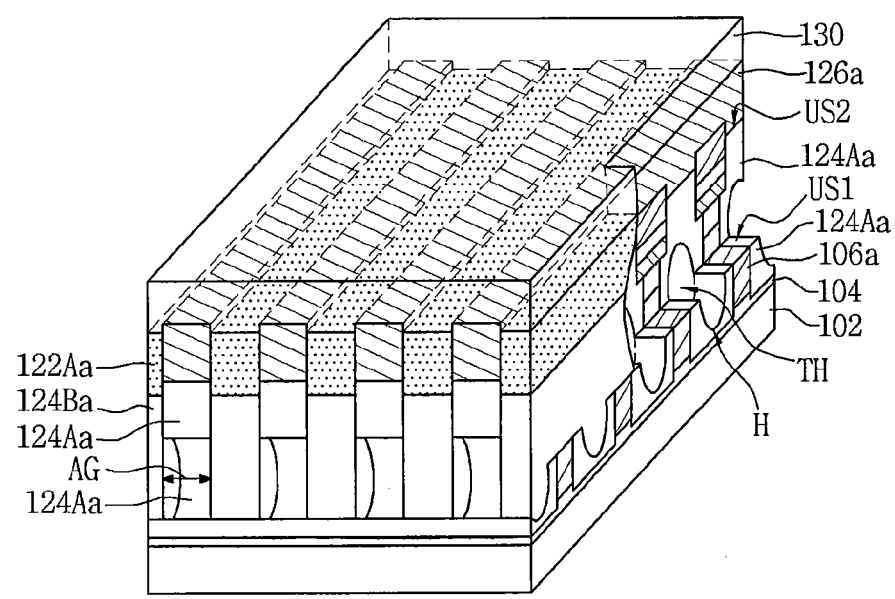
FIG. 3D is a perspective view illustrating a front cross section between the bit lines and a side cross section between the word lines of a memory device in accordance with some embodiments of the inventive concept.

FIGS. 3A and 3B are vertical cross-sections taken along lines I-I' and II-II' of FIG. 1A, respectively. FIG. 3C is a perspective view illustrating a front cross section of bit lines and memory cells and a side cross section of word lines and the memory cells in accordance with some embodiments of the present inventive concept. FIG. 3D is a perspective view illustrating a front cross section between the bit lines and a side cross section between the word lines in accordance with some embodiments of the present inventive concept.

Referring to FIGS. 3A to 3D, a memory device 100b in accordance with some embodiments of the inventive concept may include a substrate 102, a buffer layer 104, bit lines 106a, memory cells MC, word lines 126a, and a protection layer 130.

The bit lines 106a and the word lines 126a may be formed to vertically cross each other. The memory cells MC may be formed at intersections of the bit lines 106a and the word lines 126a.

The memory cells MC each may include a diode D and a variable resistance device VR, which are connected in series. The diode D and the variable resistance device VR each may include components discussed above. A width of the variable resistance device VR may be greater than widths of the diode D and the bit line 106a. A narrow first space NS may be formed between the variable resistance devices VR. A wide space WS may be formed between the diodes D and between the bit lines 106a.

The memory device 100b in accordance with some embodiments of the inventive concept may further include air gaps AG, a first dielectric layer 124Aa, a second dielectric layer 124Ba, and a low permittivity layer 122Aa.

The first dielectric layer 124Aa may be formed between the bit lines 106a and between the memory cells MC formed on bottom surfaces of the word lines 126a. The air gaps AG may be formed inside the first dielectric layer 124Aa formed between the memory cells MC. Referring to FIG. 3D, an upper surface of the first dielectric layer 124Aa may include a first surface US1 and a second surface US2 like the low permittivity layer 122Aa described above. However, the second surface US2 of the first dielectric layer 124Aa may contact a bottom surface of the word line 126a. The first dielectric layer 124Aa having the second surface US2 between the memory cells MC may include a through hole TH. On the other hand, a groove H may be formed on the first surface US1 of the first dielectric layer 124Aa.

The second dielectric layer 124Ba may contact upper surfaces of the bit lines 106a, the first surface US1 of the first dielectric layer 124Aa, and a side of the first dielectric layer 124Aa in which the through hole TH is formed. The through hole TH of the first dielectric layer 124Aa may have the air gap AG that is a space enclosed by a side of the second dielectric layer 124Ba. Therefore, a part of a boundary of the air gap AG may be the side of the second dielectric layer 124Ba. The low permittivity layer 122Aa may fill spaces between the word lines 126a, and may be stacked on an upper surface of the second dielectric layer 124Ba.

Figure 4A:
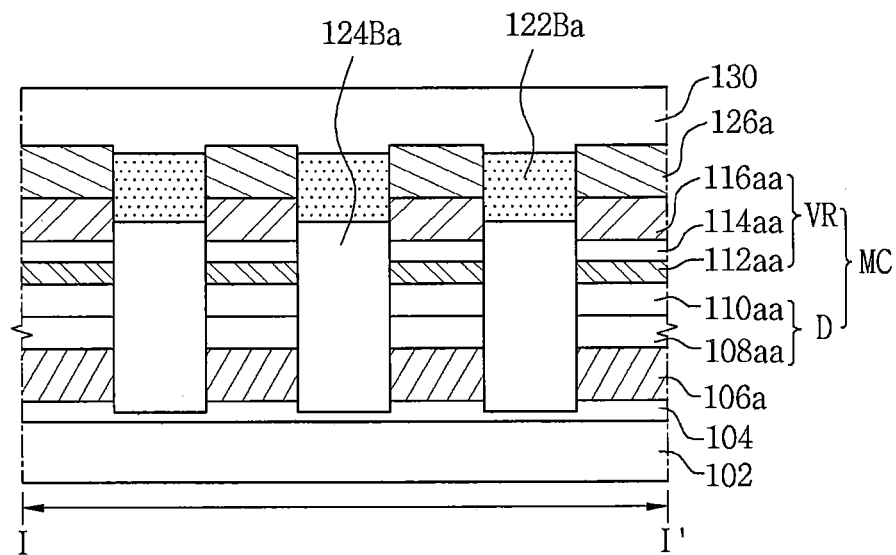
FIGS. 4A and 4B are vertical cross-sections taken along lines I-I' and II-II' of FIG. 1A, respectively.
Figure 4B:
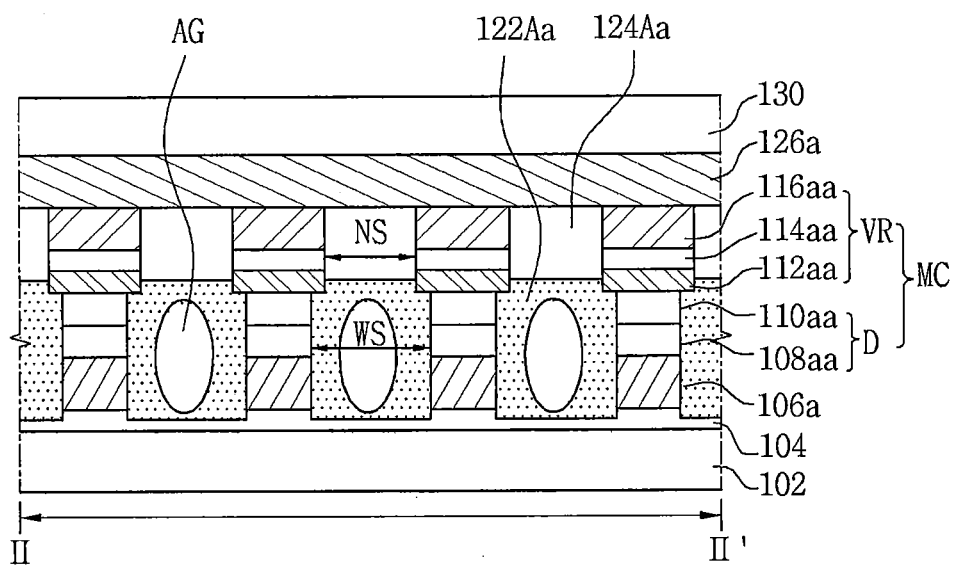
Figure 4C:
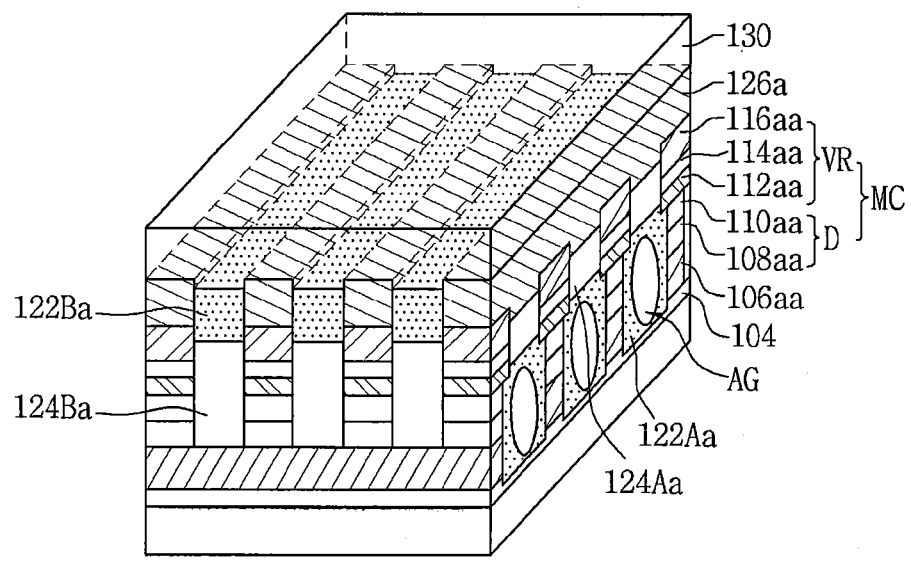
FIG. 4C is a perspective view illustrating a front cross section of bit lines and memory cells and a side cross section of word lines and the memory cells of a memory device in accordance with some embodiments of the inventive concept.
Figure 4D:
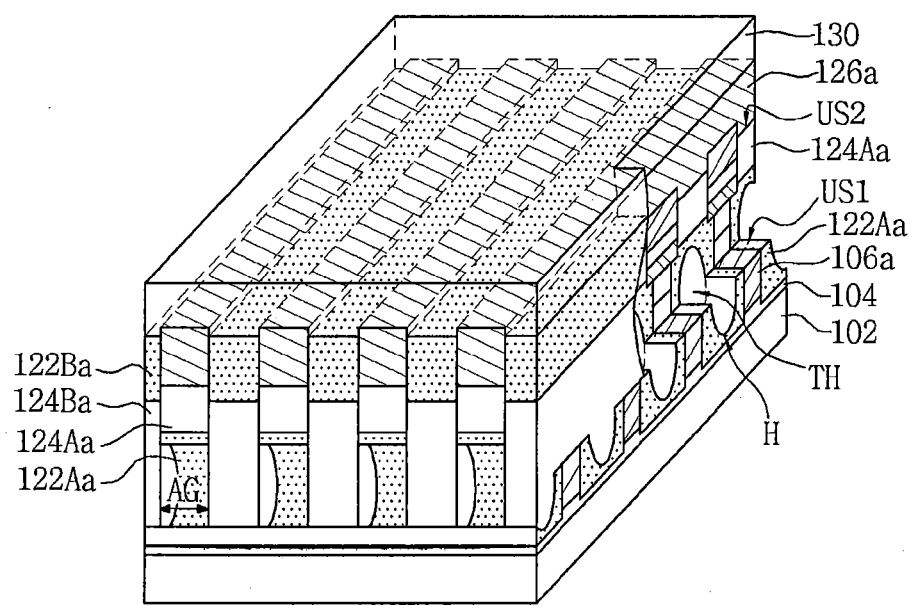
FIG. 4D is a perspective view illustrating a front cross section between the bit lines and a side cross section between the word lines of a memory device in accordance with some embodiments of the inventive concept.

FIGS. 4A and 4B are vertical cross-sections taken along lines I-I' and II-II' of FIG. 1A, respectively. FIG. 4C is a perspective view illustrating a front cross section of bit lines and memory cells and a side cross section of word lines and the memory cells in accordance with some embodiments of the present inventive concept. FIG. 4D is a perspective view illustrating a front cross section between the bit lines and a side cross section between the word lines in accordance with some embodiments of the present inventive concept.

Referring to FIGS. 4A to 4D, a memory device 100c in accordance with some embodiments of the inventive concept may include a substrate 102, a buffer layer 104, bit lines 106a, memory cells MC, word lines 126a, and a protection layer 130. The memory device 100c may further include an air gap AG, a first low permittivity layer 122Aa configured to surround the air gap AG, a second low permittivity layer 122Ba, a first dielectric layer 124Aa, and a second dielectric layer 124Ba.

The first low permittivity layer 122Aa may have a same or similar configuration as the first dielectric layer 124Aa discussed above with respect to FIG. 3D. However, the first low permittivity layer 122Aa may be formed only in the wide space WS between the memory cells MC. An upper surface of the first low permittivity layer 122Aa may be located at a lower level than an upper surface of the first electrode 112aa of the variable resistance device VR. The first dielectric layer 124Aa may be stacked on the second surface US2 of the first low permittivity layer 122Aa.

Referring to FIGS. 4A and 4D, the second dielectric layer 124Ba may have a same or similar configuration as the second dielectric layer 124Ba discussed with respect to FIG. 3D. The second dielectric layer 124Ba may contact an upper surface of the bit line 106a, the first surface US1 of the first low permittivity layer 122Aa, and a side of the first low permittivity layer 122Aa in which the through hole TH is formed. Therefore, a boundary of the air gap AG may have a surface of the first low permittivity layer 122Aa and a surface of the second dielectric layer 124Ba. The second low permittivity layer 122Ba may fill the word lines 126a, and may be stacked on an upper surface of the second dielectric layer 124Ba.

Figure 5A:
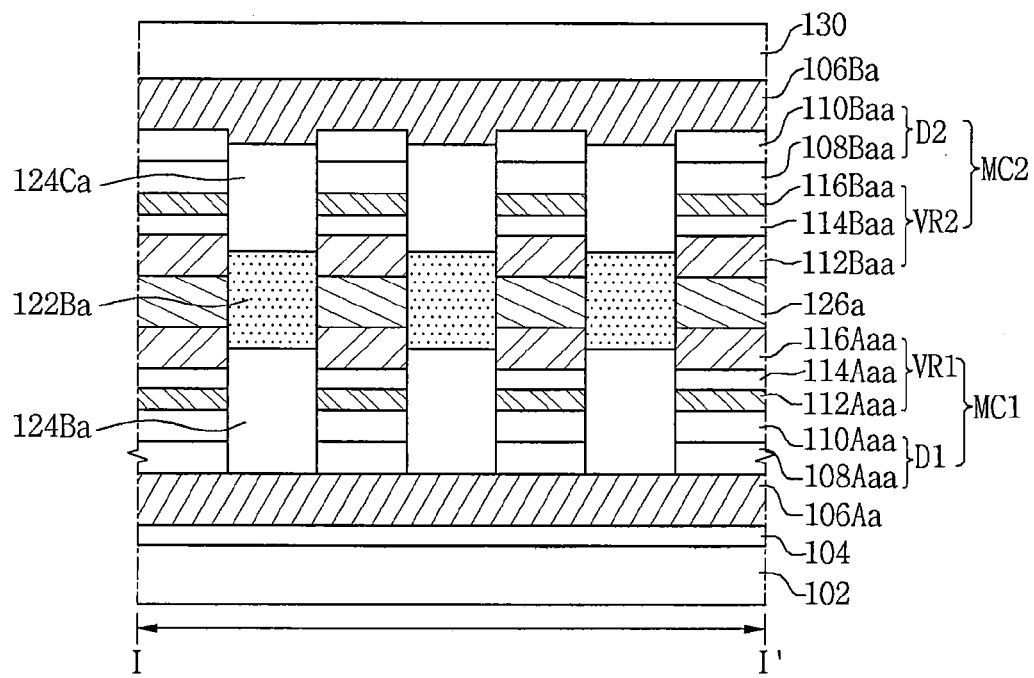
FIGS. 5A and 5B are vertical cross-sections taken along lines I-I' and II-II' of FIG. 1A, respectively.
Figure 5B:
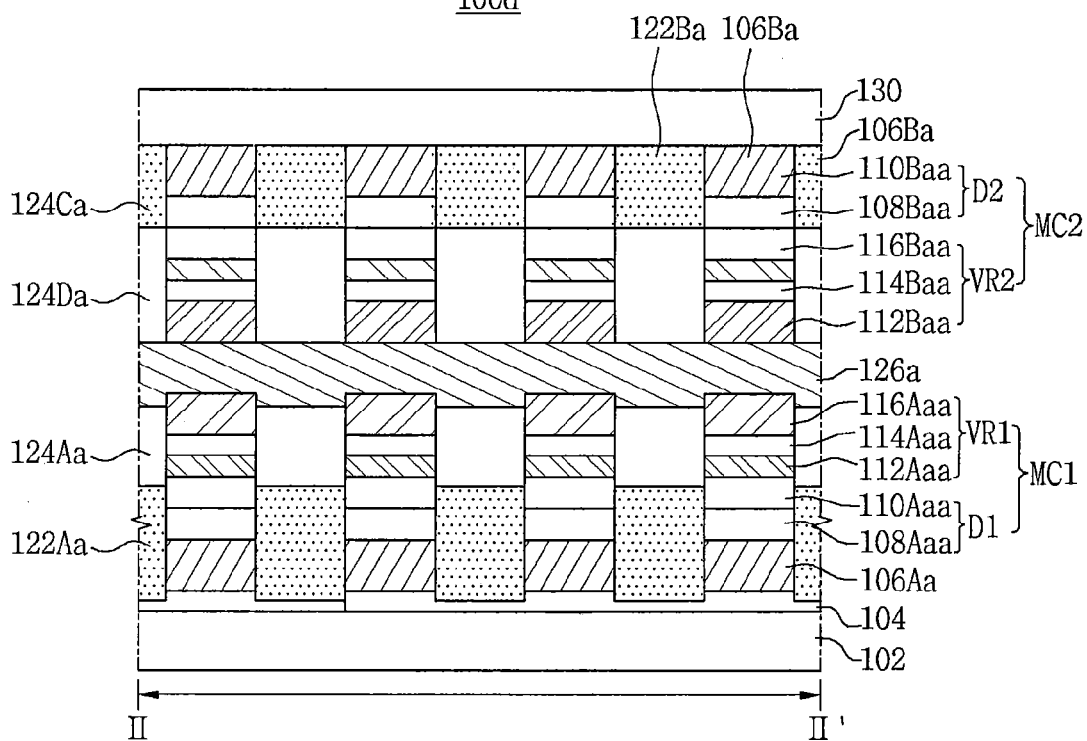
Figure 5C:
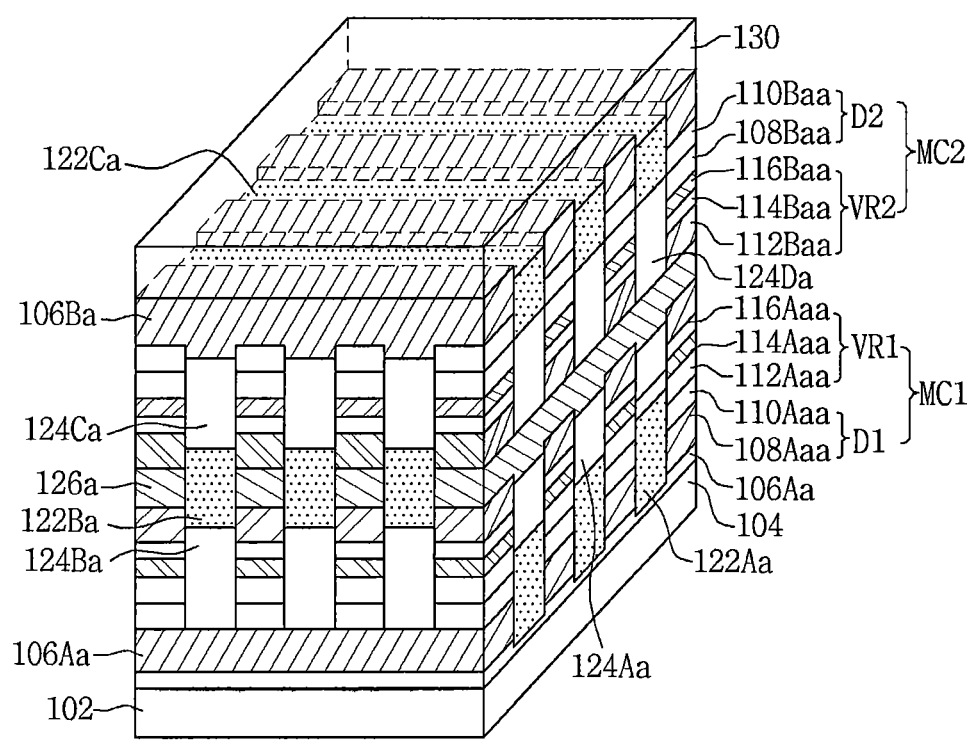
FIG. 5C is a perspective view illustrating a front cross section of bit lines and memory cells and a side cross section of word lines and the memory cells of a memory device in accordance with some embodiments of the inventive concept.
Figure 5D:
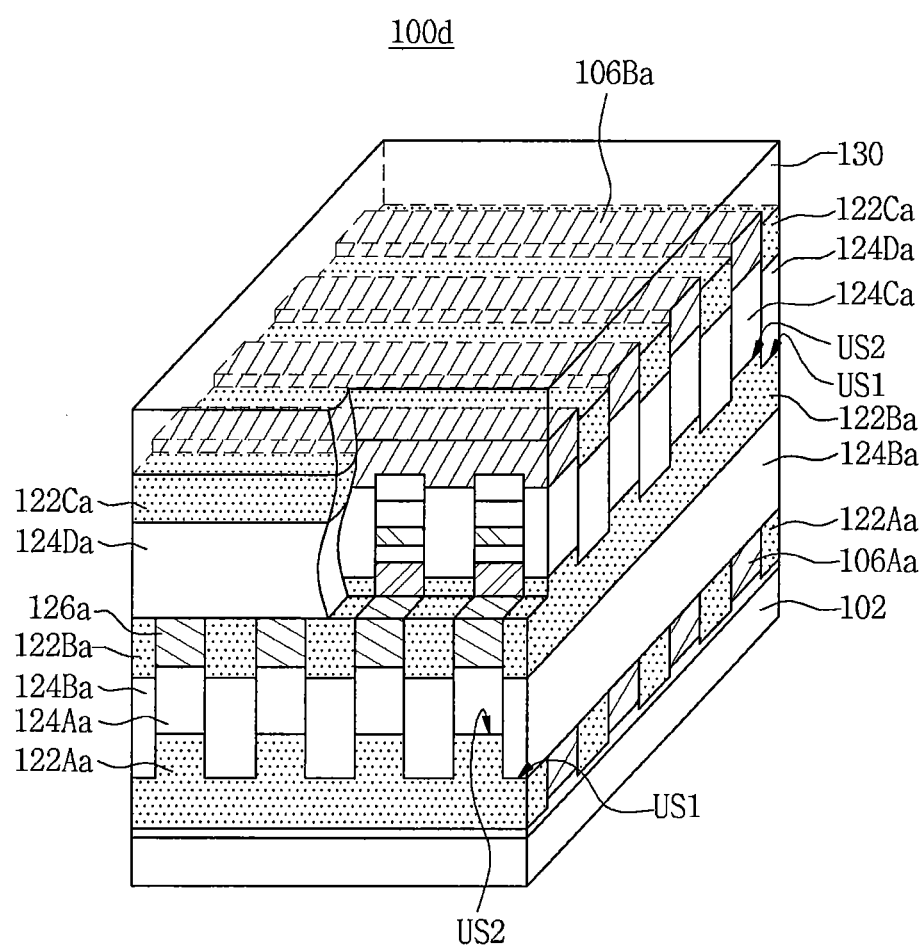
FIG. 5D is a perspective view illustrating a front cross section between the bit lines and a side cross section between the word lines of a memory device in accordance with some embodiments of the inventive concept.

FIGS. 5A and 5B are vertical cross-sections taken along lines I-I' and II-II' of FIG. 1A, respectively. FIG. 5C is a perspective view illustrating a front cross section of bit lines and memory cells and a side cross section of word lines and the memory cells in accordance with some embodiments of the present inventive concept. FIG. 5D is a perspective view illustrating a front cross section between the bit lines and a side cross section between the word lines in accordance with some embodiments of the present inventive concept.

Referring to FIGS. 5A to 5D, a memory device 100d in accordance with some embodiments of the inventive concept may include a substrate 102, a buffer layer 104, first bit lines 106Aa, first memory cells MC1, word lines 126a, second memory cells MC2, second bit lines 106Ba, and a protection layer 130.

The first bit lines 106Aa and the second bit lines 106Ba may be formed to be vertically spaced apart and in parallel to each other. The word lines 126a may be located between the first bit lines 106Aa and the second bit lines 106Ba, and may vertically cross the first bit lines 106Aa and the second bit lines 106Ba. The first memory cells MC1 may be formed at intersections of the first bit lines 106Aa and the word lines 126a. The second memory cells MC2 may be formed at intersections of the word lines 126a and the second bit lines 106Ba.

The first memory cells MC1 each may include a first diode D1 and a first variable resistance device VR1. The second memory cells MC2 each may include a second diode D2 and a second variable resistance device VR2. The first diode D1 may include a lower first impurity pattern 108Aaa and a lower second impurity pattern 110Aaa. The second diode D2 may include an upper first impurity pattern 108Baa and an upper second impurity pattern 110Baa.

The lower first impurity pattern 108Aaa may include N-type impurities and the lower second impurity pattern 110Aaa may include P-type impurities, or vice versa. The upper first impurity pattern 108Baa may include P-type impurities and the upper second impurity pattern 110Baa may include N-type impurities, or vice versa. The first variable resistance device VR1 may include a lower first electrode 112Aaa, a lower variable resistor 114Aaa, and a lower second electrode 116Aaa, which are sequentially stacked. The second variable resistance device VR2 may include an upper first electrode 112Baa, an upper variable resistor 114Baa, and an upper second electrode 116Baa, which are sequentially stacked. The lower second electrode 116Aaa may be formed to be thicker than the lower first electrode 112Aaa. The upper first electrode 112Baa may be formed to be thicker than the upper second electrode 116Baa.

The memory device 100d in accordance with some embodiments of the inventive concept may include a first low permittivity layer 122Aa, a second low permittivity layer 122Ba, a third low permittivity layer 122Ca, a first dielectric layer 124Aa, a second dielectric layer 124Ba, a third dielectric layer 124Ca, and a fourth dielectric layer 124Da.

An arrangement of the first low permittivity layer 122Aa, the first dielectric layer 124Aa, the second dielectric layer 124Ba, and the second low permittivity layer 122Ba may be understood with reference to FIGS. 2A to 2D. The second low permittivity layer 122Ba may be stacked on an upper surface of the second dielectric layer 124Ba, and formed between the word lines 126a. The second low permittivity layer 122Ba may include a first surface US1 located at the same level as an upper surface of the word line 126a with which the second memory cells MC2 do not come in contact, and a second surface US2 located at a higher level than the first surface US1. The second surface US2 may be located at a lower level than an upper surface of the upper first electrode 112Baa of the second variable resistance device VR2.

Referring to FIGS. 5C and 5D, the third dielectric layer 124Ca may be stacked on the second surface US2 of the second low permittivity layer 122Ba, and formed between the second memory cells MC2 formed on bottom surfaces of the second bit lines 106Ba. The fourth dielectric layer 124Da may be stacked on an upper surface of the word line 126a with which the second memory cells MC2 do not come in contact and on the first surface US1 of the second low permittivity layer 122Ba, and may contact a side of the third dielectric layer 124Ca. An upper surface of the fourth dielectric layer 124Da may be located at a lower level than an upper surface of the upper first impurity pattern 108Baa of the second diode D2. The third low permittivity layer 122Ca may be stacked on the upper surface of the fourth dielectric layer 124Da, and formed between the second bit lines 106Ba.

Figure 6A:
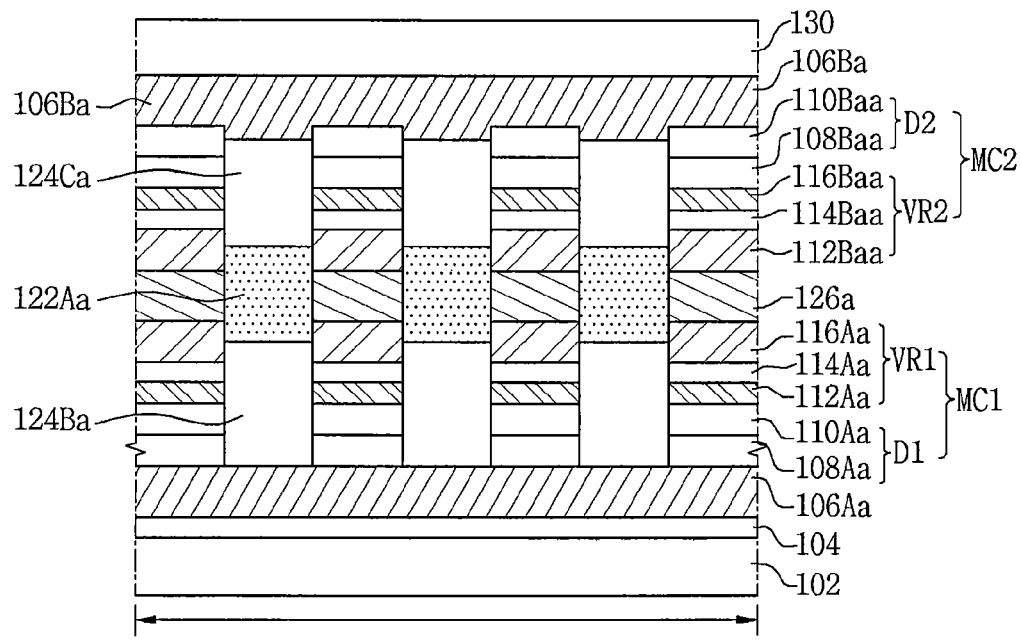
FIGS. 6A and 6B are vertical cross-sections taken along lines I-I' and II-II' of FIG. 1A, respectively.
Figure 6B:
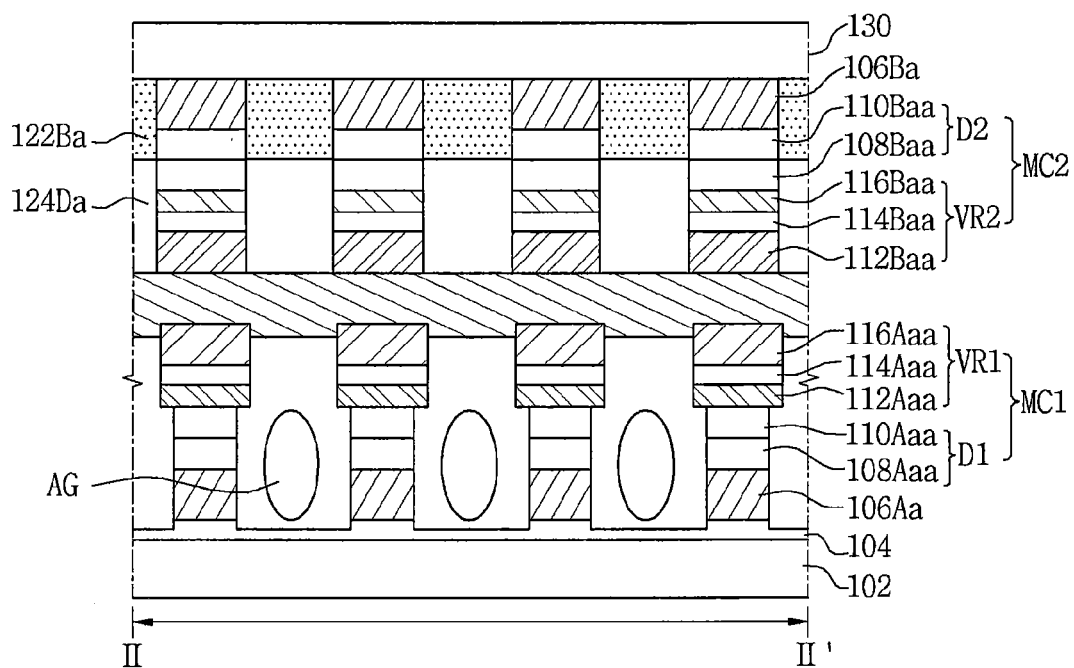
Figure 6C:
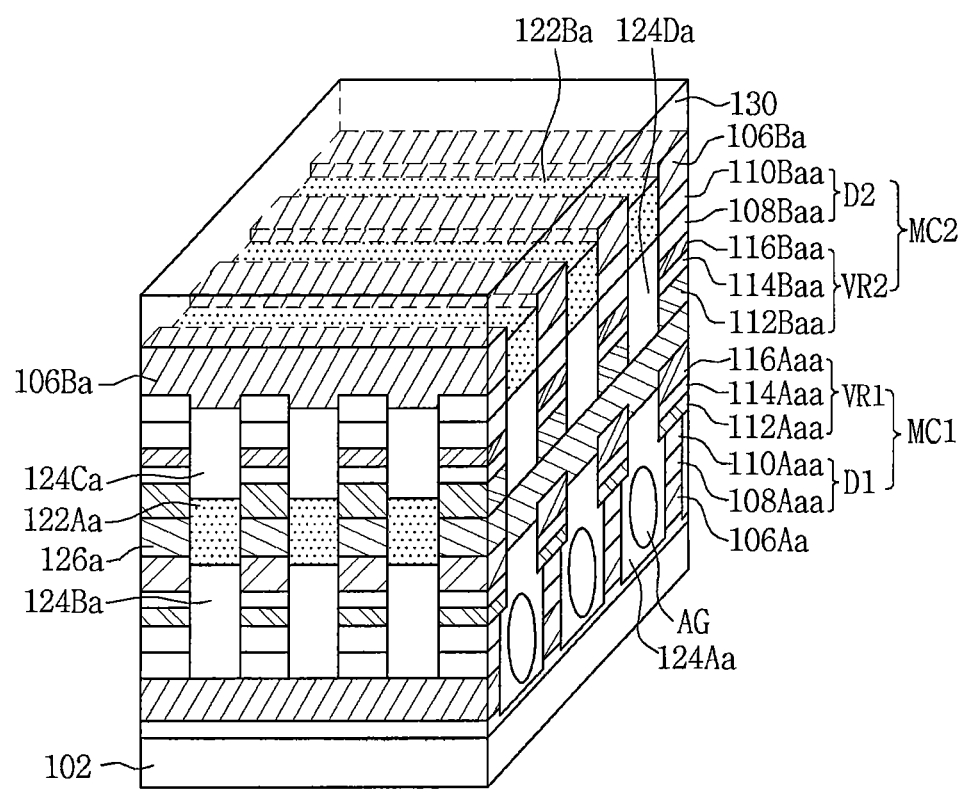
FIG. 6C is a perspective view illustrating a front cross section of bit lines and memory cells and a side cross section of word lines and the memory cells of a memory device in accordance with some embodiments of the inventive concept.
Figure 6D:
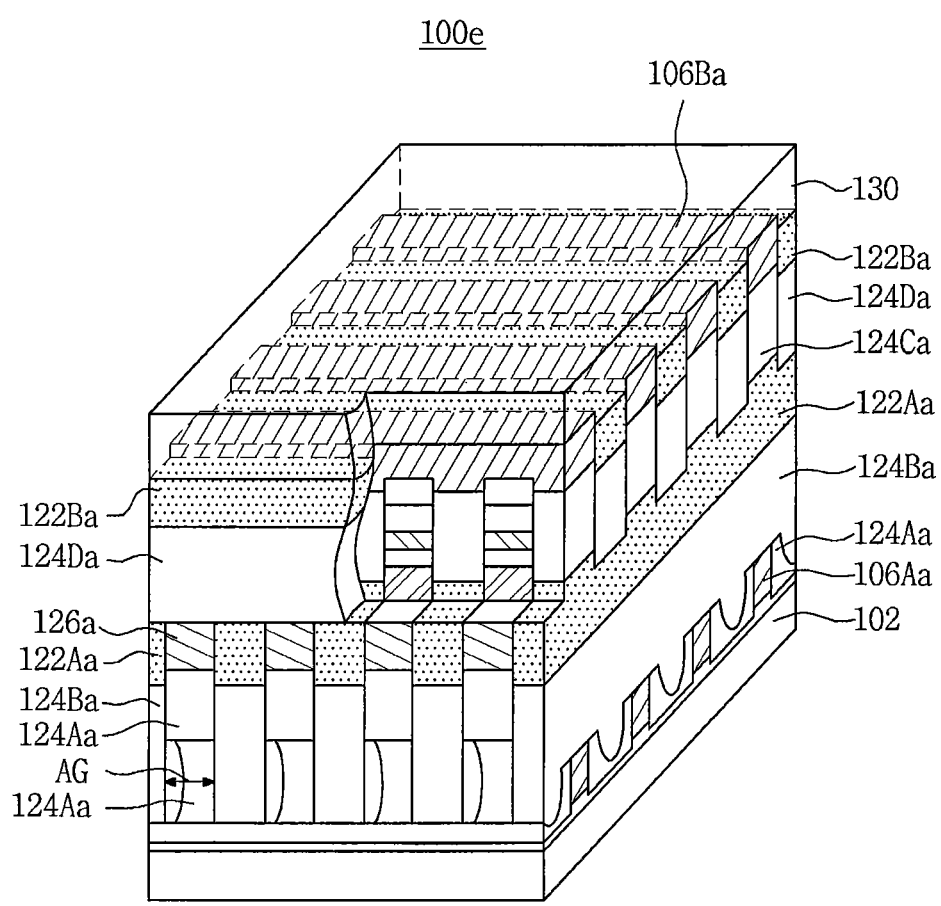
FIG. 6D is a perspective view illustrating a front cross section between the bit lines and a side cross section between the word lines of a memory device in accordance with some embodiments of the inventive concept.

FIGS. 6A and 6B are vertical cross-sections taken along lines I-I' and II-II' of FIG. 1A, respectively. FIG. 6C is a perspective view illustrating a front cross section of bit lines and memory cells and a side cross section of word lines and the memory cells in accordance with some embodiments of the present inventive concept. FIG. 6D is a perspective view illustrating a front cross section between the bit lines and a side cross section between the word lines in accordance with some embodiments of the present inventive concept.

Referring to FIGS. 6A to 6D, a memory device 100e in accordance with some embodiments of the inventive concept may include a substrate 102, a buffer layer 104, first bit lines 106Aa, first memory cells MC1, word lines 126a, second memory cells MC2, second bit lines 106Ba, and a protection layer 130. The memory device 100e may include an air gap AG, a first low permittivity layer 122Aa, a second low permittivity layer 122Ba, a first dielectric layer 124Aa, a second dielectric layer 124Ba, a third dielectric layer 124Ca, and a fourth dielectric layer 124Da.

A detailed arrangement of the air gap AG, the first dielectric layer 124Aa, and the second dielectric layer 124Ba may be understood with reference to FIGS. 3A to 3D. A detailed arrangement of the first low permittivity layer 122Aa, the third dielectric layer 124Ca, the fourth dielectric layer 124Da, and the second low permittivity layer 122Ba may be understood with reference to the arrangement of the second low permittivity layer 122Ba, the third dielectric layer 124Ca, the fourth dielectric layer 124Da, and the third low permittivity layer 122Ca of FIGS. 5A to 5D.

The first dielectric layer 124Aa including the air gap AG may be formed between the first bit lines 106Aa. The second dielectric layer 124Ba may be formed between the first memory cells MC1 formed on the upper surface of the first bit lines 106Aa. The first low permittivity layer 122Aa may be formed between the word lines 126a. The third dielectric layer 124Ca may be formed between the second memory cells MC2 formed on bottom surfaces of the second bit lines 106Ba. The fourth dielectric layer 124Da may be stacked on an upper surface of the word line 126a with which the second memory cells MC2 do not come in contact and on an upper surface of the first low permittivity layer 122Aa having a surface of the same level as the upper surface of the word line 126a, and may contact a side of the third dielectric layer 124Ca. An upper surface of the fourth dielectric layer 124Da may be located at a lower level than an upper surface of the upper first impurity pattern 108Baa of the second diode D2. The second low permittivity layer 122Ba may be stacked on the upper surface of the fourth dielectric layer 124Da and formed between the second bit lines 106Ba.

Figure 7A:
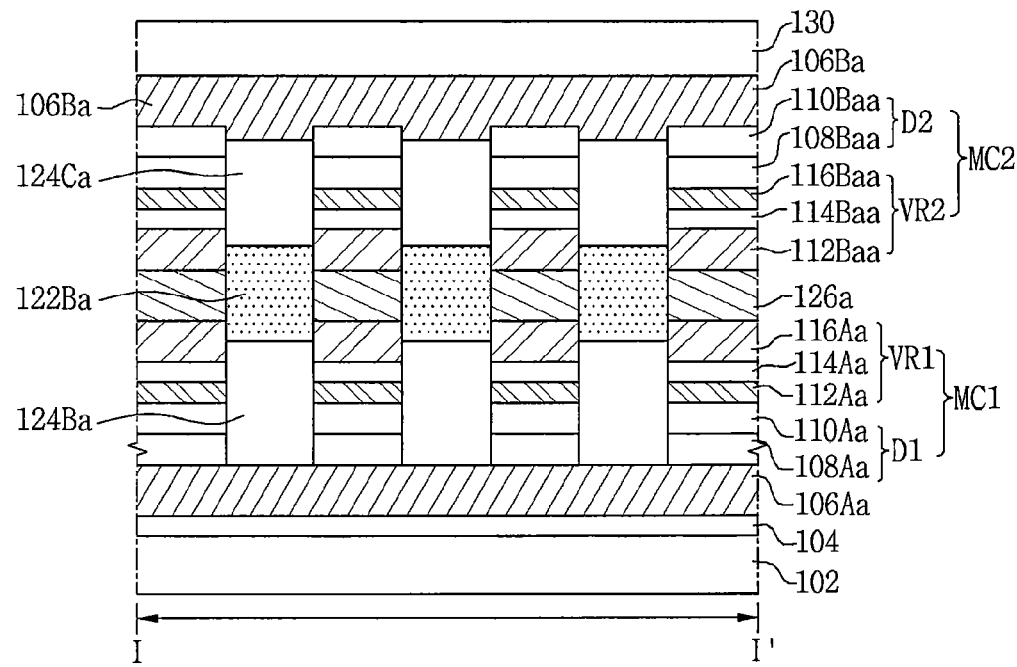
FIGS. 7A and 7B are vertical cross-sections taken along lines I-I' and II-II' of FIG. 1A, respectively.
Figure 7B:
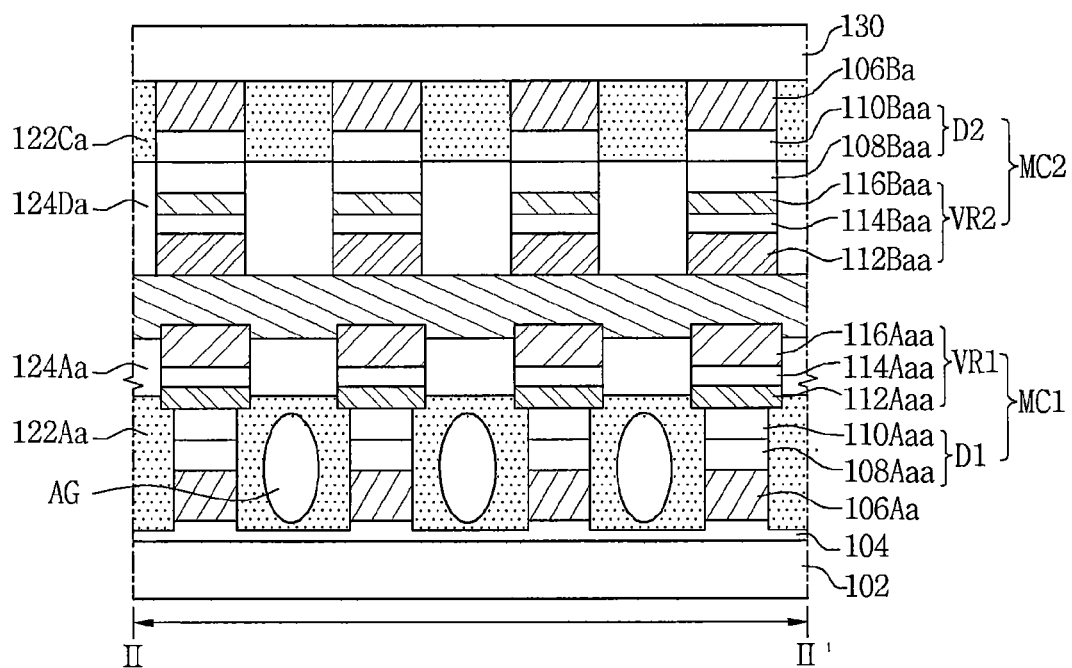
Figure 7C:
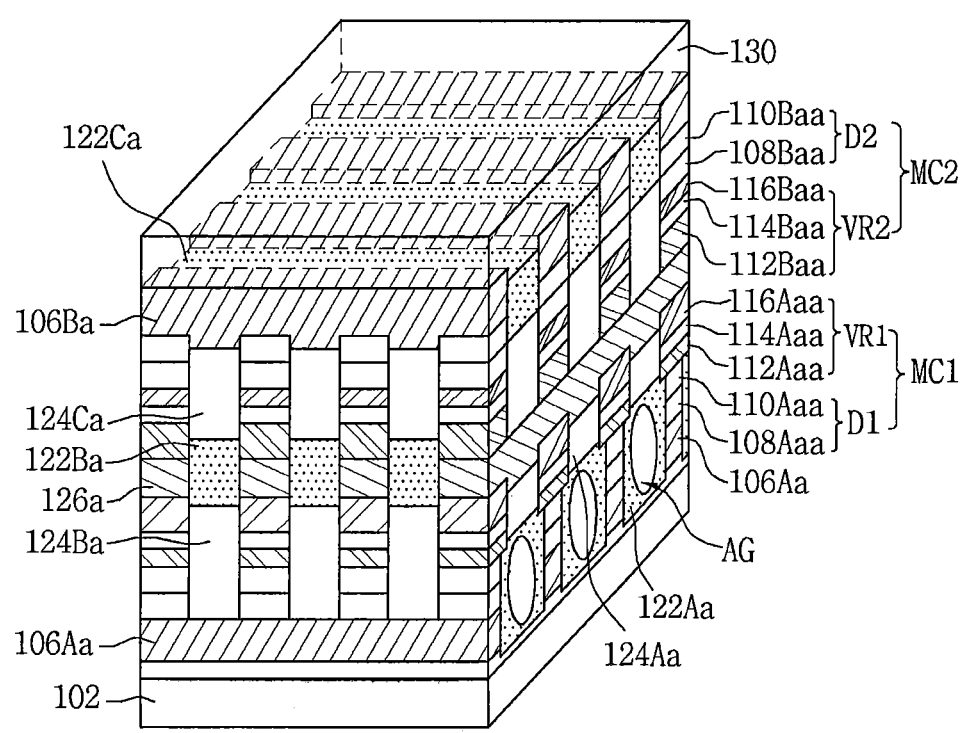
FIG. 7C is a perspective view illustrating a front cross section of bit lines and memory cells and a side cross section of word lines and the memory cells of a memory device in accordance with some embodiments of the inventive concept.
Figure 7D:
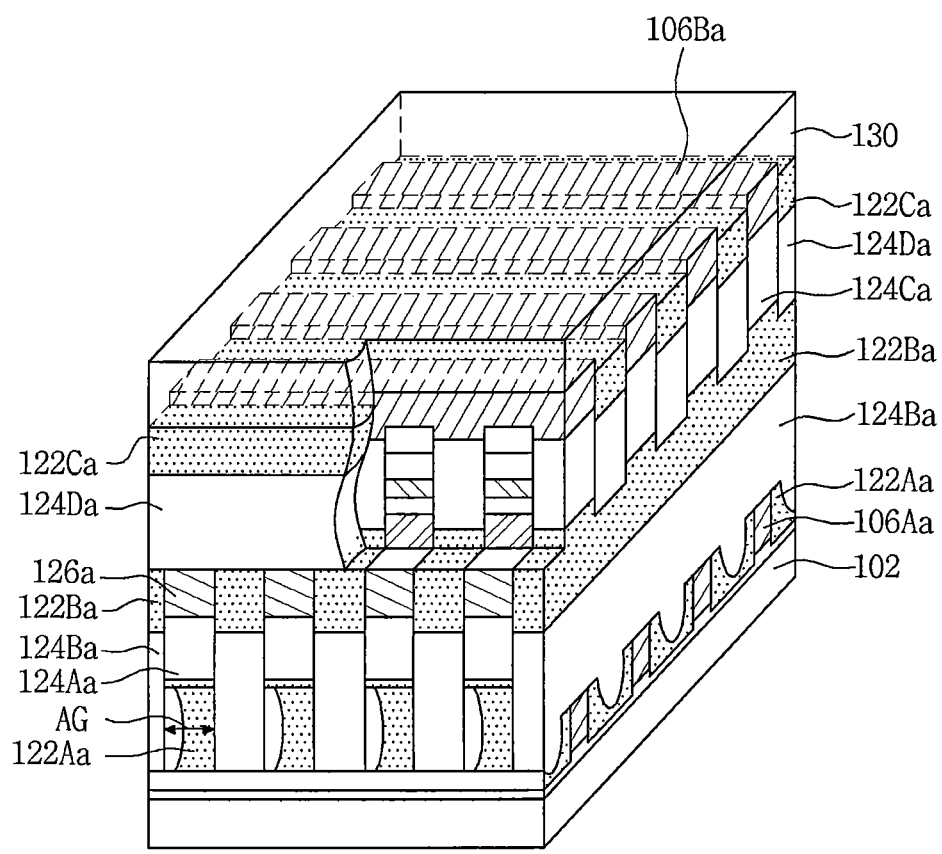
FIG. 7D is a perspective view illustrating a front cross section between the bit lines and a side cross section between the word lines of a memory device in accordance with some embodiments of the inventive concept.

FIGS. 7A and 7B are vertical cross-sections taken along lines I-I' and II-II' of FIG. 1A, respectively. FIG. 7C is a perspective view illustrating a front cross section of bit lines and memory cells and a side cross section of word lines and the memory cells in accordance with some embodiments of the present inventive concept. FIG. 7D is a perspective view illustrating a front cross section between the bit lines and a side cross section between the word lines in accordance with some embodiments of the present inventive concept.

Referring to FIGS. 7A to 7D, a memory device 100f in accordance with some embodiments of the inventive concept may include a substrate 102, a buffer layer 104, first bit lines 106Aa, first memory cells MC1, word lines 126a, second memory cells MC2, second bit lines 106Ba, and a protection layer 130.

Further, the memory device 100f may include an air gap AG, a first low permittivity layer 122Aa, a second low permittivity layer 122Ba, a third low permittivity layer 122Ca, a first dielectric layer 124Aa, a second dielectric layer 124Ba, a third dielectric layer 124Ca, and a fourth dielectric layer 124Da.

A detailed arrangement of the air gap AG, the first low permittivity layer 122Aa, the first dielectric layer 124Aa, and the second dielectric layer 124Ba may be understood with reference to FIGS. 4A to 4D. A detailed arrangement of the second low permittivity layer 122Ba, the third dielectric layer 124Ca, the fourth dielectric layer 124Da, and third low permittivity layer 122Ca may be understood with reference to FIGS. 5A to 5D.

The first low permittivity layer 122Aa having the air gap AG may be formed between the first bit lines 106Aa. The second dielectric layer 124Ba may be formed between the first memory cells MC1 formed on upper surfaces of the first bit lines 106Aa. The second low permittivity layer 122Ba may be formed between the word lines 126a. The third dielectric layer 124Ca may be formed between the second memory cells MC2 formed on bottom surfaces of the second bit lines 106Ba. The third dielectric layer 124Ca may be formed between the second memory cells MC2 formed on upper surfaces of the word lines 126a. The fourth dielectric layer 124Da may be stacked on an upper surface of the word line 126a with which the second memory cells MC2 do not come in contact and on an upper surface of the second low permittivity layer 122Ba having a surface of the same level as the upper surface of the word line 126a, and may contact a side of the third dielectric layer 124Ca. An upper surface of the fourth dielectric layer 124Da may be located at the same level as or a lower level than an upper surface of the upper first impurity pattern 108Baa of the second diode D2. The third low permittivity layer 122Ca may be stacked on the upper surface of the fourth dielectric layer 124Da and formed between the second bit lines 106Ba.

Hereinafter, processing steps in the fabrication of memory devices in accordance with various embodiments of the inventive concept will be discussed with respect the process drawings. FIGS. 8A to 15B are perspective views illustrating processing steps in the fabrication of memory device in accordance with some embodiments of the inventive concept.

Figure 8A:
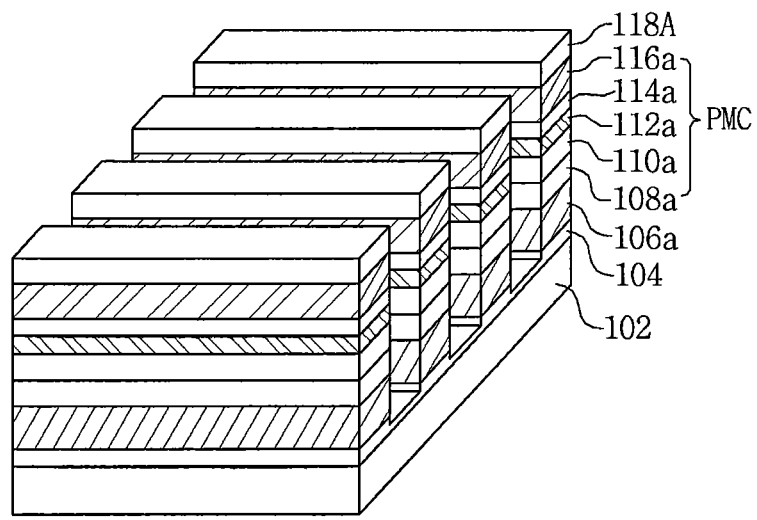
FIGS. 8A to 15B are perspective views illustrating processing steps in the fabrication of a memory device in accordance with some embodiments of the inventive concept.
Figure 8B:
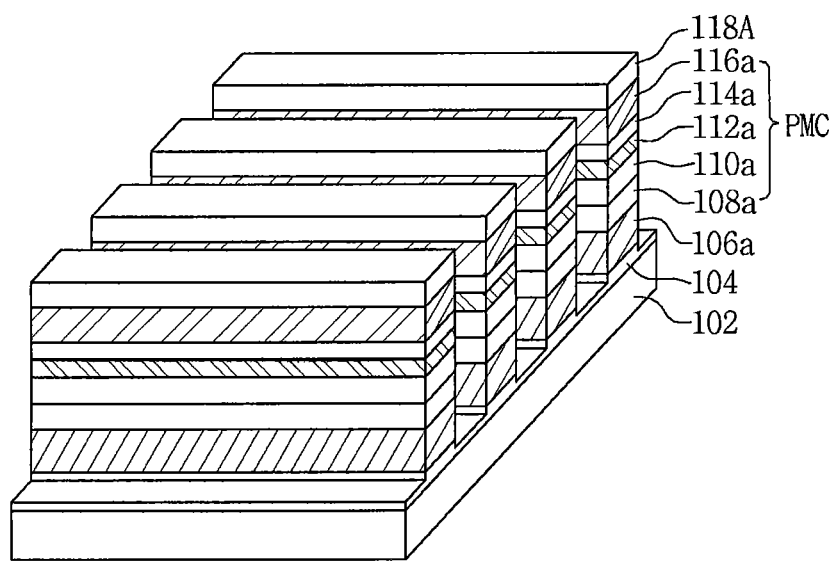

Referring to FIGS. 8A and 8B, a method of fabricating a memory device 100a in accordance with some embodiments of the inventive concept may include forming bit lines 106a and preliminary memory cells PMC on a substrate 102.

The bit lines 106a may extend in a first direction, and may be spaced apart in a second direction configured to vertically cross the first direction. The preliminary memory cells PMC may be stacked on upper surfaces of the bit lines 106a. The preliminary memory cells PMC may include, for example, a preliminary first impurity pattern 108a, a preliminary second impurity pattern 110a, a preliminary first electrode 112a, a preliminary variable resistor 114a, and a preliminary second electrode 116a, which are sequentially stacked.

The substrate 102 may include, for example, a silicon substrate. The buffer layer 104 may include, for example, silicon oxide ($SiO_2$). The bit lines 106a may include, for example, tungsten (W), aluminum (Al), titanium nitride (TiN), or tungsten nitride (WN). The preliminary first impurity pattern 108a may include, for example, high concentration N-type impurities, and the preliminary second impurity pattern 110a may include, for example, high concentration P-type impurities. The N-type impurities may include, for example, pentavalent phosphorus (P), arsenic (As), and antimony (Sb). The P-type impurities may include, for example, trivalent boron (B), indium (In), and gallium (Ga). The preliminary first electrode 112a and the preliminary second electrode 116a may include, for example, platinum (Pt), ruthenium (Ru), ruthenium oxide ($RuO_x$), iridium (Ir), iridium oxide ($IrO_x$), titanium nitride (TiN), tungsten (W), tantalum (Ta), or tantalum nitride (TaN). The preliminary variable resistor 114a may include, for example, hafnium oxide (Fox), titanium oxide ($TiO_x$), nickel oxide (NiO), zirconium oxide ($ZrO_x$), aluminum oxide ($AlO_x$), silicon oxide ($SiO_x$), niobium oxide ($NbO_x$), tantalum oxide ($TaO_x$), or tungsten oxide ($WO_x$). In contrast, the preliminary first impurity pattern 108a may include P-type impurities, and the preliminary second impurity pattern 110a may include N-type impurities.

A first mask pattern 118A may be patterned using a photolithography etching process. The bit lines 106a and the preliminary memory cells PMC may be formed using an etching process in which the first mask pattern 118A is used as an etch mask. The first mask pattern 118A may include silicon oxide.

The bit lines 106a, the preliminary first impurity pattern 108a, the preliminary second impurity pattern 110a, the preliminary first electrode 112a, the preliminary variable resistor 114a, and the preliminary second electrode 116a may not be formed by a single etching process. More particularly, since an etching gas or etchant may be different according to materials, the above-described configurations may be formed by a plurality of etching processes. During the etching processes, a height of the first mask pattern 118A may be reduced. Further, the buffer layer 104 between the bit lines 106a may be recessed by a predetermined height from a top.

Figure 9A:
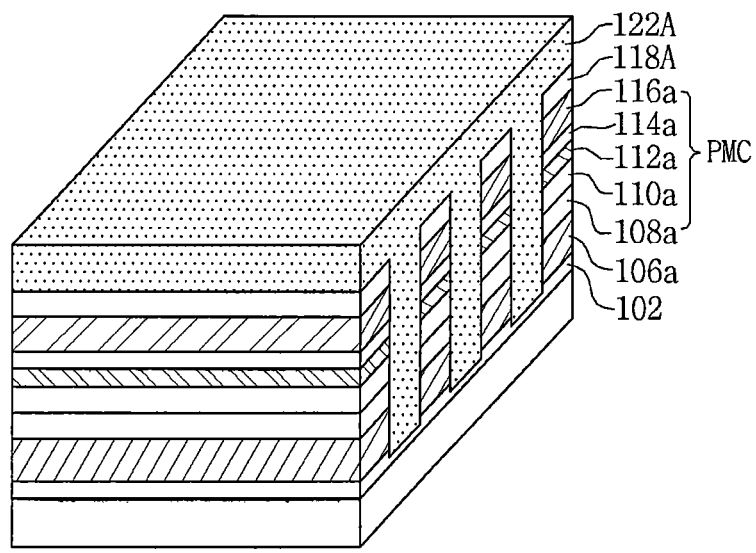
Figure 9B:
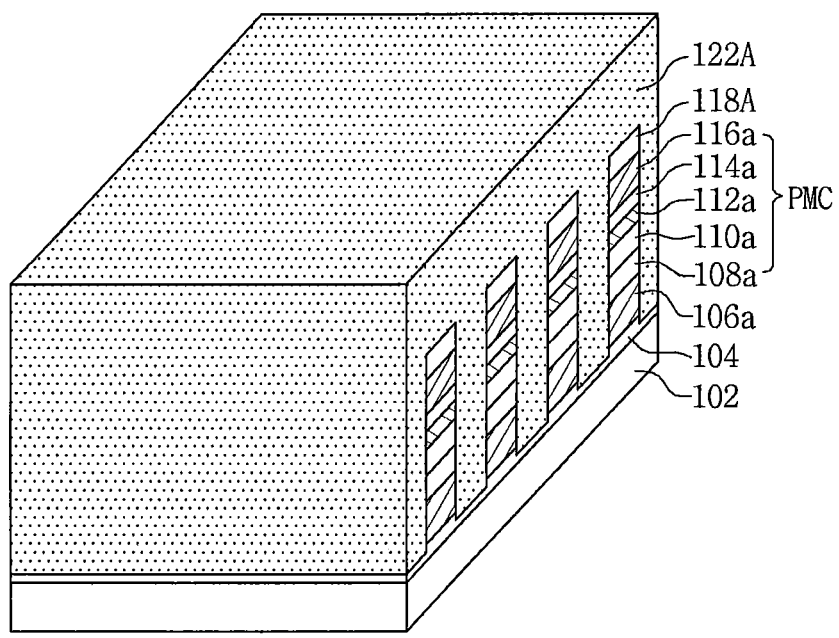

Referring to FIGS. 9A and 9B, the method of fabricating the memory device 100a in accordance with some embodiments of the inventive concept may include forming a first low permittivity material layer 122A.

The first low permittivity material layer 122A may fill a space between the bit lines 106a and between the preliminary memory cells PMC, and cover the first mask pattern 118A.

The first low permittivity material layer 122A may have permittivity of 4 or less. The first low permittivity material layer 122A may include silicon dioxide, fluorine-doped silicon dioxide, carbon-doped silicon dioxide, or porous silicon dioxide.

Figure 10A:
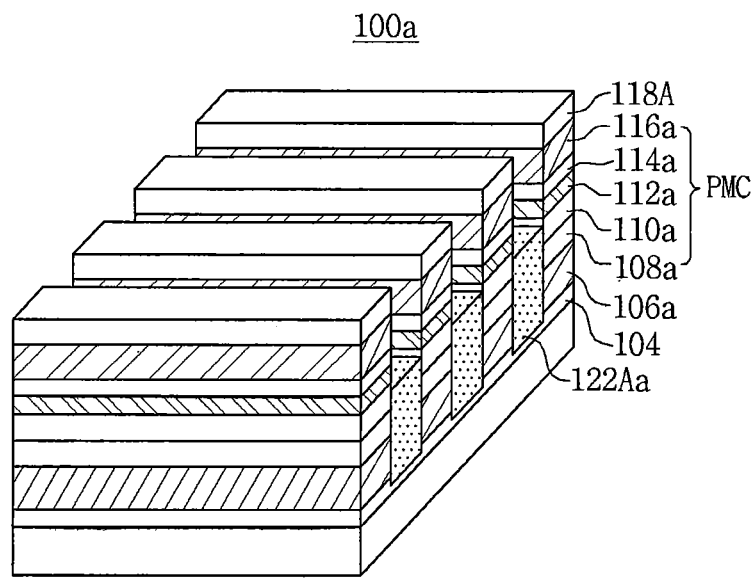
Figure 10B:
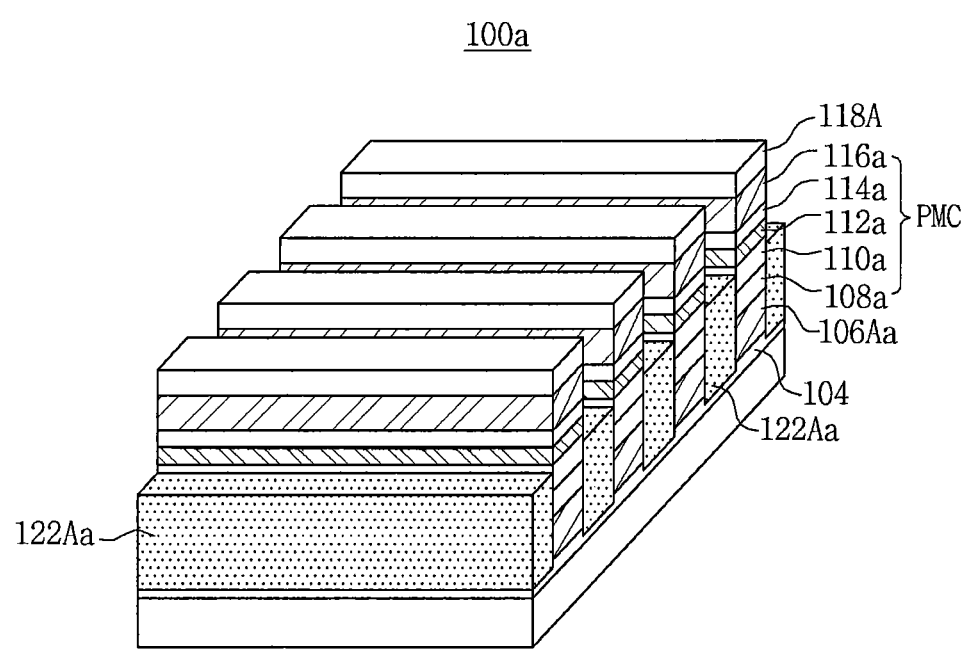

Referring to FIGS. 10A and 10B, the method of fabricating the memory device 100a in accordance with some embodiments of the inventive concept may include forming a first low permittivity layer 122Aa.

The first low permittivity layer 122Aa may fill spaces between the bit lines 106a and between the preliminary memory cells PMC, which are adjacent to each other. More particularly, an upper surface of the first low permittivity layer 122Aa may be located at a lower level than an upper surface of the preliminary second impurity pattern 110a. Sides of the preliminary first electrode 112a, the preliminary variable resistor 114a, and the preliminary second electrode 116a may be exposed.

The formation of the first low permittivity layer 122Aa may include a chemical mechanical planarization (CMP) process and an etch-back process. A part of the first low permittivity material layer 122A configured to cover an upper part of the first mask pattern 118A may be removed in the CMP process. A height of the first low permittivity material layer 122A may be made lower than a height of the preliminary memory cell PMC in the etch-back process. Therefore, the first low permittivity layer 122Aa may be formed.

Figure 11A:
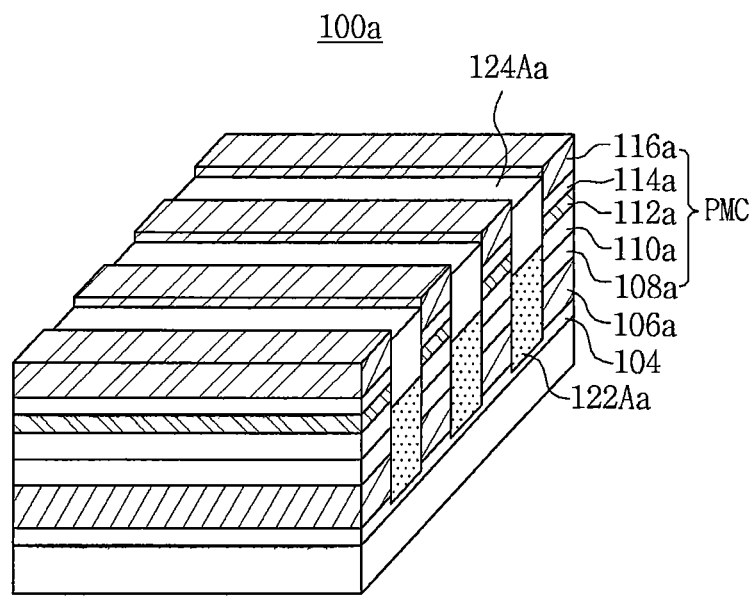
Figure 11B:
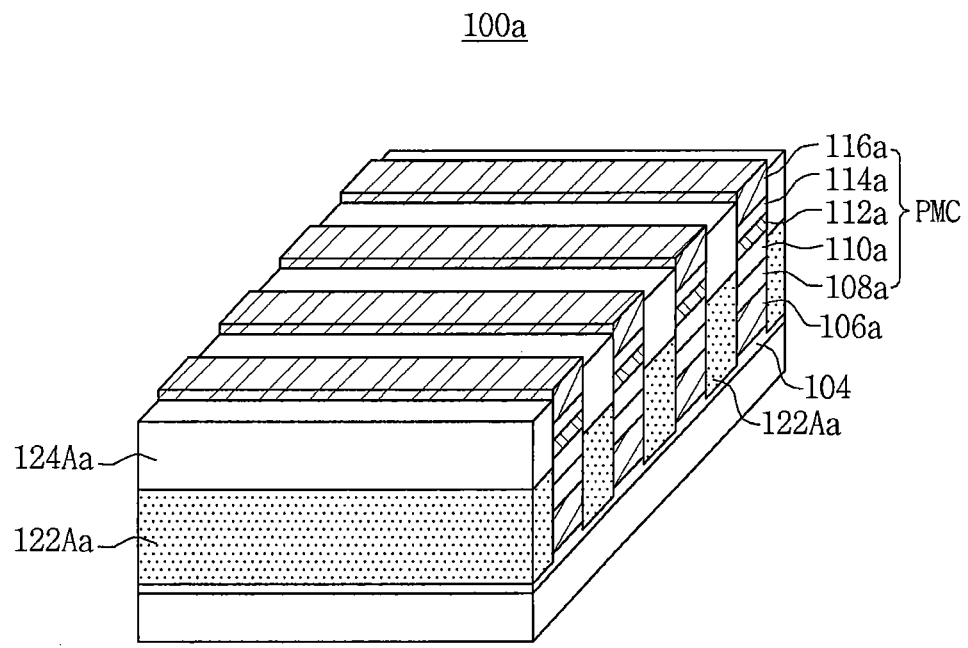

Referring to FIGS. 11A, 11B, and 10A, the method of fabricating the memory device 100a in accordance with some embodiments of the inventive concept may include forming a first dielectric layer 124Aa, and removing the first mask pattern 118A.

The first dielectric layer 124Aa may be stacked on an upper surface of the first low permittivity layer 122Aa. The first dielectric layer 124Aa may contact the exposed sides of the preliminary first electrode 112a, the preliminary variable resistor 114a, and the preliminary second electrode 116a. The first dielectric layer 124Aa may be formed using the CMP process and the etching process discussed above. The first dielectric layer 124Aa may include, for example, silicon nitride (SiN$_x$) or aluminum oxide (Al$_2$O$_3$).

Since materials included in dielectric layers and permittivity layers, and processes of forming the same among all of the processes that will be discussed hereinafter are the same as or similar to those of the first dielectric layer 124Aa and the first low permittivity layer 122Aa described above, they will be omitted.

Figure 12A:
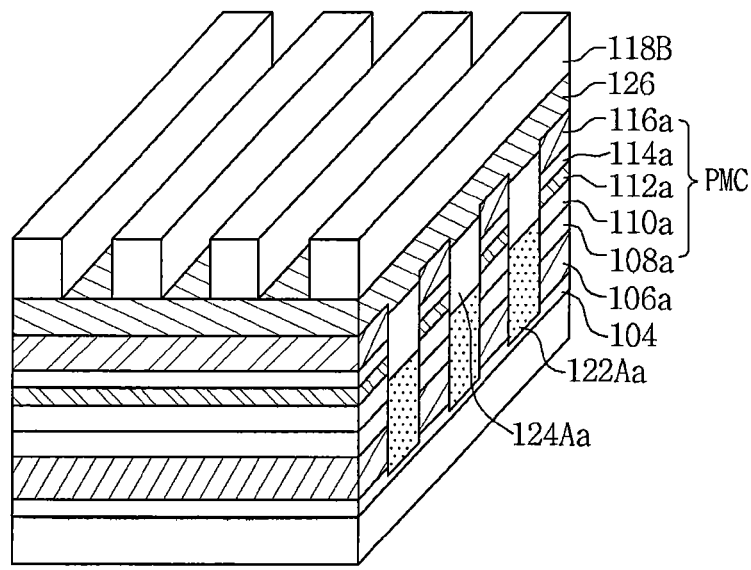
Figure 12B:
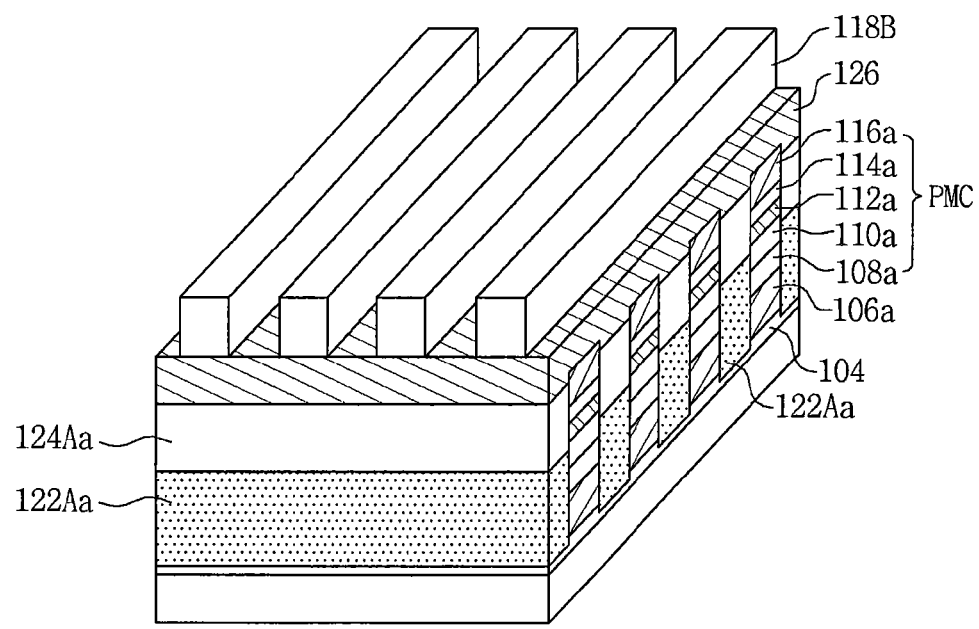

Referring to FIGS. 12A and 12B, the method of fabricating the memory device 100a in accordance with some embodiments of the inventive concept may include forming a conductive layer 126 and second mask patterns 118B.

The conductive layer 126 may contact upper surfaces of the preliminary memory cells PMC and an upper surface of the first dielectric layer 124Aa. The second mask patterns 118B may extend in a second direction perpendicular to the bit lines 106a and the preliminary memory cells PMC, and may be spaced apart in a first direction perpendicular to the second direction.

The conductive layer 126 may include, for example, tungsten (W), aluminum (Al), titanium nitride (TiN), or tungsten nitride (WN). The second mask patterns 118B may include silicon oxide. The second mask patterns 118B may be multi-layered, and may include silicon oxide or silicon nitride.

Figure 13A:
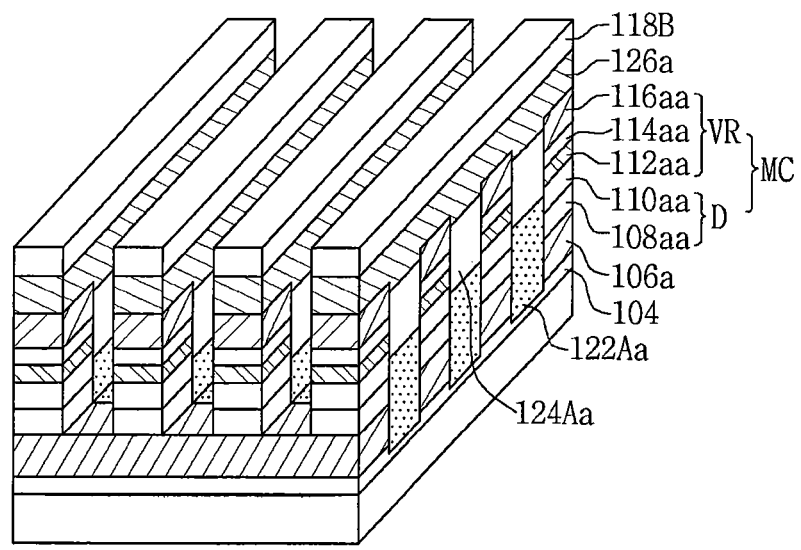
Figure 13B:
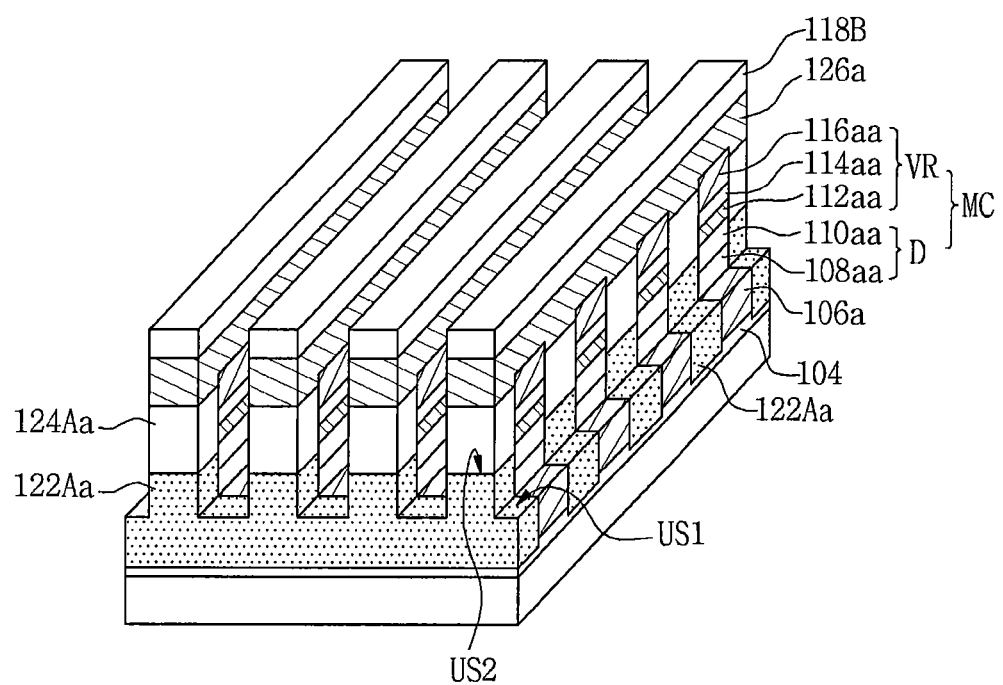

Referring to FIGS. 13A and 13B, the method of fabricating the memory device 100a in accordance with some embodiments of the inventive concept may include forming word lines 126a and memory cells MC.

The word lines 126a may cross the bit lines 106a. The memory cells MC may be formed at intersections of the word lines 126a and the bit lines 106a. The memory cells MC each include a diode D and a variable resistance device VR. The diode D may include a first impurity pattern 108aa and a second impurity pattern 110aa. The variable resistance device VR may include a first electrode 112aa, a variable resistor 114aa, and a second electrode 116aa.

Bottom surfaces of the word lines 126a may contact the second electrodes 116aa of the variable resistance devices VR. Upper surfaces of the bit lines 106a may contact the first impurity patterns 108aa of the diodes D. A first low permittivity layer 122Aa and a first dielectric layer 124Aa may be stacked between the memory cells MC formed along a bottom surface of the word line 126a.

As discussed above with reference to FIG. 2D, the first low permittivity layer 122Aa may include a first surface US1 located at the same level as the upper surface of the bit line 106a, and a second surface US2 located at a higher level than the first surface US1. The second surface US2 may be located at a higher level than the first surface US1, and at a lower level than a bottom surface of the variable resistance device VR.

Figure 14A:
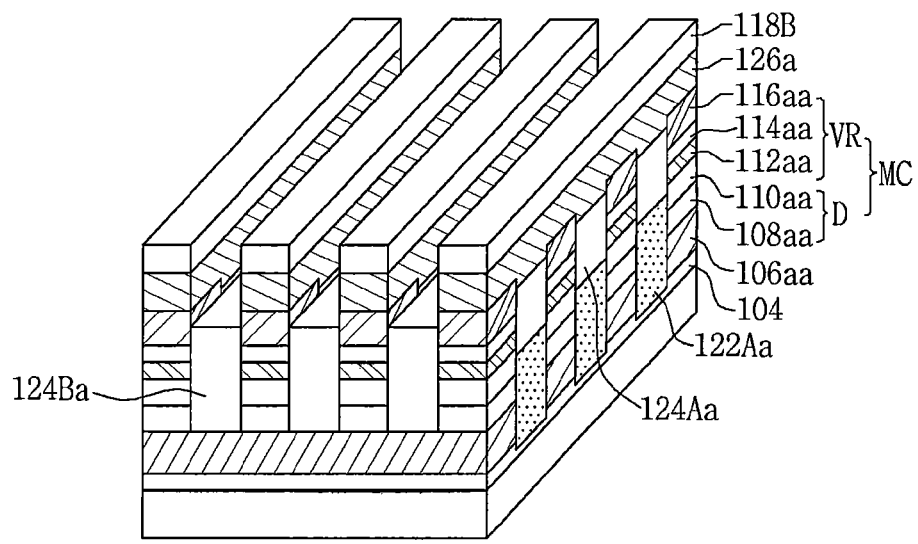
Figure 14B:
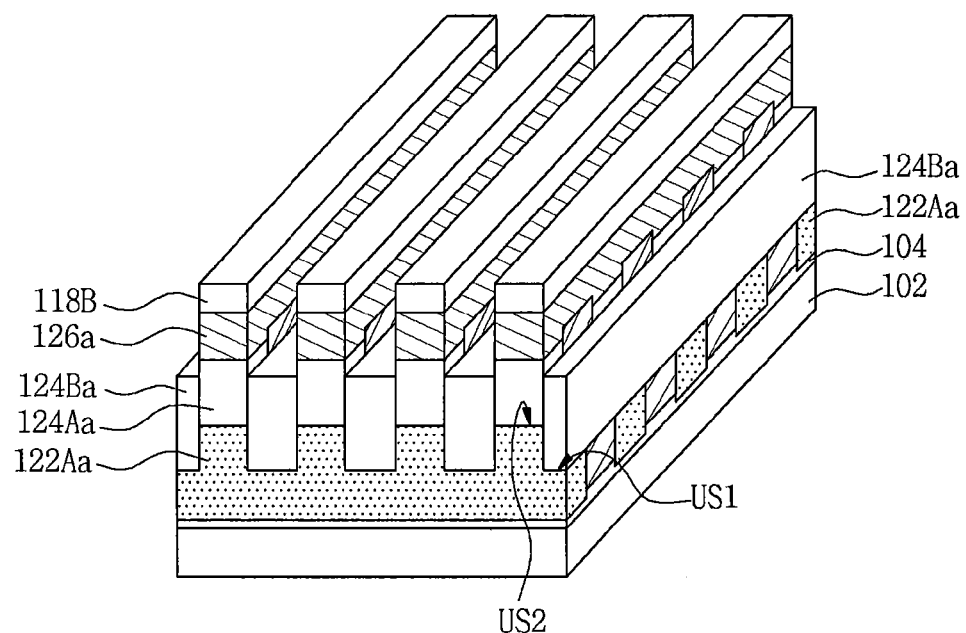

Referring to FIGS. 14A and 14B, the method of fabricating the memory device 100a in accordance with some embodiments of the inventive concept may include forming a second dielectric layer 124Ba.

The second dielectric layer 124Ba may be stacked on the upper surface of the bit line 106a with which the memory cells MC do not come in contact, and the first surface US1 of the first low permittivity layer 122Aa. More particularly, the second dielectric layer 124Ba may contact sides of the memory cells MC formed on bottom surfaces of the word lines 126a, a side of the first dielectric layer 124Aa configured to fill spaces between the memory cells MC, and the first surface US1 of the first low permittivity layer 122Aa thereunder. An upper surface of the second dielectric layer 124Ba may be located at a lower level than the bottom surface of the word line 126a.

Figure 15A:
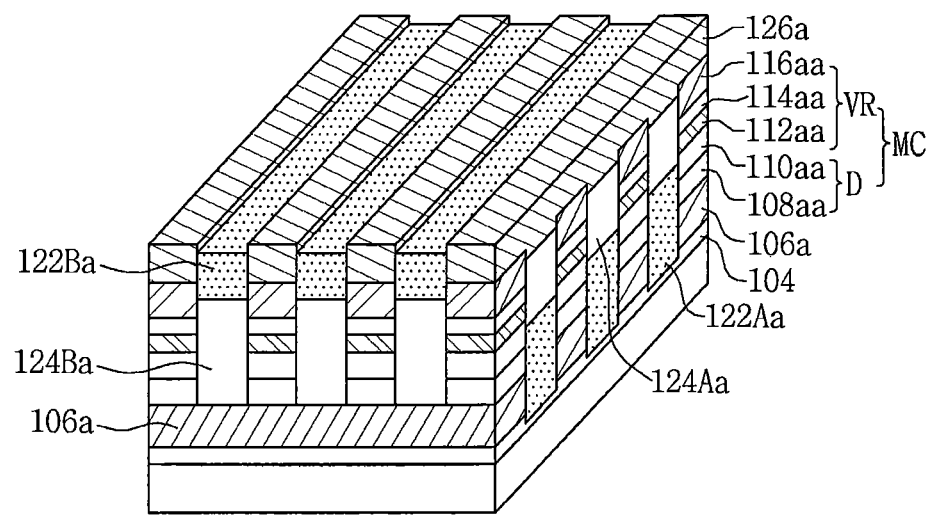
Figure 15B:
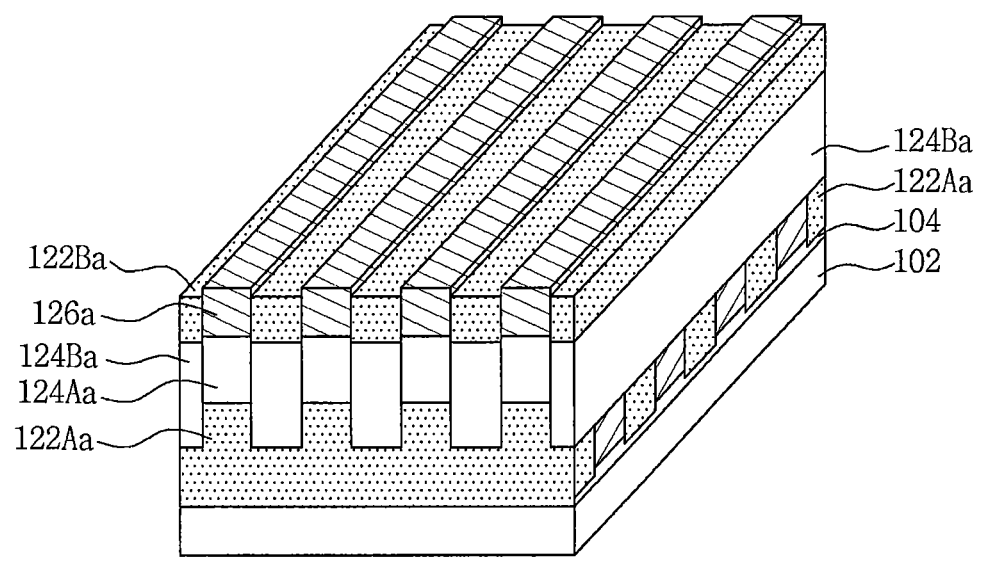

Referring to FIGS. 15A, 15B, and 14A, the method of fabricating the memory device 100a in accordance with some embodiments of the inventive concept may include forming a second low permittivity layer 122Ba, and removing a second mask pattern 118B.

The second low permittivity layer 122Ba may fill spaces between the word lines 126a. An upper surface of the second low permittivity layer 122Ba may be located at the same level as or at a lower level than an upper surface of the word line 126a.

As shown in FIGS. 2A to 2D, a protection layer 130 may be formed on the upper surfaces of the second low permittivity layer 122Ba and the word lines 126a. The protection layer 130 may include silicon nitride.

The memory device 100a in accordance with some embodiments of the inventive concept may be fabricated through the above-described processes. According to the memory device 100a in accordance with some embodiments of the inventive concept, a low dielectric material may fill spaces between the bit lines 106a and between the word lines 126a. Therefore, parasitic capacitance capable of occurring between the bit lines 106a and between the word lines 126a may be reduces, or possibly minimized.

Hereinafter, a method of fabricating a memory device in accordance with another embodiment of the inventive concept will be discussed with reference to the drawings. Processes and configurations similar to those of embodiments discussed above will be described briefly or omitted.

FIGS. 16A to 19B are perspective views for describing a process illustrating a method of fabricating a memory device in accordance with another embodiment of the inventive concept along a process flow.

Figure 16A:
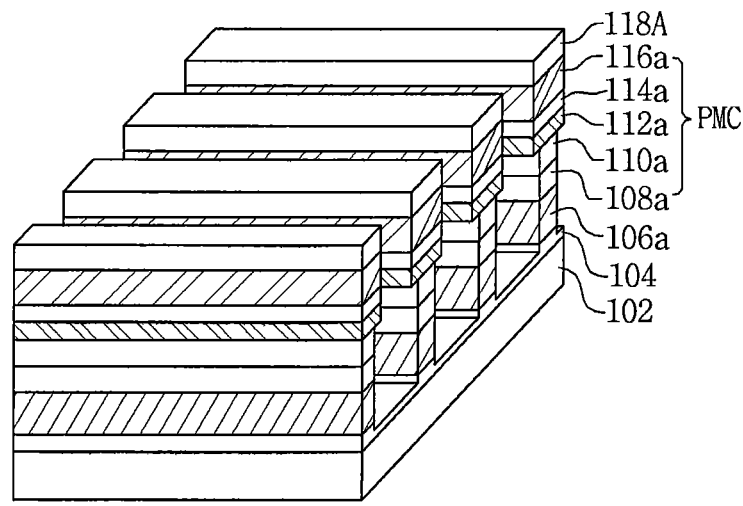
FIGS. 16A to 19B are perspective views illustrating processing steps in the fabrication of a memory device in accordance with some embodiments of the inventive concept.
Figure 16B:
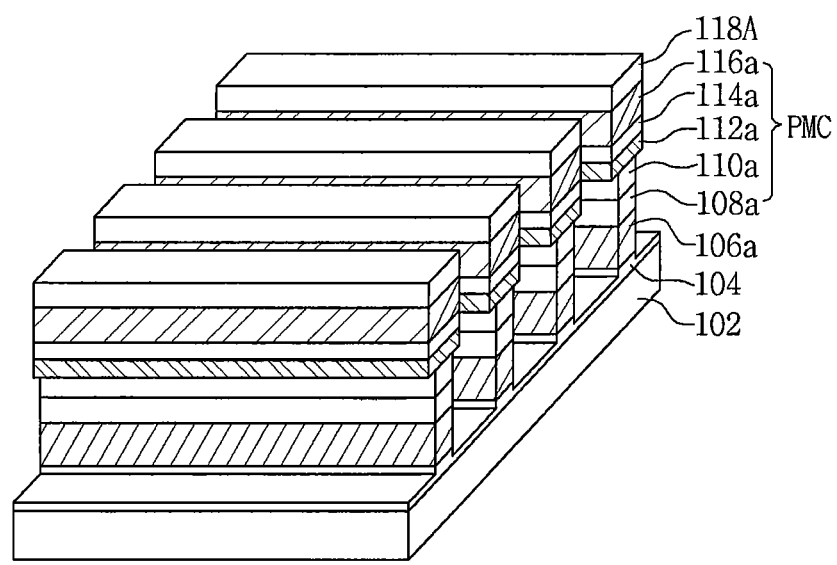

Referring to FIGS. 16A and 16B, a method of fabricating a memory device 100b in accordance with some embodiments of the inventive concept may include forming bit lines 106a and preliminary memory cells PMC.

The preliminary memory cells PMC may include a preliminary first impurity pattern 108a, a preliminary second impurity pattern 110a, a preliminary first electrode 112a, a preliminary variable resistor 114a, and a preliminary second electrode 116a, which are sequentially stacked on upper surfaces of the bit lines 106a.

Opposite sides of the bit lines 106a and the preliminary memory cells PMC may not be vertically arranged. More particularly, widths of the preliminary first electrode 112a, the preliminary variable resistor 114a, and the preliminary second electrode 116a may be greater than widths of the bit lines 106a, the preliminary first impurity pattern 108a, and the preliminary second impurity pattern 110a.

Opposite sides of the preliminary first electrode 112a, the preliminary variable resistor 114a, and the preliminary second electrode 116a may be formed to symmetrically protrude from opposite sides of the preliminary first impurity pattern 108a, the preliminary second impurity pattern 110a, and the bit lines 106a. Such an arrangement serves to make a non-uniform space between adjacent preliminary memory cells PMC. More particularly, referring to FIG. 3B, a narrow first space NS between the adjacent preliminary memory cells PMC, and a wide second space WS configured to extend from the first space NS to a bottom surface thereof may be present.

The bit lines 106a and the preliminary memory cells PMC may be patterned using an etching process in which the first mask pattern 118A is used as an etch mask. In these embodiments, as a different etching means is used and an etching rate is adjusted, each configuration may be formed to have a different width as mentioned above.

Figure 17A:
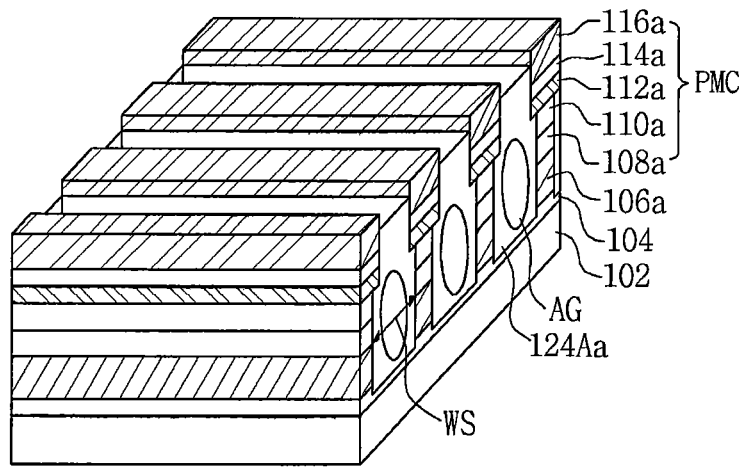
Figure 17B:
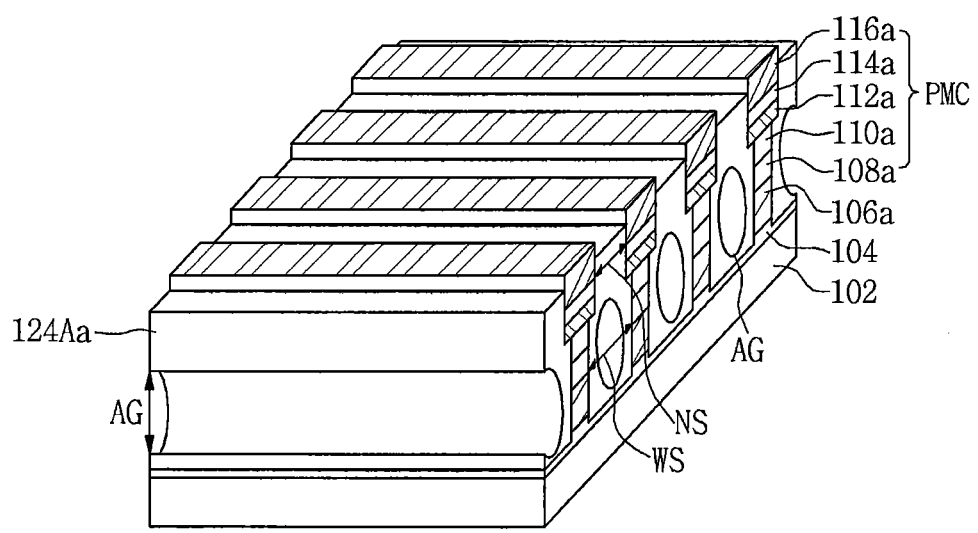

Referring to FIGS. 17A and 17B, the method of fabricating the memory device 100b in accordance with some embodiments of the inventive concept may include forming an air gap AG and a first dielectric layer 124Aa.

The first dielectric layer 124Aa may include the air gap AG. The first dielectric layer 124Aa may be formed between the bit lines 106a and between the preliminary memory cells PMC. Specifically, the air gap AG may be formed in the second space WS between the preliminary memory cells PMC. That is, the air gap AG may be formed between the bit lines 106a, between the preliminary first impurity patterns 108a, and between the preliminary second impurity patterns 110a.

In order to form the air gap AG, a space in which a material is deposited is physically non-uniformly formed, and then a method of induction may be used so that the air gap AG is generated. More particularly, the first dielectric layer 124Aa may be formed using a deposition process, and a dielectric material for forming the first dielectric layer 124Aa is gradually accumulated on sides of the preliminary memory cells PMC, recessed upper surfaces of the buffer layer 104, and sides and upper surfaces of the first mask patterns 118A during a deposition process. Spaces between the bit lines 106a and between the preliminary memory cells PMC are filled with a material which is gradually deposited. The dielectric material is rapidly accumulated on sides of the preliminary first electrode 112a, the preliminary variable resistor 114a, and the preliminary second electrode 116a protruding from first and second sides of the bit lines 106a, the preliminary second impurity patterns 108a, and the preliminary second impurity patterns 110a.

Therefore, the narrow first space NS is filled with the dielectric material before the wide second space WS between the bit lines 106a and between the preliminary memory cells PMC is filled, whereas a region which the dielectric material does not fill may be present in the wide second space WS. Since the region includes air, it may be referred to as an air gap AG. The air gap AG may extend in a longitudinal direction of the bit line 106a. Permittivity of the air that occupies the air gap AG is 1.

Referring to FIGS. 18A, 18B, 12A, and 12B, the method of fabricating the memory device 100b in accordance with some embodiments of the inventive concept may include forming word lines 126a and memory cells MC.

The word lines 126a may cross the bit lines 106a. The memory cells MC may be formed at intersections of the word lines 126a and the bit lines 106a. Each memory cell MC may include a diode D and a variable resistance device VR. The diode D may include a first impurity pattern 108aa and a second impurity pattern 110aa. The variable resistance device VR may include a first electrode 112aa, a variable resistor 114aa, and a second electrode 116aa.

The first dielectric layer 124Aa located between the word lines 126a may be removed. The first dielectric layer 124Aa may have a shape to fill spaces between the memory cells MC formed on bottom surfaces of the word lines 126a and between the bit lines 106a.

Figure 18A:
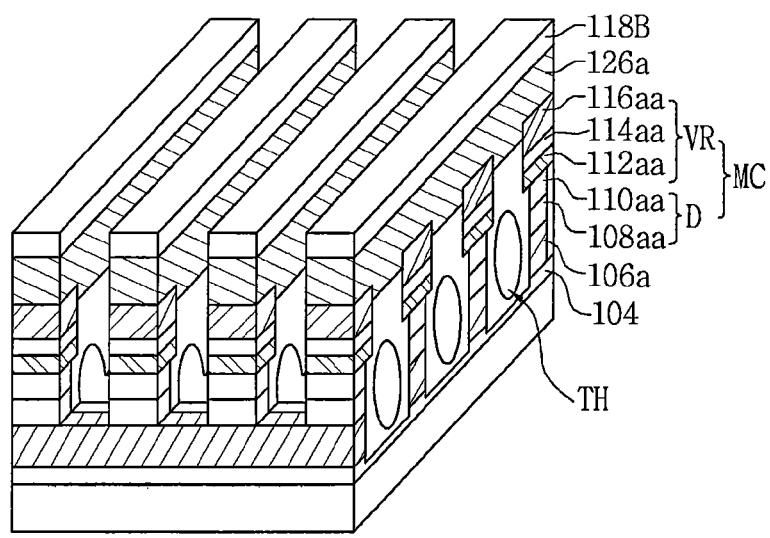
Figure 18B:
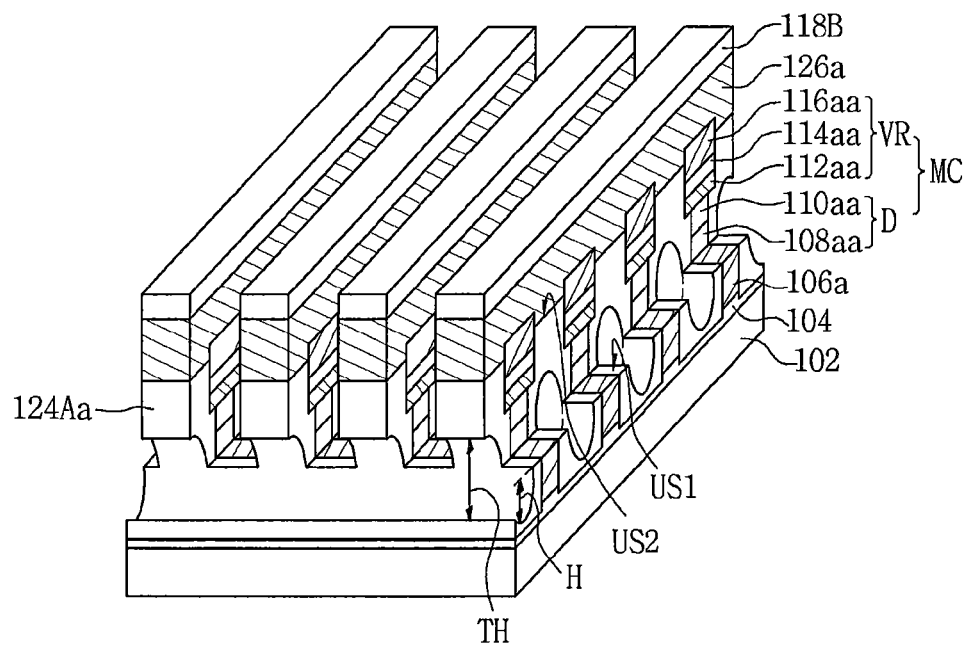

Referring to FIG. 18B, the first dielectric layer 124Aa may include a first surface US1 located at the same level as the upper surface of the bit line 106a with which the memory cells MC do not come in contact, and a second surface US2 located at a higher level than the first surface US1. The second surface US2 may contact the bottom surface of the word line 126a. A groove H may be formed on the first surface US1 of the first dielectric layer 124Aa. A through hole TH may be formed in the first dielectric layer 124Aa having the second surface US2 and configured to fill spaces between the memory cells MC and between the bit lines 106a thereunder.

The word lines 126a and the memory cells MC may be patterned using an etching process in which the second mask pattern 118B is used as an etch mask.

Figure 19A:
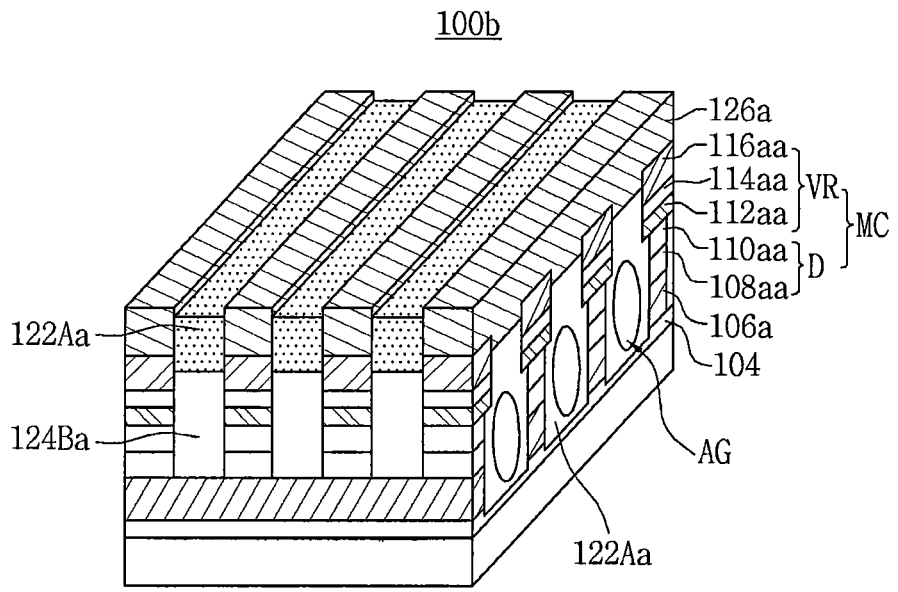
Figure 19B:
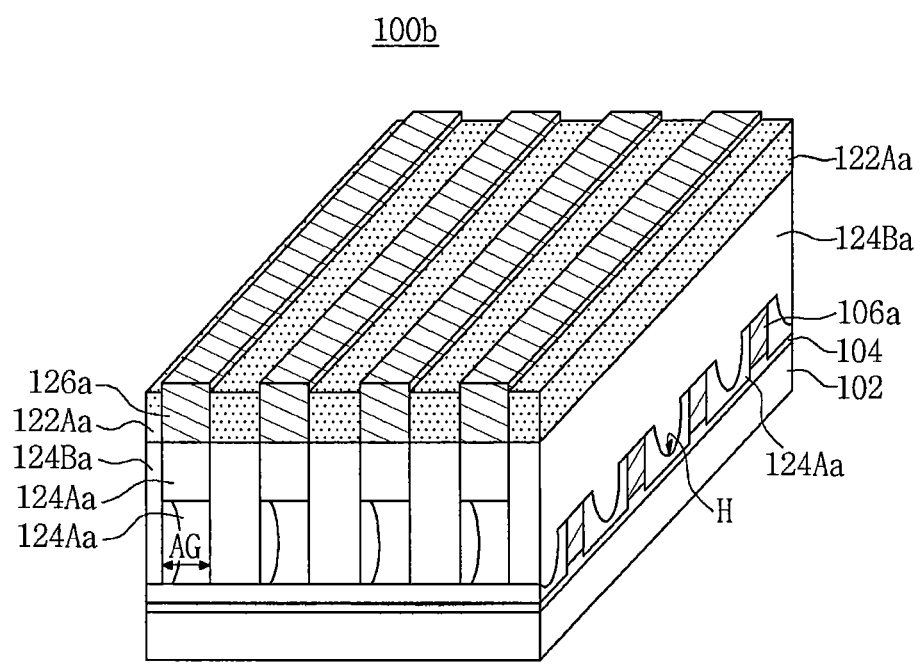

Referring to FIGS. 19A, 19B, and 18B, the method of fabricating the memory device 100b in accordance with some embodiments of the inventive concept may include forming a second dielectric layer 124Ba and a first low permittivity layer 122Aa, and removing the second mask pattern 118B.

The second dielectric layer 124Ba may fill spaces between the memory cells MC formed on the upper surfaces of the bit lines 106a. At this time, the above-described groove H may also be filled with a dielectric material configured to form the second dielectric layer 124Ba. The second dielectric layer 124Ba may contact a side of the first dielectric layer 124Aa between the memory cells MC formed on the bottom surfaces of the word lines 126a, and the first surface US1 in parallel to the upper surface of the bit line 106a. Therefore, the through hole TH between the bit lines 106a may be an air gap AG that is an enclosed space by the second dielectric layer 124Ba.

The first low permittivity layer 122Aa may fill spaces between the word lines 126a. A bottom surface of the first low permittivity layer 122Aa may contact an upper surface of the second dielectric layer 124Ba.

As shown in FIGS. 3A to 3D, a protection layer 130 may be formed on upper surfaces of the word lines 126a and the first low permittivity layer 122Aa.

Hereinafter, processing steps in the fabrication of memory devices in accordance with some embodiments of the inventive concept will be discussed with reference to the drawings for processes.

Figure 20A:
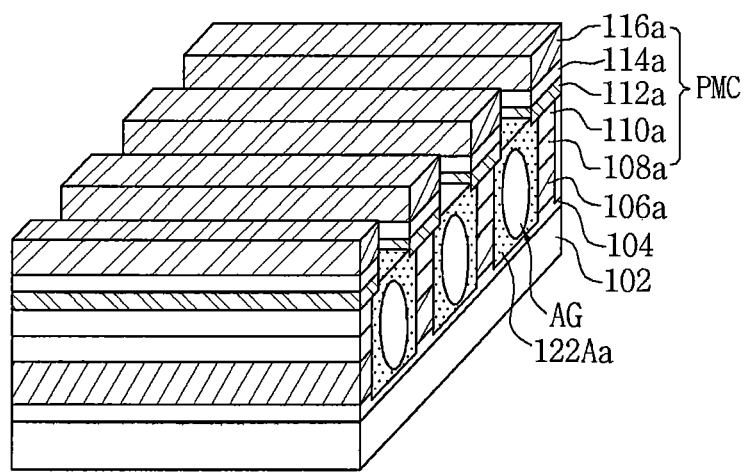
FIGS. 20A to 23B are perspective illustrating processing steps in the fabrication of a memory device in accordance with some embodiments of the inventive concept.
Figure 20B:
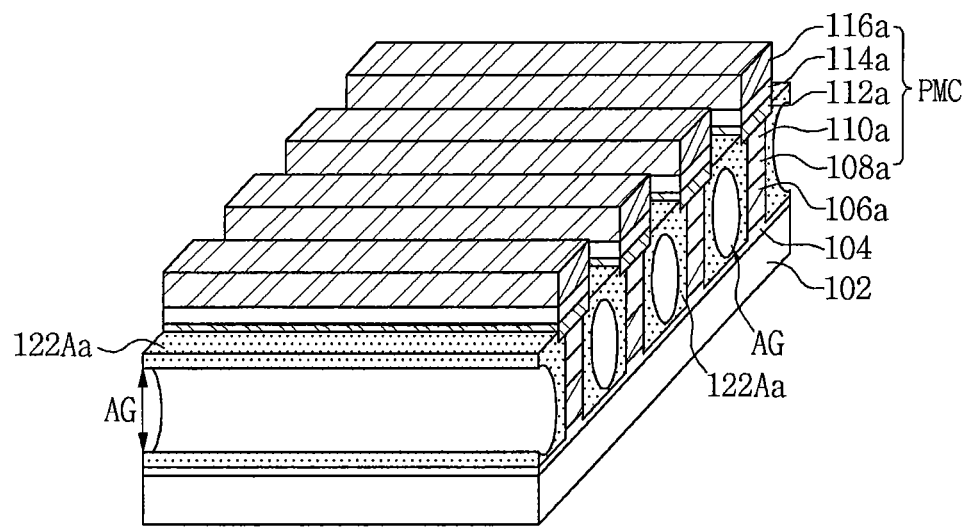

FIGS. 20A to 23B are perspective views illustrating processing steps in the fabrication of memory devices in accordance with some embodiments of the inventive concept. Referring to FIGS. 20A and 20B, a method of fabricating a memory device 100c in accordance with some embodiments of the inventive concept may include forming bit lines 106a, preliminary memory cells PMC, an air gap AG, and a first low permittivity layer 122Aa. The air gap AG may be formed inside the first low permittivity layer 122Aa.

The preliminary memory cells PMC may include a preliminary first impurity pattern 108a, a preliminary second impurity pattern 110a, a preliminary first electrode 112a, a preliminary variable resistor 114a, and a preliminary second electrode 116a, which are sequentially stacked on upper surfaces of the bit lines 106a. Opposite sides of the preliminary first electrode 112a, the preliminary variable resistor 114a, and the preliminary second electrode 116a may be formed to protrude from opposite sides of the preliminary first impurity pattern 108a, the preliminary second impurity pattern 110a, and the bit lines 106a. Referring to FIG. 4B, the air gap AG may be present in a second space WS between the preliminary memory cells PMC. An upper surface of the first low permittivity layer 122Aa configured to surround the air gap AG may be located at a lower level than an upper surface of the preliminary first electrode 112a.

Figure 21A:
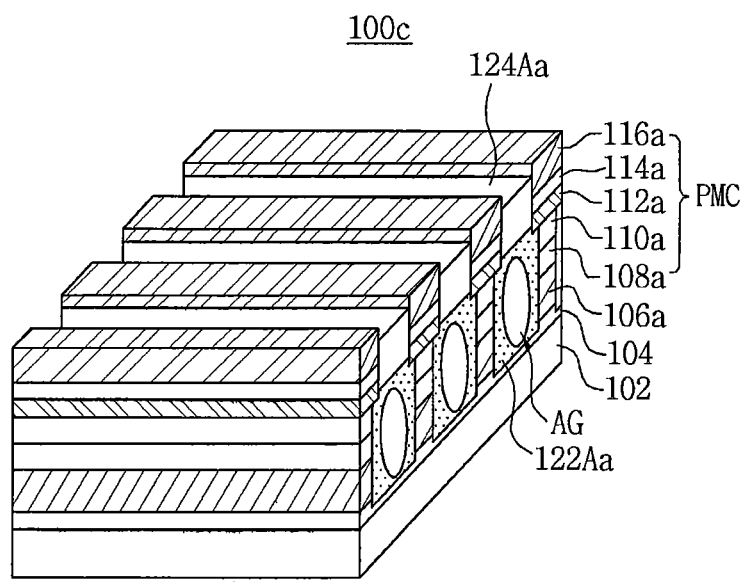
Figure 21B:
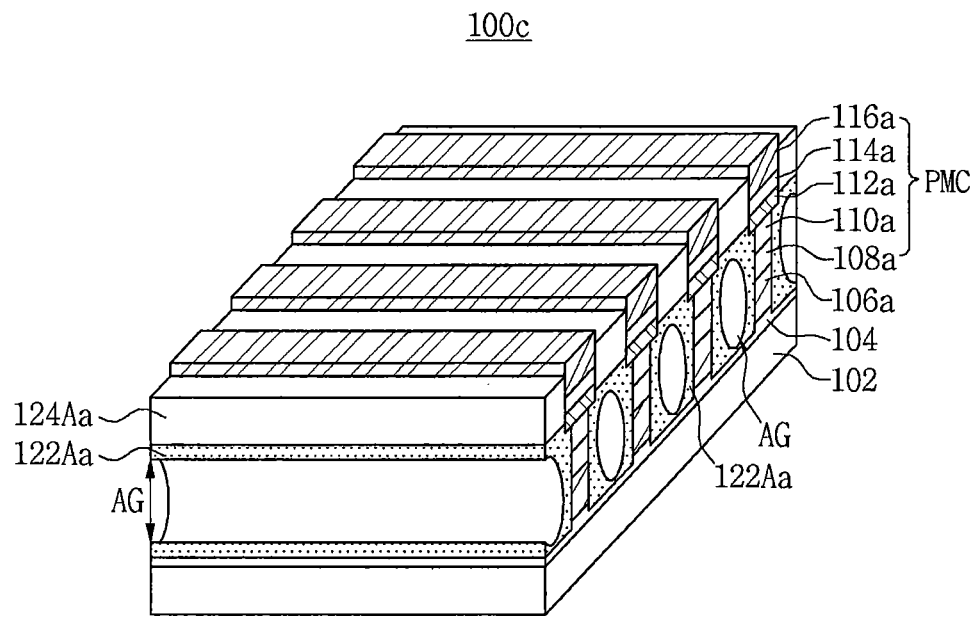

Referring to FIGS. 21A and 21B, the method of fabricating the memory device 100c in accordance with some embodiments of the inventive concept may include forming a first dielectric layer 124Aa. The first dielectric layer 124Aa may be stacked on an upper surface of the first low permittivity layer 122Aa. The first dielectric layer 124Aa may contact the opposite sides of the preliminary first electrode 112a, the preliminary variable resistor 114a, and the preliminary second electrode 116a.

Figure 22A:
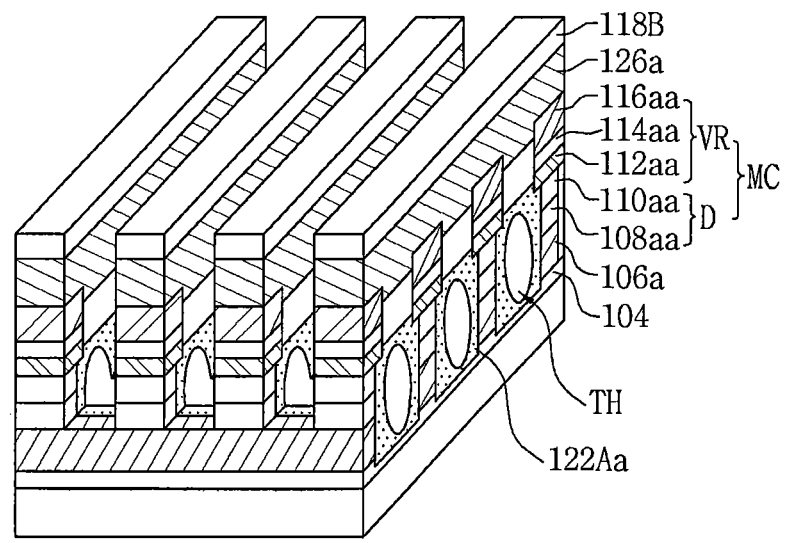
Figure 22B:
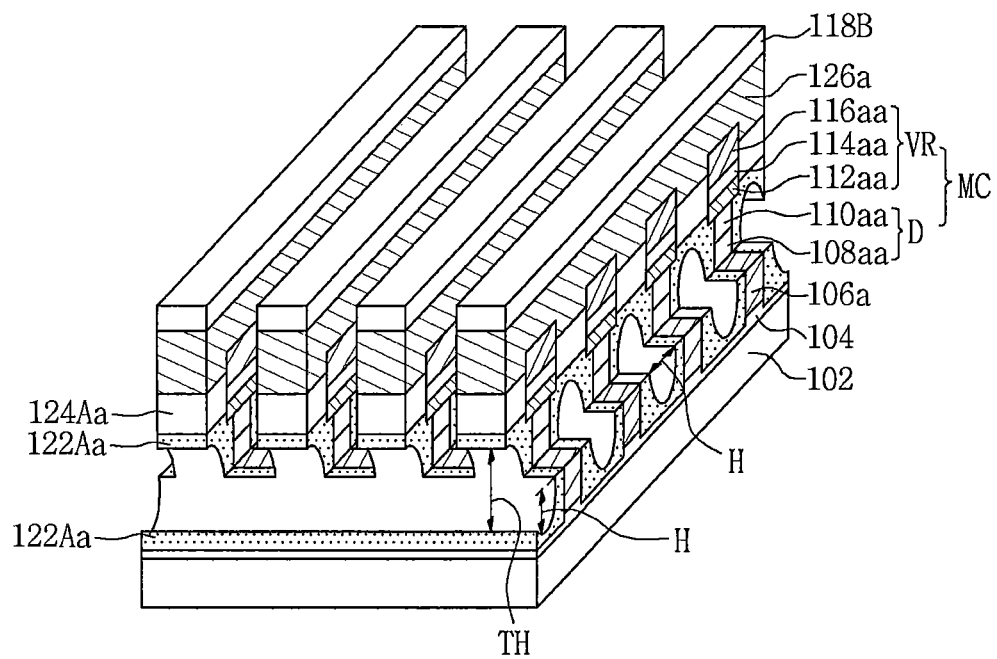

Referring to FIGS. 22A and 22B, the method of fabricating the memory device 100c in accordance with some embodiments of the inventive concept may include forming word lines 126a and memory cells MC.

The word lines 126a may cross the bit lines 106a. The memory cells MC may be formed at intersections of the word lines 126a and the bit lines 106a. Each memory cell MC may include a diode D and a variable resistance device VR. The diode D may include a first impurity pattern 108aa and a second impurity pattern 110aa. The variable resistance device VR may include a first electrode 112aa, a variable resistor 114aa, and a second electrode 116aa.

The first low permittivity layer 122Aa and the first dielectric layer 124Aa located between the word lines 126a may be removed. The first dielectric layer 124Aa may be present only between the memory cells MC configured to contact bottom surfaces of the word lines 126a. The first low permittivity layer 122Aa may be present between the diodes D of the memory cells MC configured to contact the bottom surface of the word line 126a and between the bit lines 106a. As discussed with reference to FIG. 4D, the first low permittivity layer 122Aa may include through holes TH and grooves H.

The word lines 126a and the memory cells MC may be patterned using an etching process in which a second mask pattern 118B is used as an etch mask.

Figure 23A:
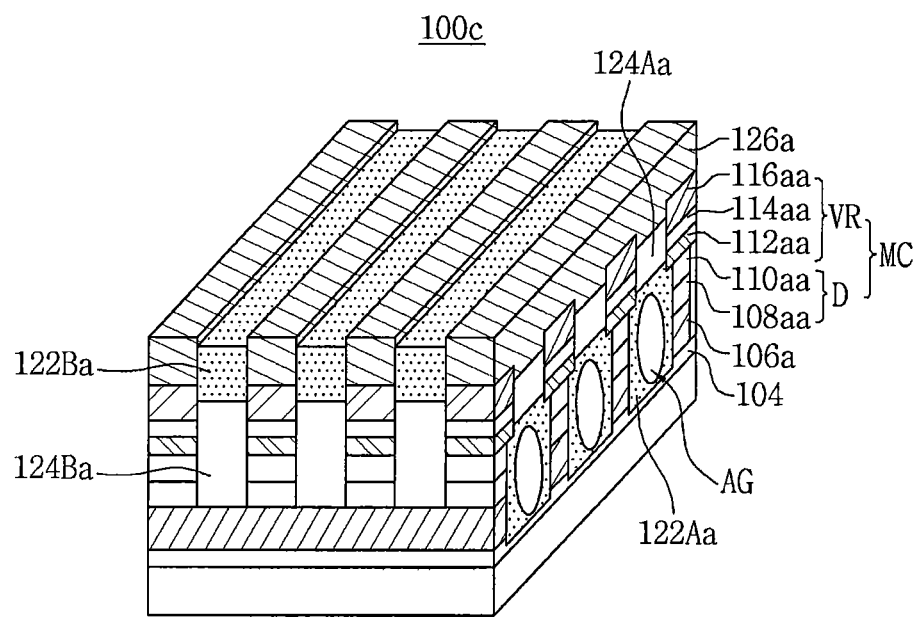
Figure 23B:
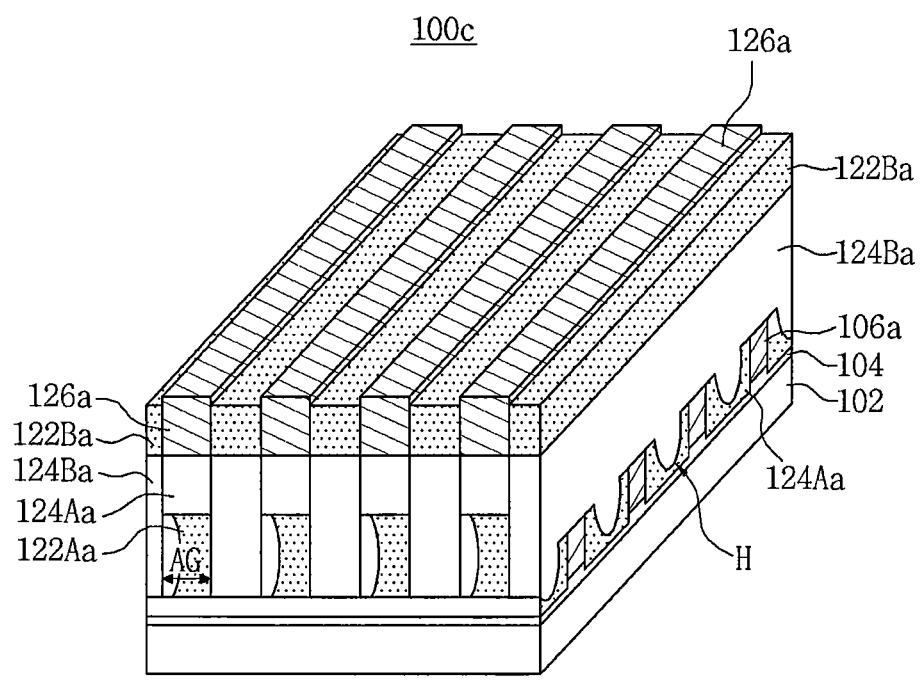

Referring to FIGS. 23A, 23B, and 22B, the method of fabricating the memory device 100c in accordance with some embodiments of the inventive concept may include forming a second dielectric layer 124Ba and a second low permittivity layer 122Ba, and removing the second mask pattern 118B.

The second dielectric layer 124Ba may be formed between the memory cells MC configured to contact the upper surfaces of the bit lines 106a. The above-described groove H may be filled with a dielectric material configured to form the second dielectric layer 124Ba. The second dielectric layer 124Ba may contact a side of the first low permittivity layer 122Aa formed between the memory cells MC, and an upper surface of the first low permittivity layer 122Aa in parallel to the upper surface of the bit line 106a. Therefore, the through hole TH between the bit lines 106a may also be an air gap AG having air due to the second dielectric layer 124Ba. The second low permittivity layer 122Ba may fill spaces between the word lines 126a. A bottom surface of the first low permittivity layer 122Aa may contact an upper surface of the second dielectric layer 124Ba.

As shown in FIGS. 4A to 4D, a protection layer 130 may be formed on surfaces of the word lines 126a and the second low permittivity layer 122Ba.

FIGS. 24A to 28B are perspective views illustrating processing steps in the fabrication of memory devices in accordance with some embodiments of the inventive concept.

Figure 24A:
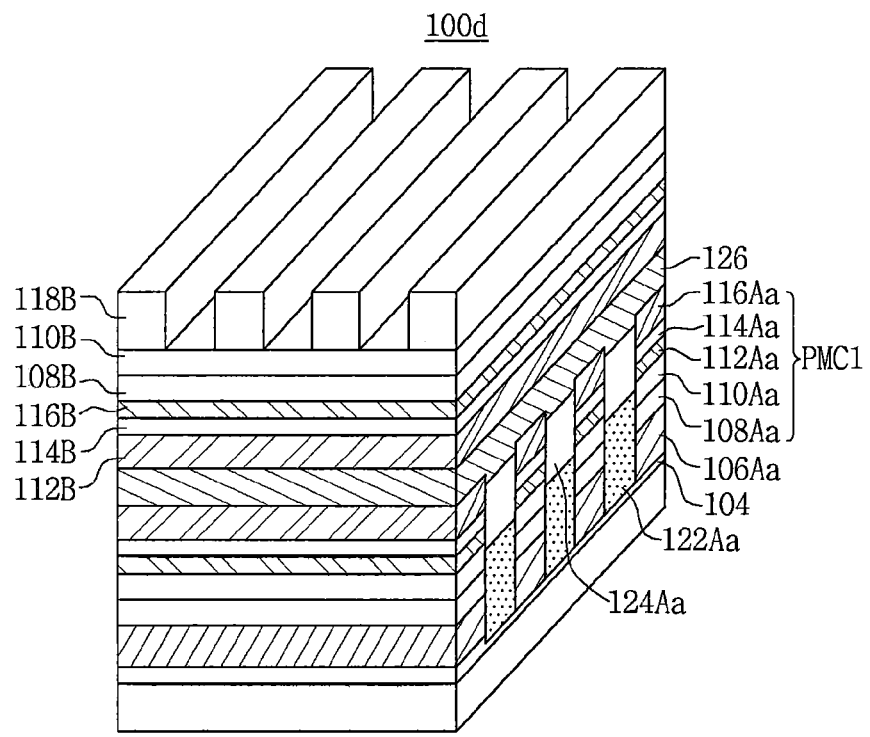
FIGS. 24A to 28B are perspective views illustrating processing steps in the fabrication of a memory device in accordance with some embodiments of the inventive concept.
Figure 24B:
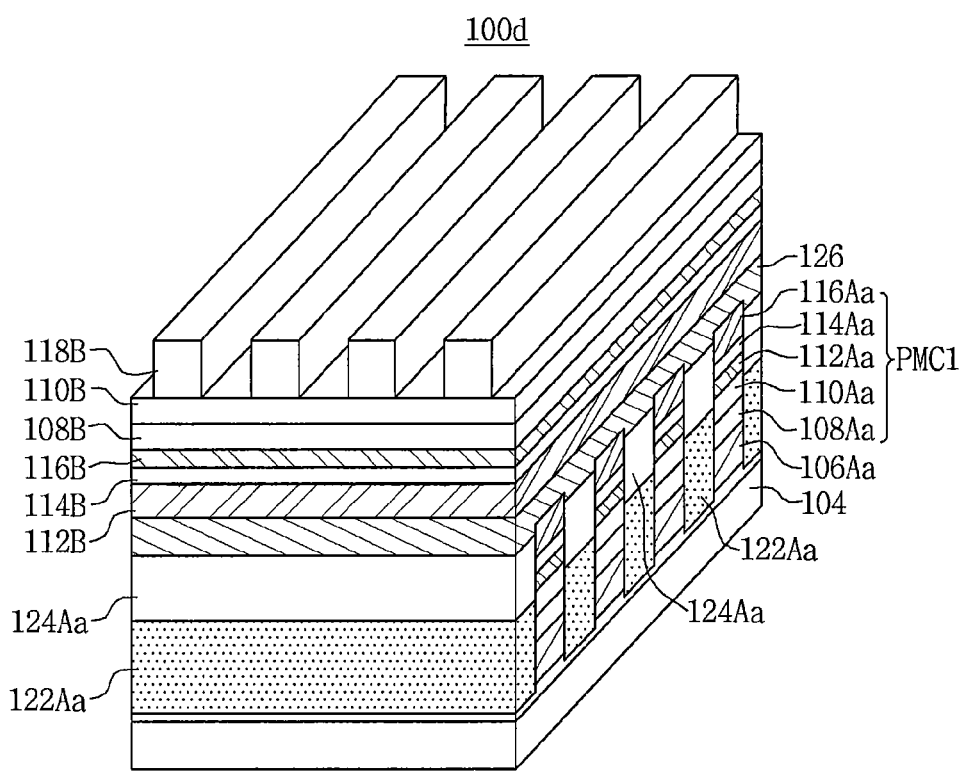

Referring to FIGS. 24A and 24B, a method of fabricating a memory device 100d in accordance with some embodiments of the inventive concept may include forming first bit lines 106Aa, preliminary first memory cells PMC1, a first low permittivity layer 122Aa, and a first dielectric layer 124Aa on a substrate 102. The method may include forming a conductive layer 126, an upper first electrode 112B, a second oxide layer 114B, an upper second electrode 116B, an upper first impurity pattern 108B, an upper second impurity pattern 110B, and second mask patterns 118B on upper surfaces of the first dielectric layer 124Aa and the preliminary first memory cells PMC1.

The first bit lines 106Aa and the preliminary first memory cells PMC1 may overlap in a top view. The preliminary first memory cells PMC1 may include a preliminary lower first electrode 112Aa, a preliminary lower variable resistor 114Aa, a preliminary lower second electrode 116Aa, a preliminary lower first impurity pattern 108Aa, and a preliminary lower second impurity pattern 110Aa. The first low permittivity layer 122Aa and the first dielectric layer 124Aa may be sequentially stacked between the preliminary first memory cells PMC1. An upper surface of the first low permittivity layer 122Aa may be located at a lower level than a bottom surface of the preliminary lower first electrode 112Aa.

Referring to FIG. 8D, the first mask pattern 118A is already used as an etching mask to form the preliminary first memory cells PMC1. The second mask pattern 118B may cross in a direction perpendicular to the first bit lines 106Aa and the preliminary first memory cells PMC1. The second mask patterns 118B may be spaced apart from each other in a longitudinal direction of the first bit lines 106Aa.

Figure 25A:
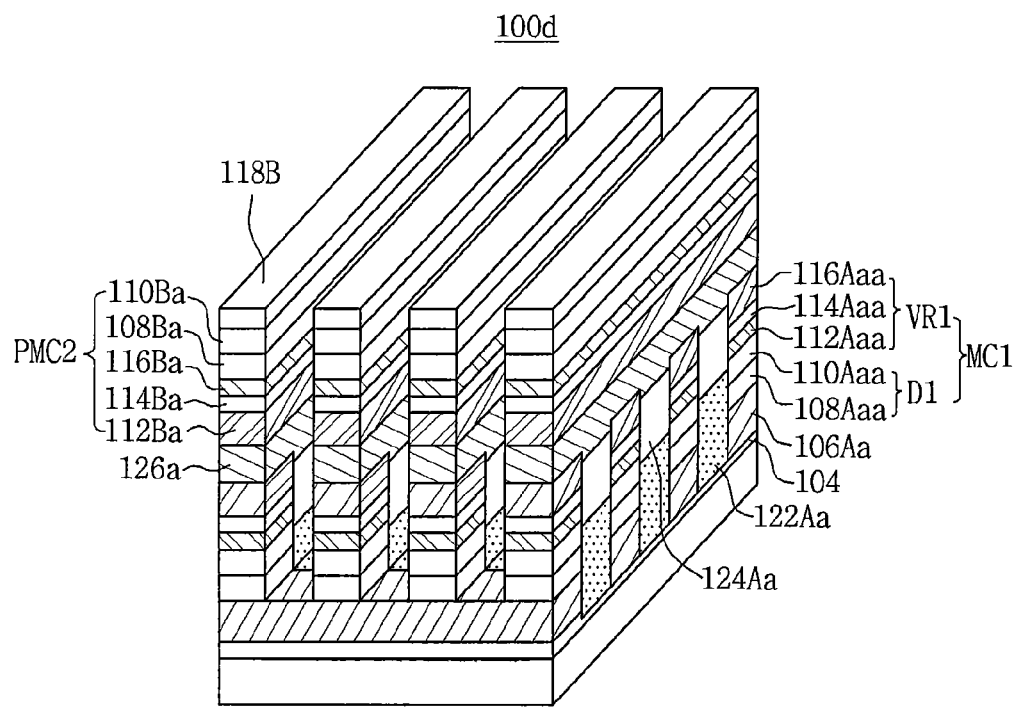
Figure 25B:
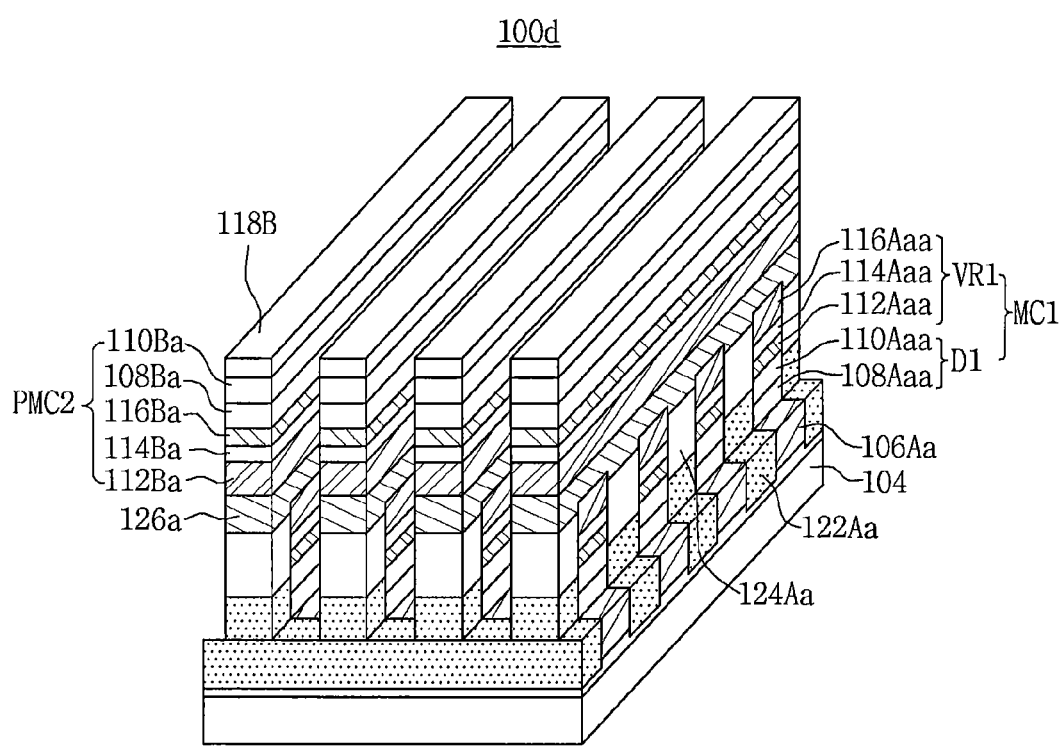

Referring to FIGS. 25A and 25B, the method of fabricating the memory device 100d in accordance with some embodiments of the inventive concept may include forming word lines 126a, first memory cells MC1 and preliminary second memory cells PMC2.

The word lines 126a and the preliminary second memory cells PMC2 may overlap in a top view. The word lines 126a and the preliminary second memory cells PMC2 may vertically cross the first bit lines 106Aa. The first memory cells MC1 may be formed at intersections of the word lines 126a and the first bit lines 106Aa.

Each first memory cell MC1 may include a first diode D1 and a first variable resistance device VR1. The first diode D1 may include a lower first impurity pattern 108Aaa, and a lower second impurity pattern 110Aaa. A first variable resistance device VR1 may include a lower first electrode 112Aaa, a lower variable resistor 114Aaa, and a lower second electrode 116Aaa. The preliminary second memory cells PMC2 may include a preliminary upper first electrode 112Ba, a preliminary upper variable resistor 114Ba, a preliminary upper second electrode 116Ba, a preliminary upper first impurity pattern 108Ba, and a preliminary upper second impurity pattern 110Ba, which are sequentially stacked on an upper surface of the word line 126a.

Figure 26A:
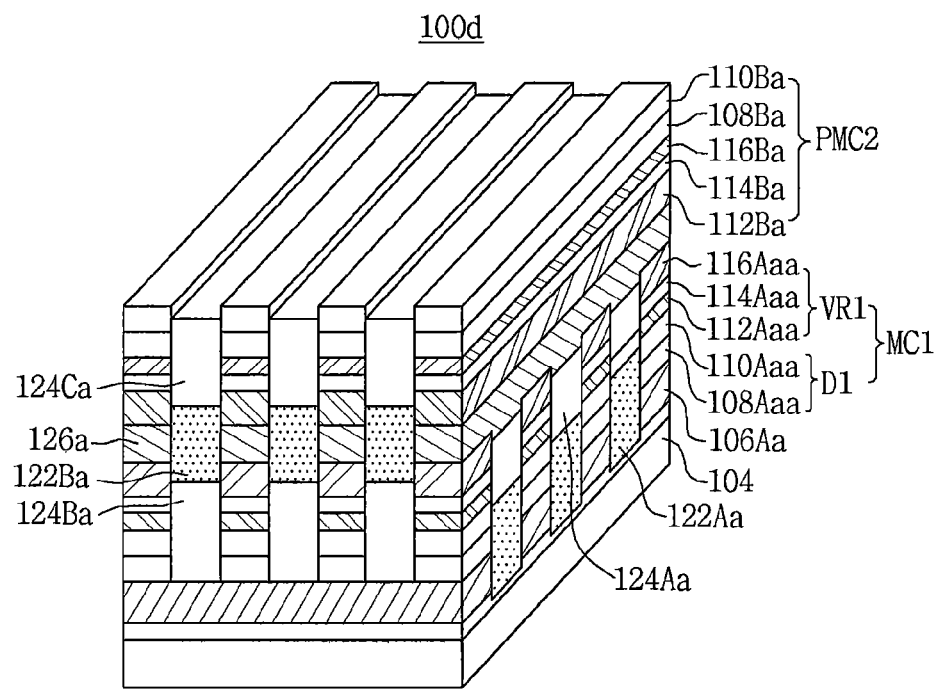
Figure 26B:
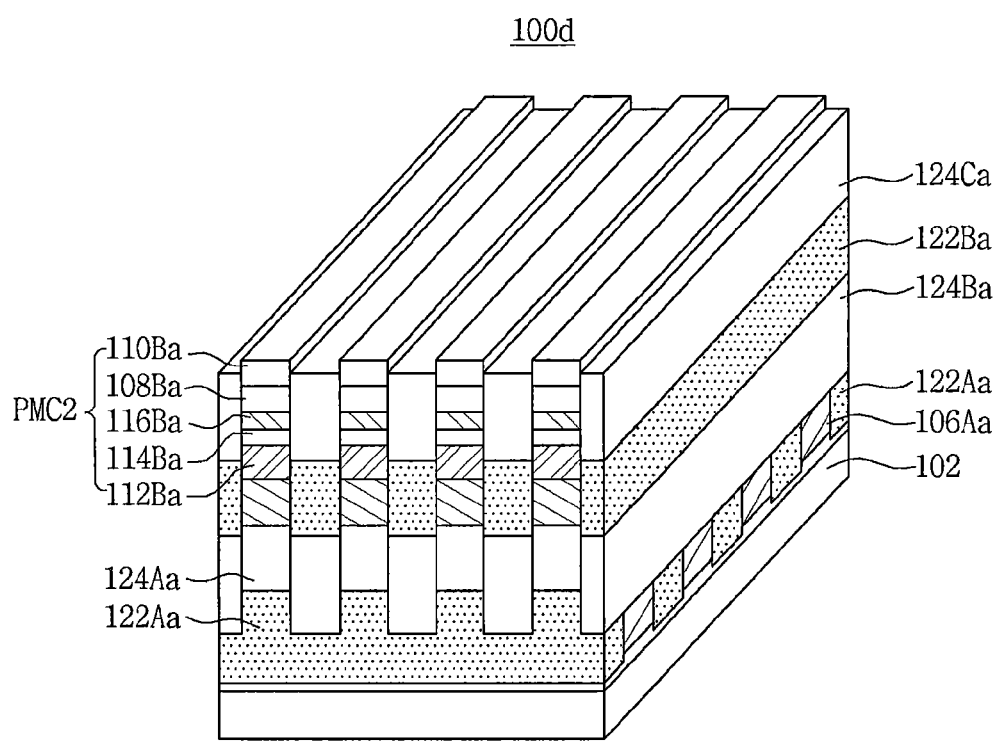

Referring to FIGS. 26A, 26B, and 4D, the method of fabricating the memory device 100d in accordance with some embodiments of the inventive concept may include forming a second dielectric layer 124Ba, a second low permittivity layer 122Ba, and a third dielectric layer 124Ca, and removing the second mask pattern 118B.

The second dielectric layer 124Ba, the second low permittivity layer 122Ba, and the third dielectric layer 124Ca may be sequentially stacked. The second dielectric layer 124Ba may be formed between the first memory cells MC1 formed on upper surfaces of the first bit lines 106Aa. The second dielectric layer 124Ba may contact sides of the first low permittivity layer 122Aa and the first dielectric layer 124Aa located between the first memory cells MC1 configured to contact bottom surfaces of the word lines 126a. An upper surface of the second dielectric layer 124Ba may be located at the same level as bottom surfaces of the word lines 126a, or at a lower level than the bottom surfaces of the word lines 126a. The second low permittivity layer 122Ba may be formed between the word lines 126a. Referring to FIG. 26B a bottom surface of the second low permittivity layer 122Ba may be located at a lower level than an upper surface of the lower second electrode 116Aaa, and an upper surface thereof may be located at a lower level than an upper surface of the preliminary upper first electrode 112Ba. The third dielectric layer 124Ca may be formed between the preliminary upper first electrodes 112Ba, between the preliminary upper variable resistors 114ba, and between the preliminary upper second electrodes 116Ba.

Figure 27A:
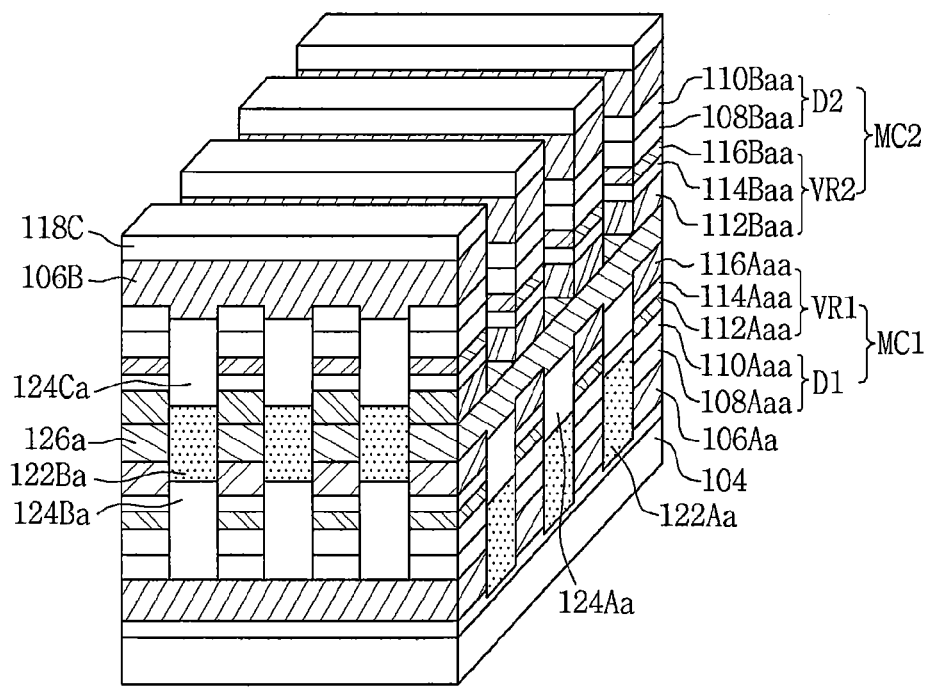
Figure 27B:
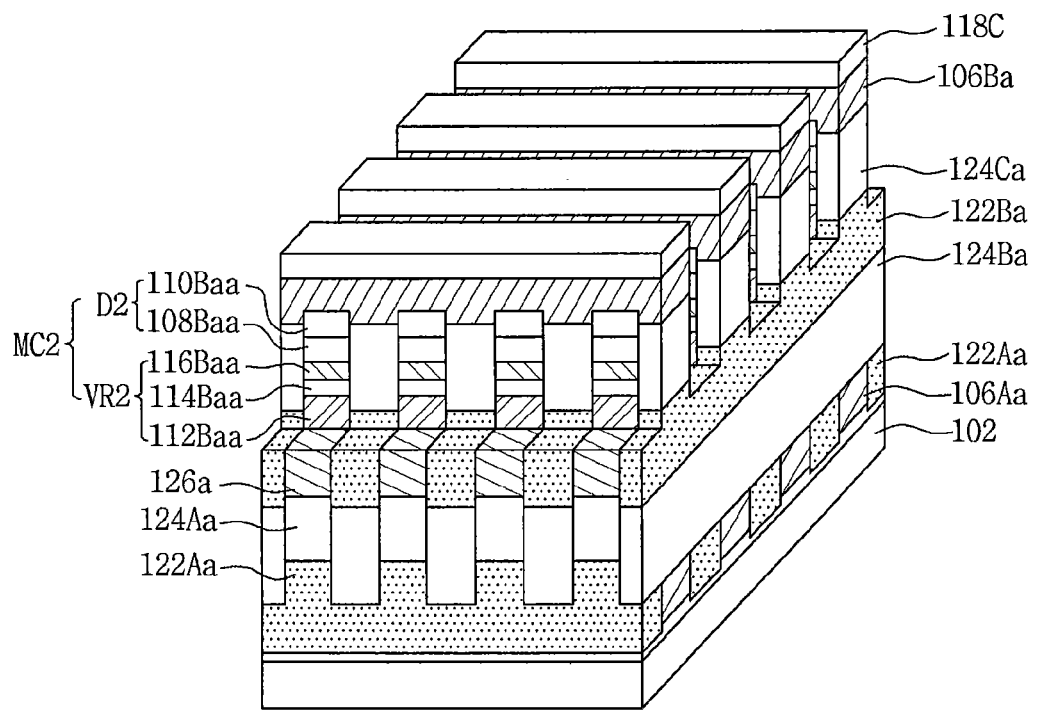

Referring to FIGS. 27A and 27B, the method of fabricating the memory device 100d in accordance with some embodiments of the inventive concept may include forming second bit lines 106Ba and second memory cells MC2.

The second bit lines 106Ba may be vertically spaced apart from the first bit lines 106Aa, and may vertically cross the word lines 126a. The second memory cells MC2 may be formed at intersections of the word lines 126a and the second bit lines 106Ba.

Each second memory cell MC2 may include a second diode D2 and a second variable resistance device VR2. The second diode D2 may include an upper first impurity pattern 108Baa and an upper second impurity pattern 110Baa. A second variable resistance device VR2 may include an upper first electrode 112Baa, an upper variable resistor 114Baa, and an upper second electrode 116Baa. Some sides of the first memory cell MC1, the second memory cell MC2, and the word lines 126a may be vertically arranged.

The lower second electrode 116Aaa of the first memory cell MC1 may be formed to be thicker than the lower first electrode 112Aaa, and the upper first electrode 112Baa of the second memory cell MC2 may be formed to be thicker than the upper second electrode 116Baa. The lower first impurity pattern 108Aaa of the first memory cell MC1 may include N-type impurities, and the lower second impurity pattern 110Aaa may include P-type impurities. In contrast, the upper first impurity pattern 108Baa of the second memory cell MC2 may include P-type impurities, and the upper second impurity pattern 110Baa may include N-type impurities.

Referring to FIG. 27, as a result of the formation of the second bit lines 106Ba and the second memory cells MC2, the second low permittivity layer 122Ba may be located between the word lines 126a and between the second memory cells MC2 formed on bottom surfaces of the second bit lines 106Ba. An upper surface of the second low permittivity layer 122Ba located between the word lines 126a with which the second memory cells MC2 do not come in contact may be located at the same level as the upper surface of the word line 126a.

The second bitlines 106Aa and the second memory cells MC2 may be patterned using an etching process in which a third mask pattern 118C is used as an etch mask.

Figure 28A:
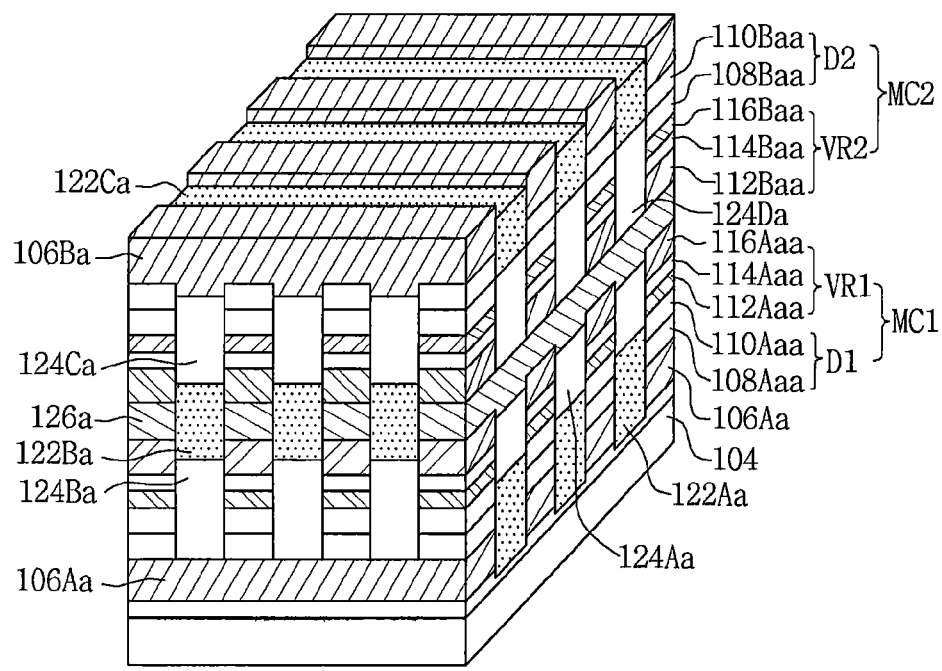
Figure 28B:
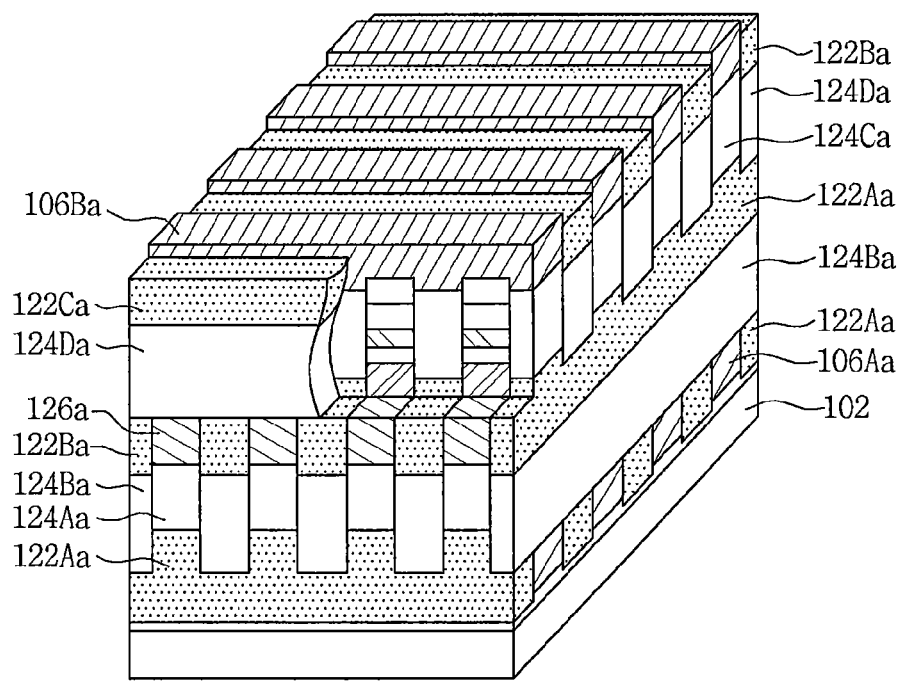

Referring to FIGS. 28A, 28B, and 17A, the method of fabricating the memory device 100d in accordance with some embodiments of the inventive concept may include forming a fourth dielectric layer 124Da and a third low permittivity layer 122Ca, and removing the third mask pattern 118C.

Referring to FIG. 28A, the fourth dielectric layer 124Da may be formed between the second memory cells MC2 formed on the upper surfaces of the word lines 126a. At the same time, the fourth dielectric layer 124Da may be formed between the third dielectric layer 124Ca configured to fill spaces between the second memory cells MC2 formed on bottom surfaces of the second bit lines 106Ba. The third low permittivity layer 122Ca may be stacked on an upper surface of the fourth dielectric layer 124Da. The third low permittivity layer 122Ca may be formed between the second bit lines 106Ba.

As shown in FIGS. 5A to 5D, a protection layer 130 may be formed on surfaces of the second bit lines 106Ba and the third low permittivity layer 122Ca.

Hereinafter, a method of fabricating a memory device in accordance with some embodiments of the inventive concept will be discussed with reference to the drawings.

FIGS. 29A to 32B are perspective views illustrating processing steps in the fabrication of memory devices in accordance with some embodiments of the inventive concept.

Figure 29A:
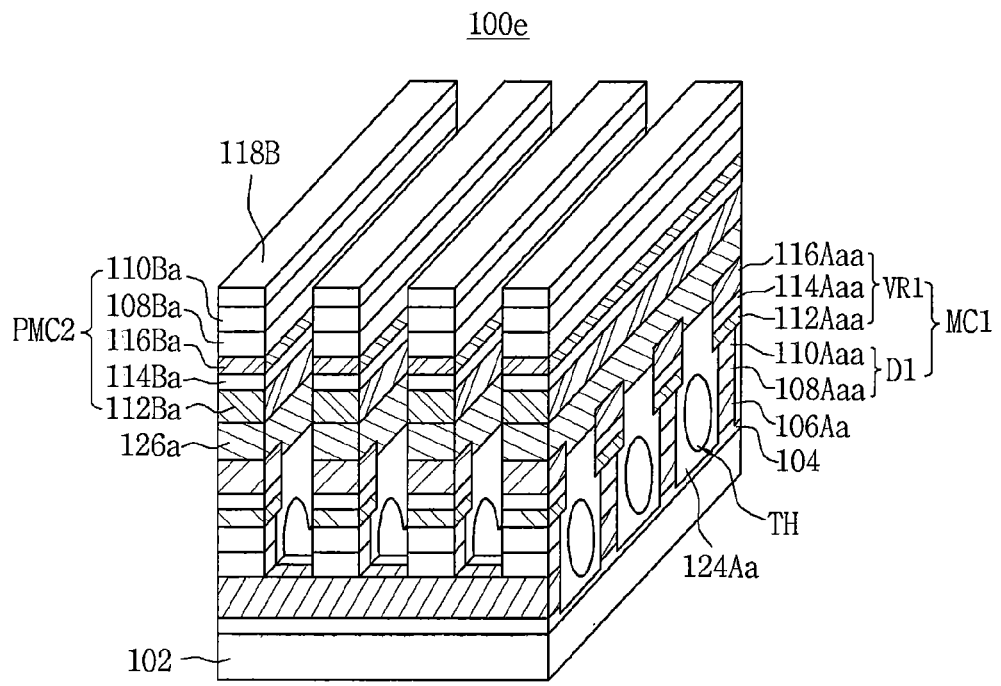
FIGS. 29A to 32B are perspective views illustrating processing steps in the fabrication of a memory device in accordance with some embodiments of the inventive concept.
Figure 29B:
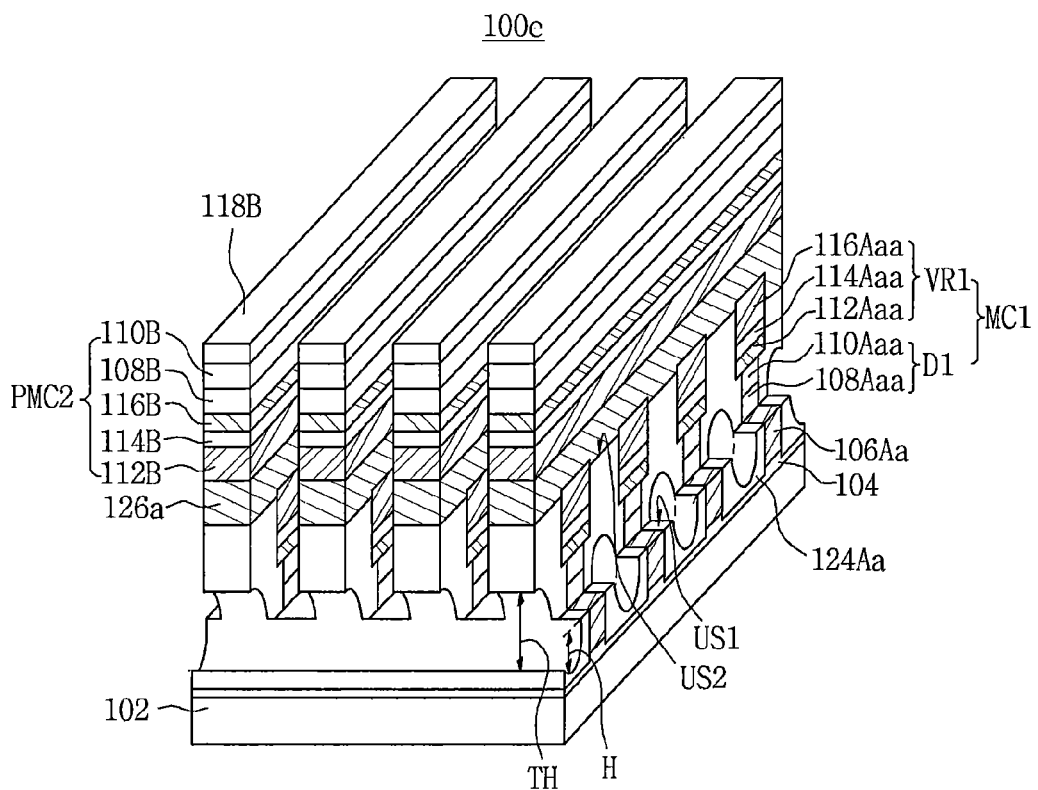

Referring to FIGS. 29A and 29B, a method of fabricating a memory device 100e in accordance with some embodiments of the inventive concept may include forming first bit lines 106Aa, first memory cells MC1, an air gap AG and a first dielectric layer 124Aa on a substrate 102. The method may include forming word lines 126a, first memory cells MC1, and preliminary second memory cells PMC2.

The formation of the first bit lines 106Aa, the air gap AG, and the first dielectric layer 124Aa may be understood with reference to FIGS. 16A to 17B. The formation of the word lines 126a, the first memory cells MC1, and the preliminary second memory cells PMC2 may be understood with reference to FIGS. 24A to 25B.

The first dielectric layer 124Aa located between the word lines 126a may be removed. The first dielectric layer 124Aa may include a first surface US1 located at the same level as a surface of the bit line 106a, and a second surface US2 located between the first memory cells MC1. A groove H may be formed in the first dielectric layer 124Aa having the first surface US1, and a through hole TH may be formed in the first dielectric layer 124Aa having the second surface US2. The word lines 126a and the preliminary second memory cells PMC2 may be patterned using an etching process in which a second mask pattern 118B is used as an etch mask.

Figure 30A:
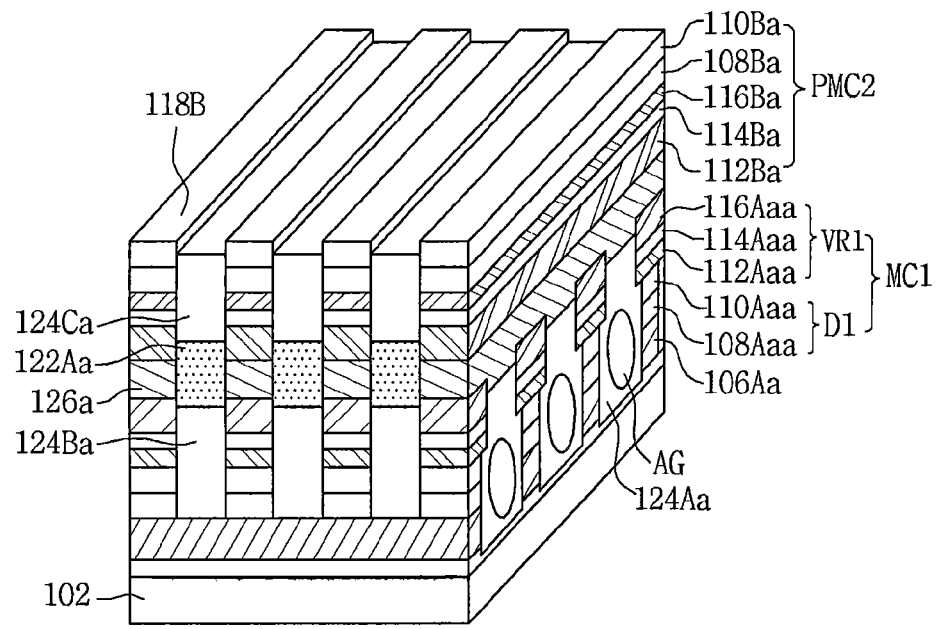
Figure 30B:
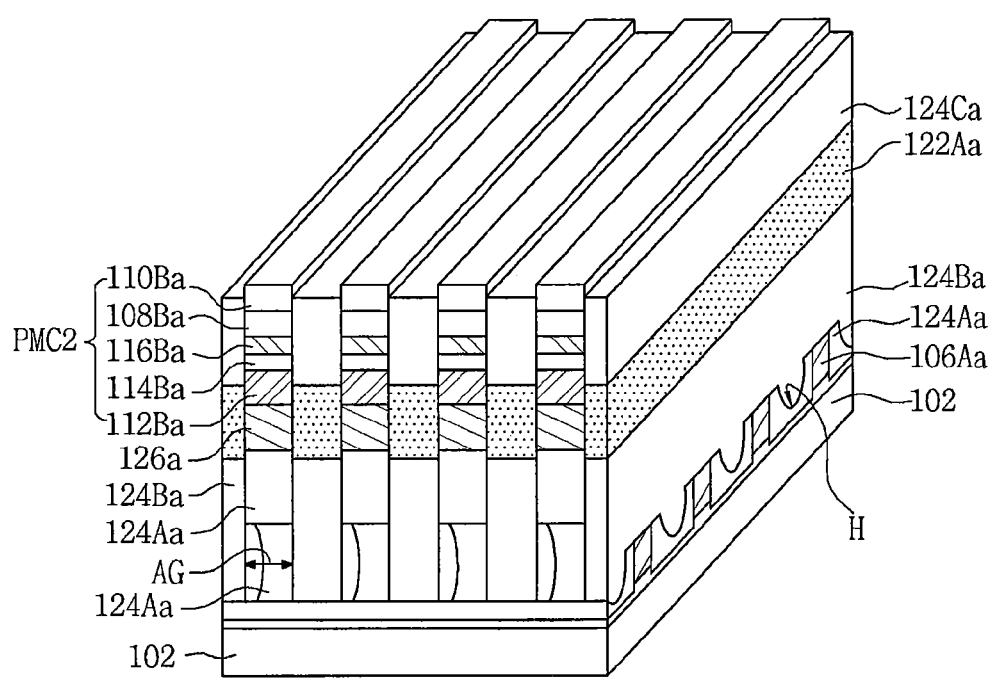

Referring to FIGS. 30A, 30B, and 29A, the method of fabricating the memory device 100e in accordance with some embodiments of the inventive concept may include forming a second dielectric layer 124Ba, a first low permittivity layer 122Aa, and a third dielectric layer 124Ca, and removing the second mask pattern 118B.

The second dielectric layer 124Ba, the first low permittivity layer 122Aa, and the third dielectric layer 124Ca may be sequentially stacked. The second dielectric layer 124Ba may fill spaces between the first memory cells MC1 formed along upper surfaces of the first bit lines 106Aa. In these embodiments, referring to FIG. 30B, the above-described groove H may also be filled with a material configured to form the second dielectric layer 124Ba. The second dielectric layer 124Ba may contact a side of the first dielectric layer 124Aa formed between the first memory cells MC1 formed along the bottom surface of the word line 126a. The second dielectric layer 124Ba may contact an upper surface of the first dielectric layer 124Aa in parallel to an upper surface of the bit line 106a. Therefore, the through hole TH between the first memory cells MC1 and between the bit lines 106a may also be an air gap AG having air due to the second dielectric layer 124Ba. An upper surface of the second dielectric layer 124Ba may be located at the same level as the bottom surfaces of the word lines 126a, or at a lower level than the bottom surfaces of the word lines 126a.

The first low permittivity layer 122Aa may be formed between the word lines 126a. A bottom surface of the first low permittivity layer 122Aa may be located at a lower level than an upper surface of the lower second electrode 116Aaa, and an upper surface thereof may be located at a lower level than an upper surface of the preliminary upper first electrode 112Ba. The third dielectric layer 124Ca may be formed between the preliminary upper first electrodes 112Ba, between the upper variable resistors 114Ba, and between the upper second electrodes 116Ba.

Figure 31A:
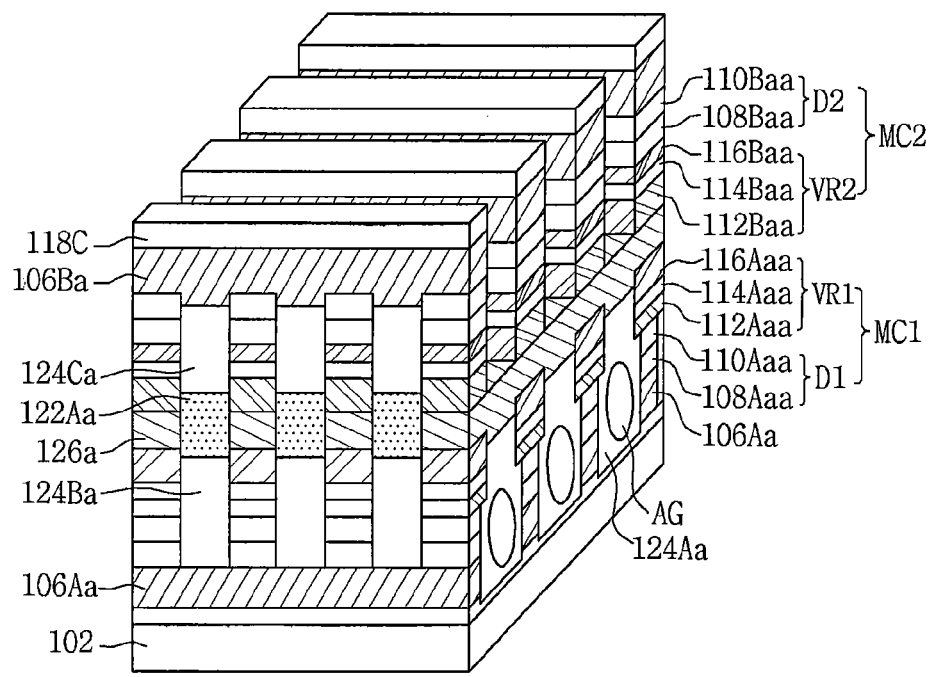
Figure 31B:
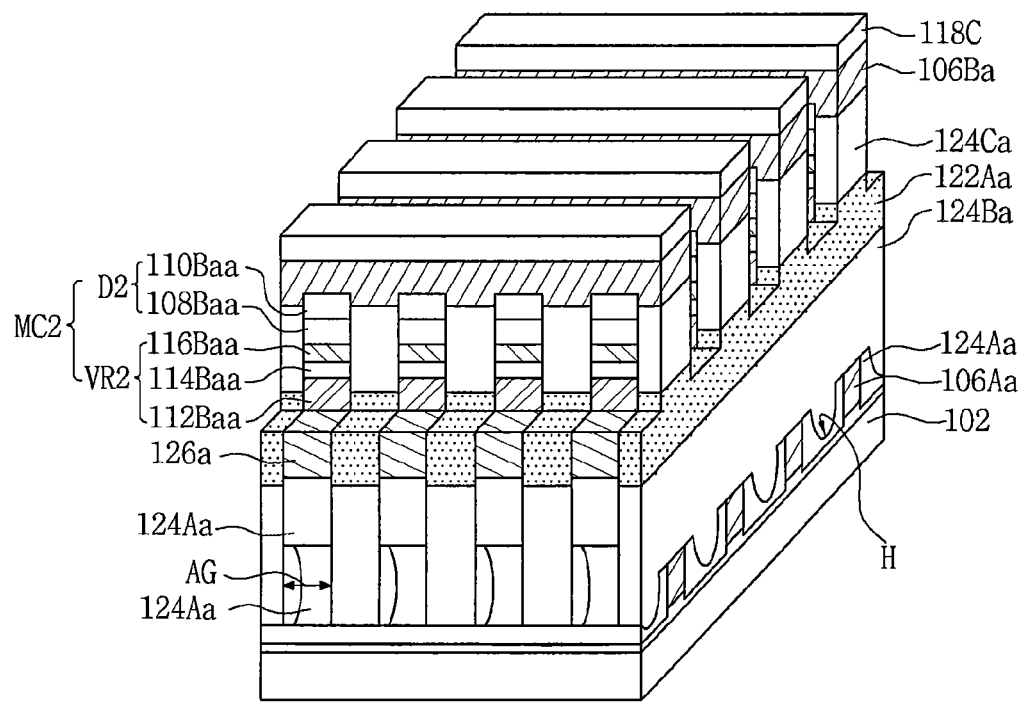

Referring to FIGS. 31A and 31B, the method of fabricating the memory device 100e in accordance with some embodiments of the inventive concept may include forming second bit lines 106Ba and second memory cells MC2.

The second bit lines 106Ba may be vertically spaced apart from the first bit lines 106Aa, and may vertically cross the word lines 126a. The second memory cells MC2 may be formed at intersections of the word lines 126a and the second bit lines 106Ba.

As a result of the formation of the second bit lines 106Ba and the second memory cells MC2, the first low permittivity layer 122Aa may be located between the word lines 126a. An upper surface of the first low permittivity layer 122Aa located between the word lines 126a with which the second memory cells MC2 do not come in contact may be located at the same level as an upper surface of the word line 126a. The second bit lines 106Ba and the second memory cells MC2 may be patterned using an etching process in which a third mask pattern 118C is used as an etch mask.

Figure 32A:
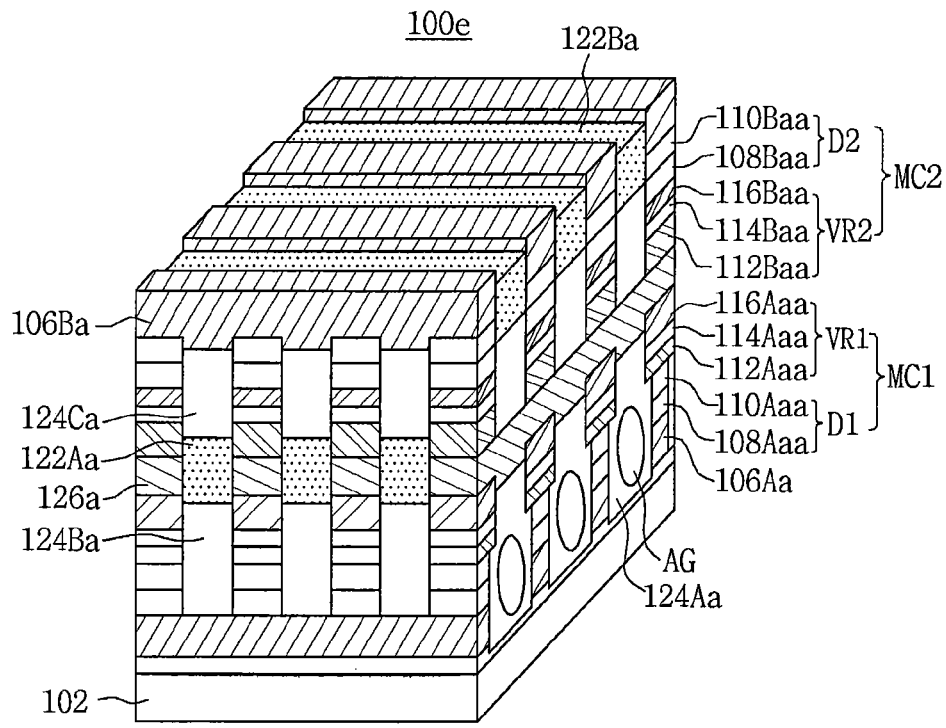
Figure 32B:
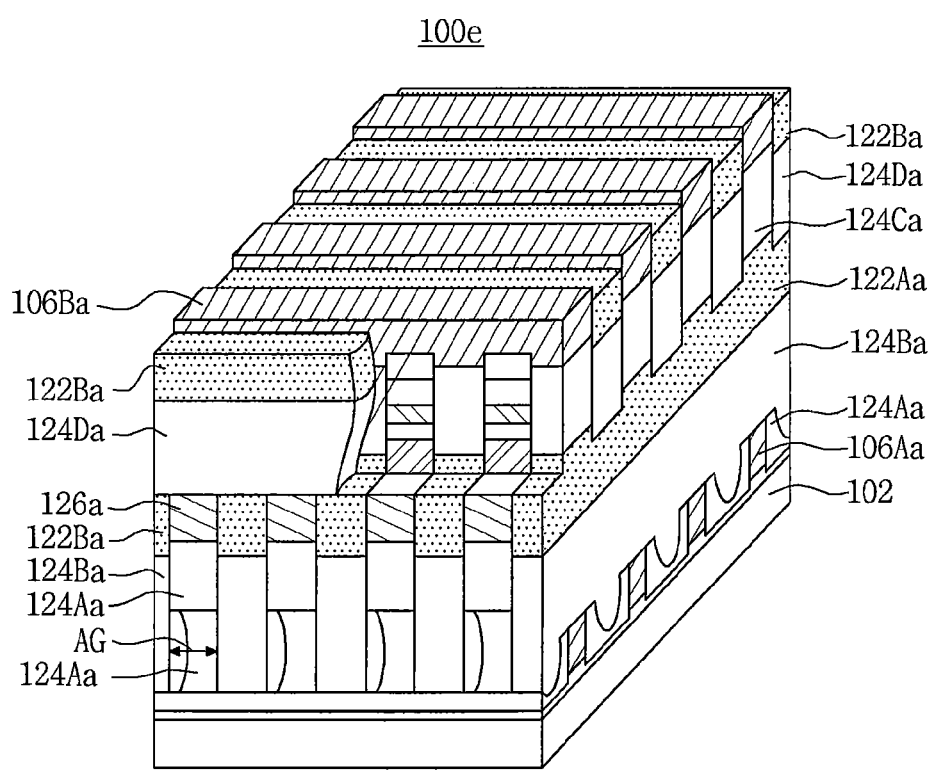

Referring to FIGS. 32A, 32B, and 31A, the method of fabricating the memory device 100e in accordance with some embodiments of the inventive concept may include forming a fourth dielectric layer 124Da and second low permittivity layer 122Ba, and removing the third mask pattern 118C.

Referring to FIG. 32A, the fourth dielectric layer 124Da may be formed between the second memory cells MC2 formed along upper surfaces of the word lines 126a, and between the third dielectric layers 124Ca configured to fill spaces between the second memory cells MC2 formed along the bottom surfaces of the second bit lines 106Ba. The second low permittivity layer 122Ba may be stacked on an upper surface of the fourth dielectric layer 124Da. The second low permittivity layer 122Ba may be formed between the second bit lines 106Ba.

As shown in FIGS. 6A to 6D, a protection layer 130 may be formed on upper surfaces of the second bit lines 106Ba and the second low permittivity layer 122Ba.

Hereinafter, a method of fabricating a memory device in accordance some embodiments of the inventive concept will be discussed with reference to the drawings.

FIGS. 33A to 36B are perspective views illustrating processing steps in the fabrication of memory devices in accordance with some embodiments of the inventive concept.

Figure 33A:
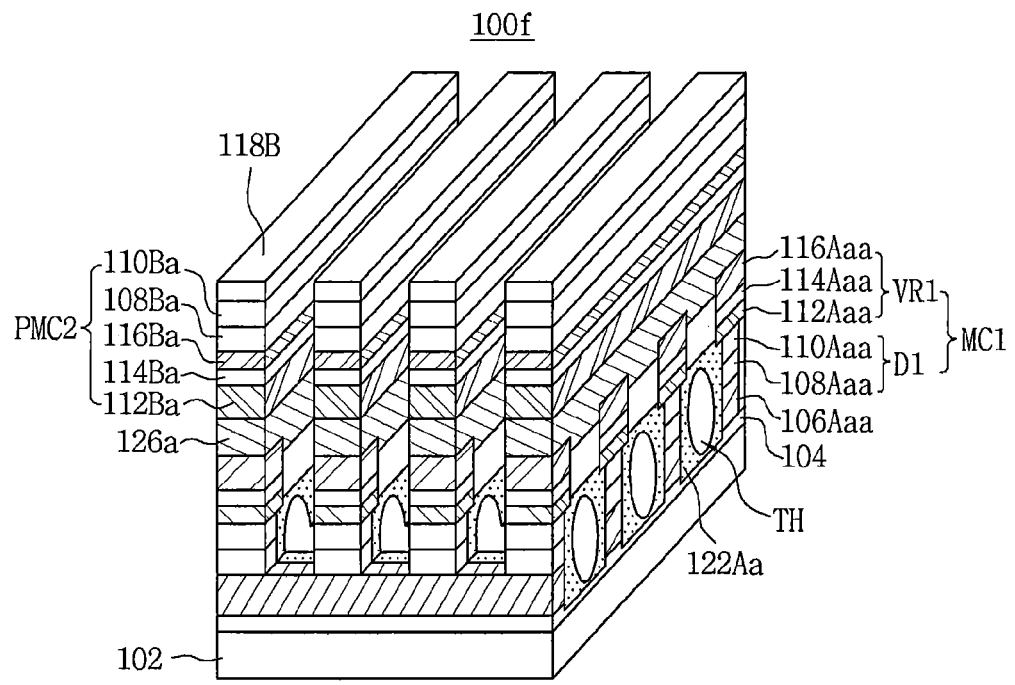
FIGS. 33A to 36B are perspective views illustrating processing steps in the fabrication a memory device in accordance with some embodiments of the inventive concept.
Figure 33B:
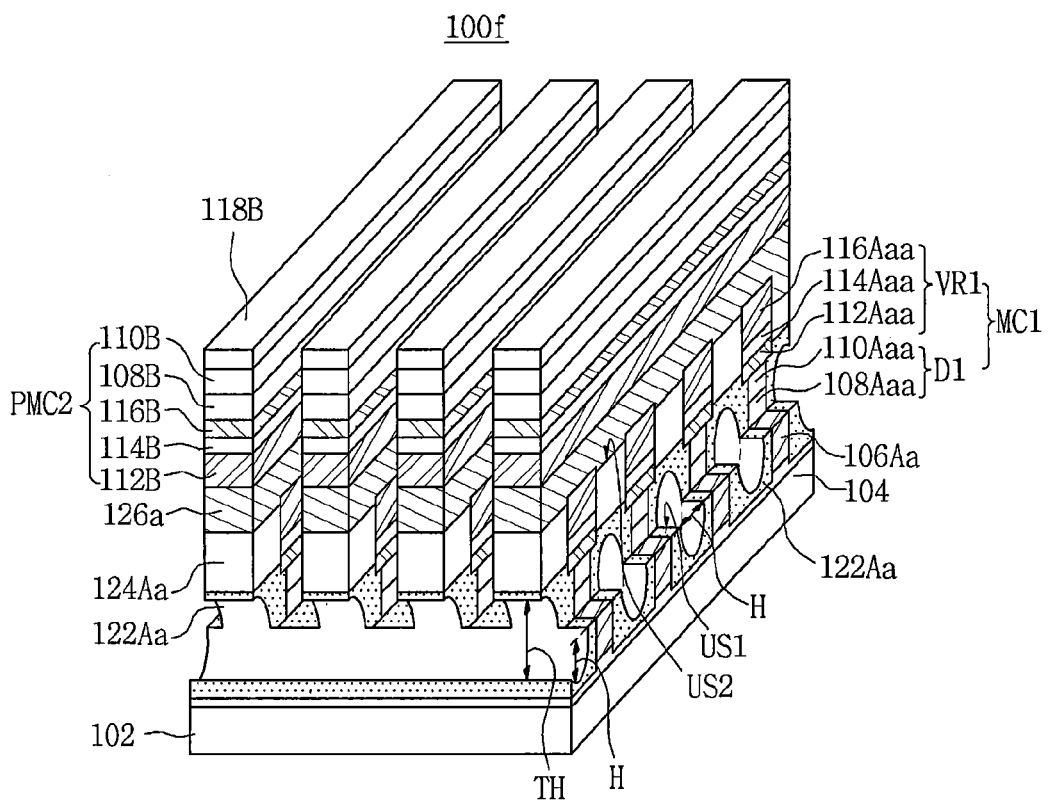

Referring to FIGS. 33A and 33B, a method of fabricating a memory device 100f in accordance with some embodiments of the inventive concept may include forming first bit lines 106Aa, preliminary first memory cells PMC1, an air gap AG a first low permittivity layer 122Aa, and a first dielectric layer 124Aa on a substrate 102. The method may include forming word lines 126a, first memory cells MC1, and preliminary second memory cells PMC2.

The formation of the first bit lines 106Aa, the air gap AG, the first low permittivity layer 122Aa, and the first dielectric layer 124Aa may be understood with reference to FIGS. 20A to 21B. The formation of the word lines 126a, the first memory cells MC1, and the preliminary second memory cells PMC2 may be understood with reference to FIGS. 24A to 25B.

The first low permittivity layer 122Aa and the first dielectric layer 124Aa located between the word lines 126a may be removed. The first low permittivity layer 122Aa may include a first surface US1 located at the same level as an upper surface of the bit line 106a, and a second surface US2 located between the memory cells MC. A groove H may be formed in the first low permittivity layer 122Aa having the first surface US1, and a through hole TH may be formed in the first low permittivity layer 122Aa having the second surface US2. The word lines 126a and the preliminary second memory cells PMC2 may be patterned using an etching process in which a second mask pattern 118B is used as an etch mask.

Figure 34A:
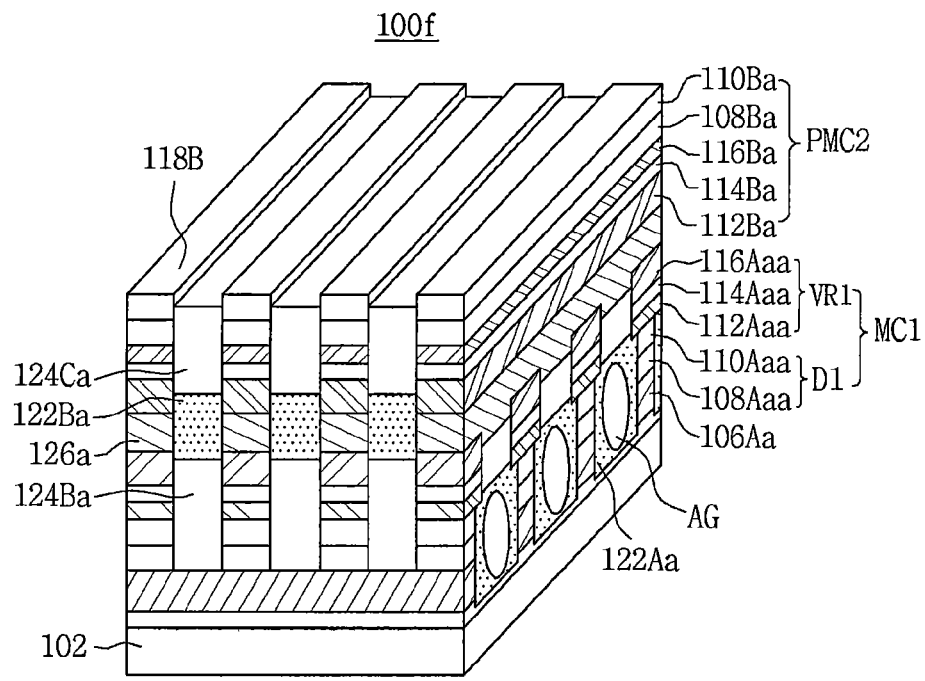
Figure 34B:
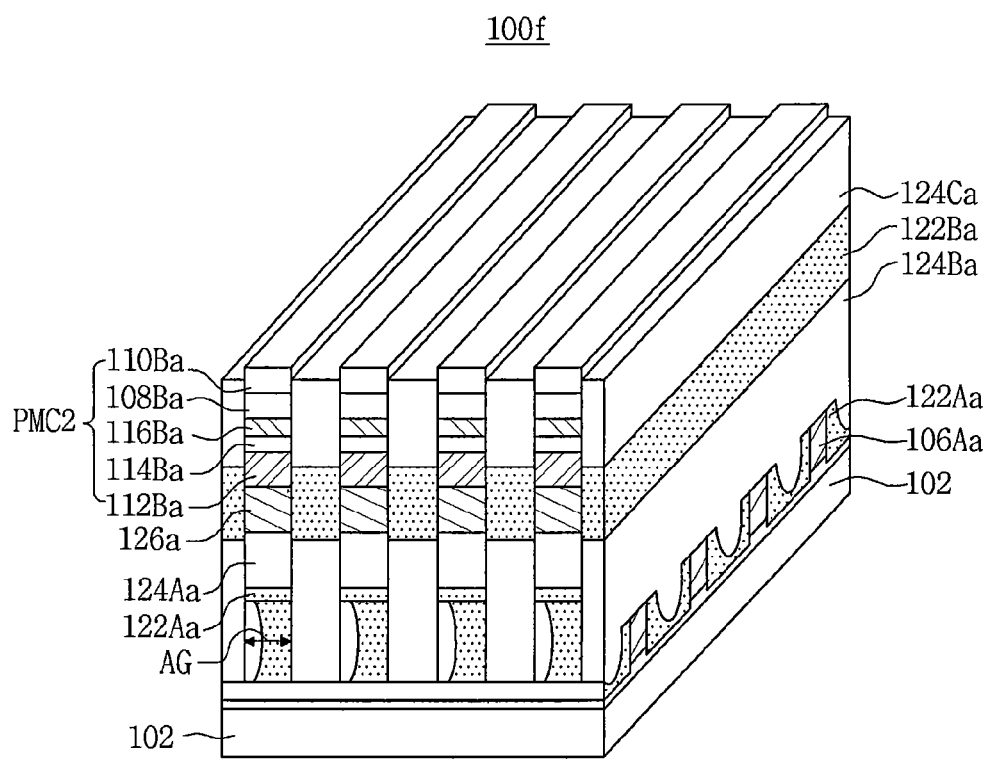

Referring to FIGS. 34A, 34B, and 33B, the method of fabricating the memory device 100f in accordance with some embodiments of the inventive concept may include forming a second dielectric layer 124Ba, a second low permittivity layer 122Ba, and a third dielectric layer 124Ca, and removing the second mask pattern 118B.

The second dielectric layer 124Ba, the second low permittivity layer 122Ba, and the third dielectric layer 124Ca may be sequentially stacked. The second dielectric layer 124Ba may fill spaces between the first memory cells MC1 formed along upper surfaces of the first bit lines 106Aa. In these embodiments, the above-described groove H may be also filled with a material configured to form the second dielectric layer 124Ba. The second dielectric layer 124Ba may contact sides of the first low permittivity layer 122Aa formed between the first memory cells MC1 formed along bottom surfaces of the word lines 126a, and contact upper surfaces of the first bit lines 106a with which the first memory cells MC1 do not come in contact and an upper surface of the low permittivity layer 122Aa in parallel to the upper surfaces of the first bit lines 106a. The through hole TH between the first bit lines 106a may also be an air gap AG having air due to the second dielectric layer 124Ba. The second low permittivity layer 122Ba may be formed between the word lines 126a. A bottom surface of the second low permittivity layer 122Ba may be located a lower level than the lower second electrode 116Aaa, and an upper surface thereof may be located at a lower level than an upper surface of the preliminary upper first electrode 112Ba.

Figure 35A:
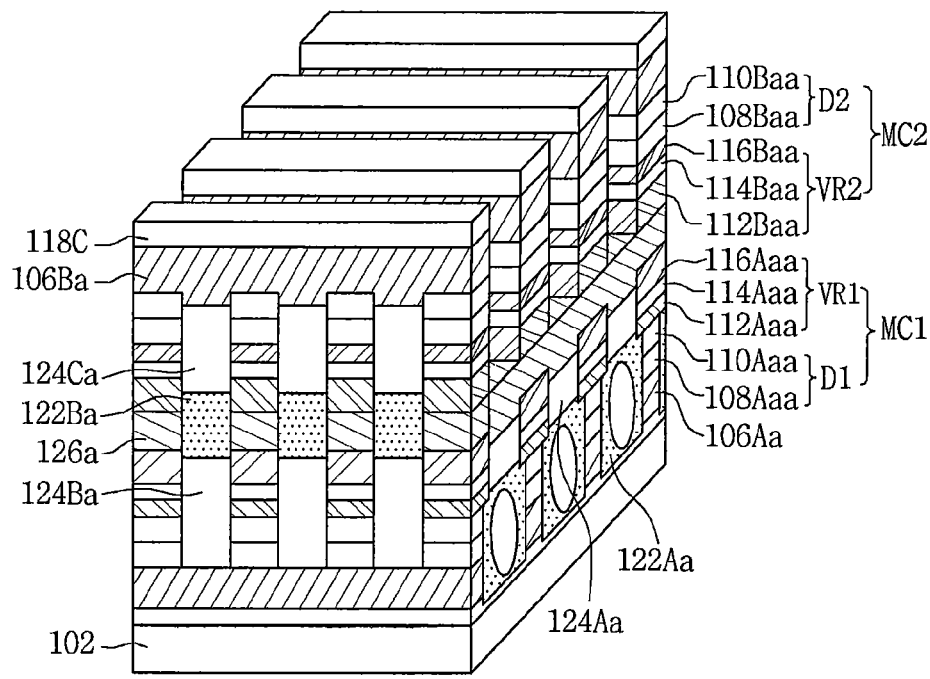
Figure 35B:
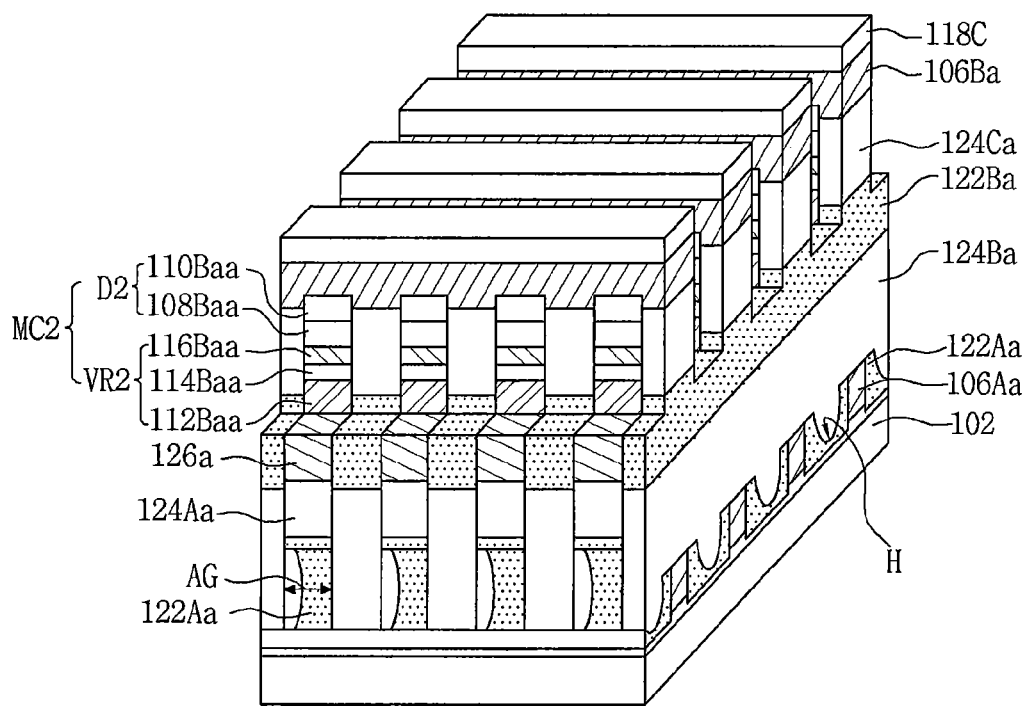

Referring to FIGS. 35A and 35B, the method of fabricating the memory device 100f in accordance with some embodiments of the inventive concept may include forming second bit lines 106Ba and second memory cells MC2.

As a result of the formation of the second bit lines 10613a and the second memory cells MC2, the second low permittivity layer 122Ba may be located between the word lines 126a and between the second memory cells MC2 configured to contact along bottom surfaces of the second bit lines 106Ba. An upper surface of the second low permittivity layer 122Ba located between the word lines 126a with which the second memory cells MC2 do not come in contact, and upper surfaces of the word lines 126a may be exposed, and located at the same level. The second bit lines 106Ba and the second memory cells MC2 may be patterned using an etching process in which a third mask pattern 118C is used as an etch mask.

Figure 36A:
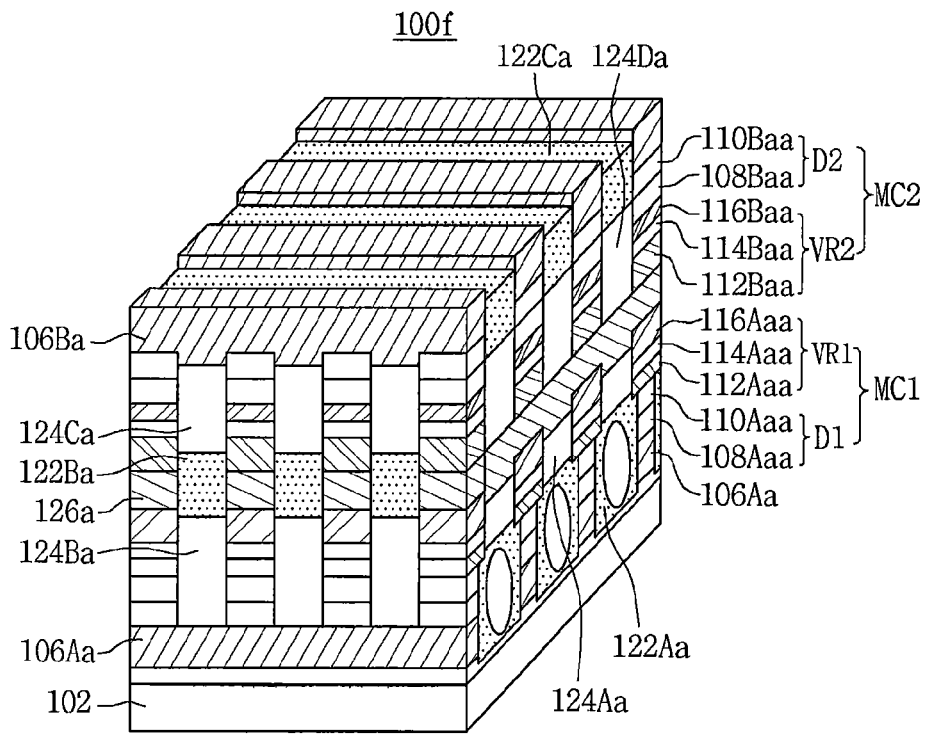
Figure 36B:
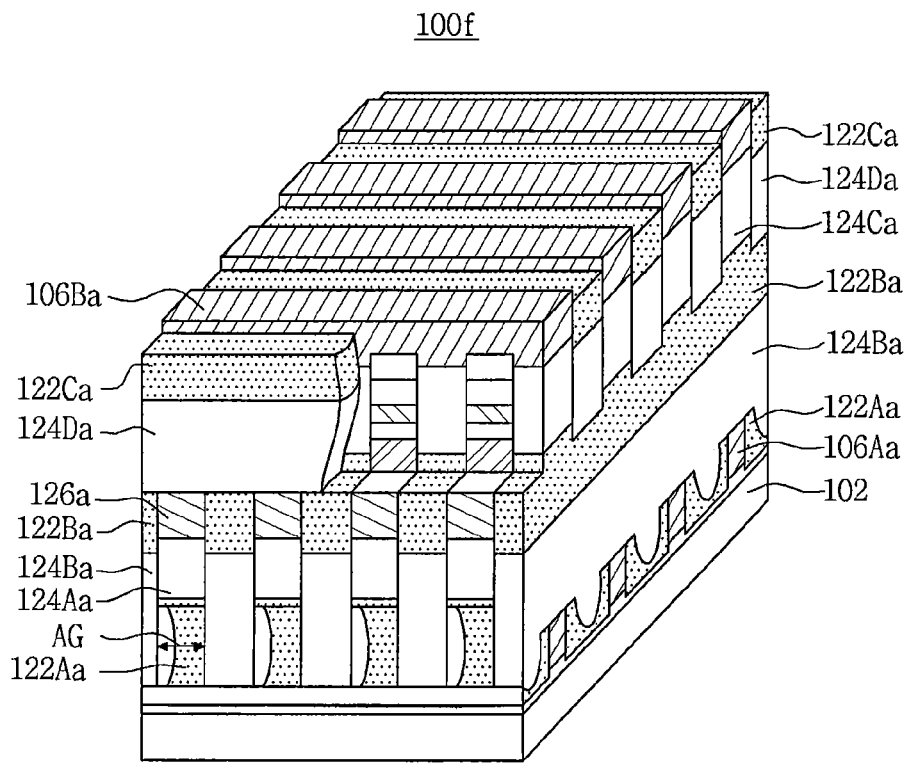

Referring to FIGS. 36A and 36B, the method of fabricating the memory device 100f in accordance with some embodiments of the inventive concept may include forming a fourth dielectric layer 124Da and a third low permittivity layer 122Ca, and removing the third mask pattern 118C.

The fourth dielectric layer 124Da may be formed between the second memory cells MC2 formed along the upper surfaces of the word lines 126a, and between the third dielectric layers 124Ca configured to fill spaces between the second memory cells MC2 formed along the bottom surfaces of the second bit lines 106Ba. The third low permittivity layer 122Ca may be stacked on an upper surface of the fourth dielectric layer 124Da. The third low permittivity layer 122Ca may be formed between the second bit lines 106Ba.

As shown in FIGS. 7A to 7D, a protection layer 130 may be formed on surfaces of the second bit lines 106Ba and the third low permittivity layer 122Ca.

Figure 37:
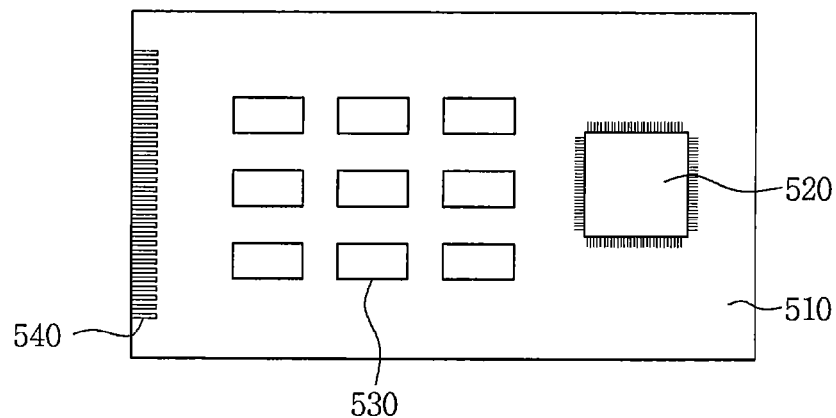
FIG. 37 is a conceptual view illustrating a semiconductor module according to some embodiments of the inventive concept including the memory devices fabricated according to some embodiments of the inventive concept.

Referring now to FIG. 37, a conceptual view illustrating a semiconductor module according to some embodiments of the inventive concept including the memory devices fabricated according to embodiments of the inventive concept will be discussed. As illustrated in FIG. 37, a semiconductor module 500 in accordance with some embodiments of the inventive concept may include memory devices 100a, 100b, 100c, 100d, 100e, and/or 100f in accordance with embodiments of the inventive concept mounted on a semiconductor module substrate 510. The semiconductor module 500 may further include a microprocessor 520 mounted on the semiconductor module substrate 510. Input/output terminals 540 may be disposed on at least one side of the semiconductor module substrate 510. The semiconductor module 500 may include a memory card or a solid state drive (SSD).

Figure 38:
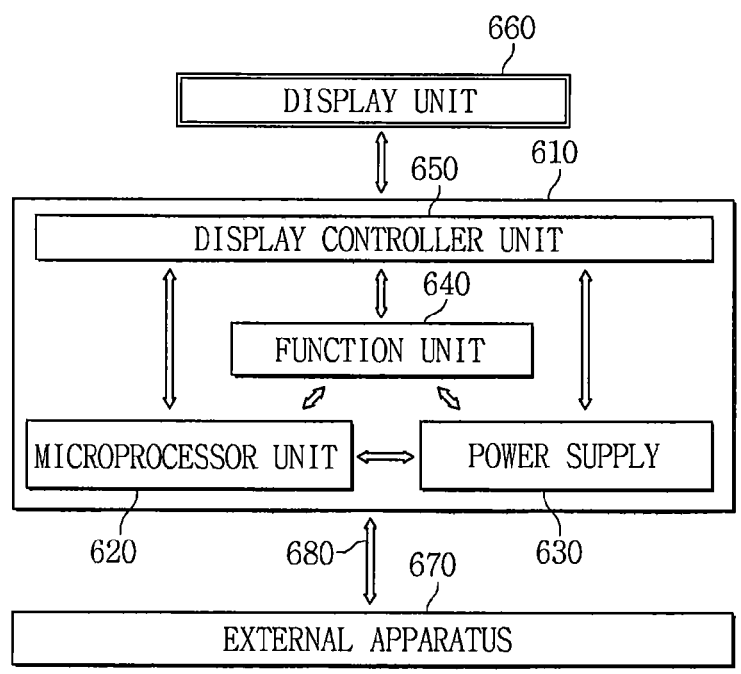
FIG. 38 is a conceptual block diagram illustrating an electronic system according to some embodiments of the inventive concept including the memory devices fabricated according to some embodiments of the inventive concept.

Referring now to FIG. 38, a conceptual block diagram illustrating an electronic system according to some embodiments of the inventive concept including the memory devices fabricated according to embodiments of the inventive concept will be discussed. As illustrated in FIG. 38, the memory devices 100a, 100b, 100c, 100d, 100e, and/or 100f in accordance with embodiments of the inventive concept may be applied to an electronic system 600. The electronic system 600 may include a body 610, a microprocessor unit 620, a power supply 630, a function unit 640, and/or a display controller unit 650. The body 610 may include a system board or a motherboard having a PCB or the like. The microprocessor unit 620, the power supply 630, the function unit 640, and the display controller unit 650 may be mounted or disposed on the body 610. A display unit 660 may be disposed on an upper surface of the body 610 or outside the body 610. For example, the display unit 660 may be disposed on a surface of the body 610, and may display an image processed by the display controller unit 650. The power supply 630 may receive a constant voltage from an external power supply, divide the voltage into various voltage levels, and supply the voltages to the microprocessor unit 620, the function unit 640, the display controller unit 650, etc. The microprocessor unit 620 may receive a voltage from the power supply 630 to control the function unit 640 and the display unit 660. The function unit 640 may perform various functions of the electronic system 600. For example, when the electronic system 600 is a mobile electronic product such as a cellular phone, etc., the function unit 640 may include various components to perform wireless communication functions such as dialing, video output to the display unit 660 or voice output to a speaker through communication with an external device 670, and when a camera is included, it may serve as an image processor. In another embodiment, when the electronic system 600 is connected to a memory card to expand the capacity, the function unit 640 may be a memory card controller. The function unit 640 may exchange signals with the external device 670 through a wired or wireless communication unit 680. Further, when the electronic system 600 requires a Universal Serial Bus (USB) to extend the functions, the function unit 640 may serve as an interface controller. The memory devices 100a, 100b, 100c, 100d, 100e, and/or 100f in accordance with embodiments of the inventive concept may be included in the function unit 640.

Figure 39:
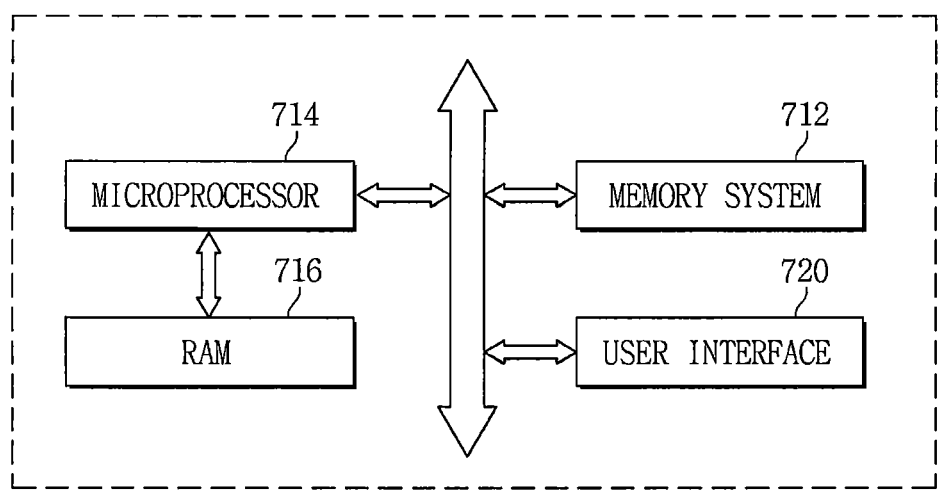
FIG. 39 is a schematic block diagram illustrating an electronic system according to some embodiments of the inventive concept including the memory devices fabricated according to some embodiments of the inventive concept.

Referring now to FIG. 39, a schematic block diagram illustrating an electronic system according to some embodiments of the inventive concept including the memory devices fabricated according to embodiments of the inventive concept will be discussed. As illustrated in FIG. 39, an electronic system 700 may include the memory devices 100a, 100b, 100c, 100d, 100e, and/or 100f in accordance with embodiments of the inventive concept.

The electronic system 700 may be used to manufacture a mobile device or a computer. For example, the electronic system 700 may include a memory system 712, a microprocessor 714, a RAM 716, and a user interface 720 configured to perform data communication using a bus. The microprocessor 714 may program and control the electronic system 700. The RAM 716 may be used as an operational memory of the microprocessor 714. For example, the microprocessor 714 or the RAM 716 may include one of the memory devices 100a, 100b, 100c, 100d, 100e, and/or 100f in accordance with embodiments of the inventive concept.

The microprocessor 714, the RAM 716, and/or other components may be assembled within a single package. The user interface 720 may be used to input or output data to or from the electronic system 700. The memory system 712 may store operational codes of the microprocessor 714, data processed by the microprocessor 714, or data received from the outside. The memory system 712 may include a controller and a memory.

As the memory devices in accordance with various embodiments of the inventive concept include low permittivity layers having low permittivity of 4 or less and air gaps between word lines and bit lines, parasitic capacitance between the word lines and the bit lines can be reduced, or possibly minimized.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A memory device, comprising:
bit lines extending in a first direction on a substrate;
word lines configured to vertically cross the bit lines;
memory cells at intersections of the bit lines and the word lines;
a first low permittivity layer filling spaces between the bit lines and partially filling spaces between the memory cells on bottom surfaces of the word lines;
a first dielectric layer stacked on an upper surface of the first low permittivity layer between the memory cells;
a second dielectric layer filling spaces between the memory cells on upper surfaces of the bit lines; and
a second low permittivity layer stacked on an upper surface of the second dielectric layer and filling spaces between the word lines,
wherein the first and second low permittivity layers have lower permittivity than the first and second dielectric layers.

2. The device of claim 1, wherein the upper surface of the first low permittivity layer includes a first surface located at the same level as the upper surface of the bit line, and a second surface located at a higher level than the first surface and between the memory cells.

3. The device of claim 2, wherein the second surface of the first low permittivity layer defines a horizontal through hole, and the first surface of the first low permittivity layer includes a groove.

4. The device of claim 3:
wherein the second dielectric layer contacts the first surface of the first low permittivity layer and fills the groove;
wherein a side of the second dielectric layer contacts a side of the first low permittivity layer; and
wherein the through hole is formed as an air gap that is an enclosed space.

5. The device of claim 4:
wherein a first set of parallel sides of the memory cells each contact sides of the first low permittivity layer having the air gap and the first dielectric layer; and
wherein a second set of parallel sides, opposite the first set, of the memory cells each contact a side of the second dielectric layer.

6. The device of claim 1, wherein the first dielectric layer is only between the first low permittivity layer and the word lines.

7. The device of claim 1:
wherein a first set of parallel sides of the memory cells each contact the first low permittivity layer and the first dielectric layer, which are sequentially stacked; and
wherein a second set of parallel sides, opposite the first set, of the memory cells each contact the second dielectric layer.

8. The device of claim 1:
wherein the first low permittivity layer and the second low permittivity layer have permittivity of no greater than 4; and
wherein the first low permittivity layer and the second low permittivity layer comprise one of include silicon oxide, fluorine-doped silicon dioxide, carbon-doped silicon dioxide, and porous silicon dioxide.

9. The device of claim 1, wherein the first dielectric layer and the second dielectric layer comprise one of silicon nitride ($SiN_x$) and aluminum oxide ($Al_2O_3$).

10. The device of claim 1:
wherein the memory cells each include a diode and a variable resistance device, connected in series; and
wherein the variable resistance device comprises a first electrode, a variable resistor, and a second electrode, which are sequentially stacked.

11. The device of claim 10, wherein the upper surface of the first low permittivity layer is located at a lower level than an upper surface of the first electrode.

12. The device of claim 10, wherein a bottom surface of the second low permittivity layer is located at a higher level than a bottom surface of the second electrode.

13. A memory device, comprising:
bit lines extending in a first direction on a substrate;
word lines vertically crossing the bit lines;
memory cells at intersections of the bit lines and the word lines;
a first dielectric layer filling spaces between the bit lines and between the memory cells on bottom surfaces of the word lines, and defining an air gap;
a second dielectric layer configured to fill spaces between the memory cells on upper surfaces of the bit lines; and
a first low permittivity layer stacked on an upper surface of the first dielectric layer and filling spaces between the word lines,
wherein the first low permittivity layer has lower permittivity than the first dielectric layer and the second dielectric layer.

14. The device of claim 13:
wherein the second dielectric layer is stacked on upper surfaces of the bit lines; and
wherein a first surface of the first dielectric layer located at the same level as the upper surfaces of the bit lines, contacts a side of the first dielectric layer, and becomes part of a boundary of the air gap.

15. The device of claim 13:
wherein a first set of parallel sides of the memory cells contact a side of the first dielectric layer including the air gap; and
wherein a second set of parallel sides, opposite the first set, contact a side of the second dielectric layer.

16. The device of claim 13, further comprising:
first bit lines and second bit lines extending in the first direction and vertically spaced apart on a substrate;
word lines between the first and second bit lines and configured to vertically cross the first and second bit lines;
first memory cells at intersections of the first bit lines and the word lines;
second memory cells at intersections of the word lines and the second bit lines;
a first low permittivity layer and a first dielectric layer stacked on a first separation space between the bit lines and between parallel sides of the first memory cells;
a second dielectric layer, a second low permittivity layer, and a third dielectric layer stacked on a second separation space between the other sides of the first memory cells, between the word lines, and between parallel sides of the second memory cells; and
a fourth dielectric layer and a third low permittivity layer stacked on a third separation space between the other sides of the second memory cells and between the second bit lines,
wherein the first, second and third low permittivity layers have lower permittivity than the first, second, third and fourth dielectric layers.

17. The device of claim 16, wherein an upper surface of the second low permittivity layer includes a first surface located at the same level as upper surfaces of the word lines and a second surface located at a higher level than the first surface; and wherein the second surface contacts a bottom surface of the third dielectric layer.

18. The device of claim 16, wherein a bottom surface of the second dielectric layer contacts upper surfaces of the first bit lines and a side of the first low permittivity layer.

19. The device of claim 16, further comprising an air gap inside the first low permittivity layer.

20. A memory device, comprising:
- first bit lines and second bit lines extending in a first direction and vertically spaced apart on a substrate;
- word lines between the first and second bit lines and configured to vertically cross the first and second bit lines;
- first memory cells at intersections of the first bit lines and the word lines;
- second memory cells at intersections of the word lines and the second bit lines;
- a first dielectric layer configured filling a first separation space between the first bit lines and between parallel sides of the first memory cells, and defining an air gap therein;
- a second dielectric layer, a first low permittivity layer, and a third dielectric layer stacked on a second separation space between remaining sides of the first memory cells, between the word lines, and between parallel sides of the second memory cells; and
- a fourth dielectric layer and a second low permittivity layer stacked on a third separation space between remaining sides of the second memory cells and between the second bit lines,
- wherein the first and second low permittivity layers have lower permittivity than the first, second, third and fourth dielectric layers.

* * * * *